US009190563B2

(12) United States Patent
Hwang et al.

(10) Patent No.: US 9,190,563 B2
(45) Date of Patent: Nov. 17, 2015

(54) NANOSTRUCTURE SEMICONDUCTOR LIGHT EMITTING DEVICE

(71) Applicants: Kyung Wook Hwang, Hwaseong-si (KR); Geon Wook Yoo, Seongnam-si (KR)

(72) Inventors: Kyung Wook Hwang, Hwaseong-si (KR); Geon Wook Yoo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/551,978

(22) Filed: Nov. 24, 2014

(65) Prior Publication Data
US 2015/0144873 A1    May 28, 2015

(30) Foreign Application Priority Data

Nov. 25, 2013 (KR) .................. 10-2013-0143624
Mar. 26, 2014 (KR) .................. 10-2014-0035168
Aug. 8, 2014 (KR) .................. 10-2014-0102513

(51) Int. Cl.
H01L 29/06 (2006.01)
H01L 33/06 (2010.01)
H01L 33/08 (2010.01)
H01L 33/42 (2010.01)
H01L 33/24 (2010.01)
H01L 33/58 (2010.01)

(52) U.S. Cl.
CPC ............... *H01L 33/06* (2013.01); *H01L 33/08* (2013.01); *H01L 33/24* (2013.01); *H01L 33/42* (2013.01); *H01L 33/58* (2013.01)

(58) Field of Classification Search
CPC .............. H01L 33/24; H01L 2224/48091; H01L 33/20; H01L 2924/00014; H01L 33/06; H01L 33/08; H01L 33/32; H01L 33/382; H01L 33/007; H01L 33/22; H01L 33/005; H01L 33/10; H01L 21/0254; H01L 2933/0083
USPC .......... 257/13, 21, 99, 737, E23.021; 438/29, 438/34, 71
See application file for complete search history.

(56) References Cited

U.S. PATENT DOCUMENTS

| 5,513,289 A | 4/1996 | Hosokawa et al. |
| 6,372,608 B1 | 4/2002 | Shimoda et al. |
| 6,645,830 B2 | 11/2003 | Shimoda et al. |

(Continued)

FOREIGN PATENT DOCUMENTS

| KR | 1020100089338 A | 8/2010 |
| KR | 101042707 B1 | 6/2011 |

(Continued)

*Primary Examiner* — Mark A Laurenzi
(74) *Attorney, Agent, or Firm* — Harness, Dickey & Pierce

(57) ABSTRACT

A nanostructure semiconductor light emitting device includes a plurality of light emitting nanostructures, each of which including a nanocore formed of a first conductivity-type semiconductor material, and an active layer and a second conductivity-type semiconductor layer sequentially disposed on a surface of the nanocore, a contact electrode disposed on a surface of the second conductivity-type semiconductor layer and formed of a transparent conductive material, a first light transmissive portion filling space between the plurality of light emitting nanostructures and formed of a material having a first refractive index, and a second light transmissive portion disposed on an upper surface of the first light transmissive portion to cover the plurality of light emitting nanostructures and formed of a material having a second refractive index higher than the first refractive index.

20 Claims, 37 Drawing Sheets

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,532,405 B2 | 5/2009 | Mino et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,981,714 B2 | 7/2011 | Kim et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,178,892 B2 | 5/2012 | Huang et al. |
| 8,179,938 B2 | 5/2012 | Kim |
| 8,212,266 B2 | 7/2012 | Lee et al. |
| 8,263,987 B2 | 9/2012 | Choi et al. |
| 8,310,760 B2 | 11/2012 | Steenblik et al. |
| 8,324,646 B2 | 12/2012 | Lee et al. |
| 8,350,251 B1 | 1/2013 | Lowgren et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,575,642 B1 | 11/2013 | Shum |
| 8,628,985 B2 | 1/2014 | Camras et al. |
| 8,648,376 B2 | 2/2014 | Cho et al. |
| 8,735,931 B2 | 5/2014 | Han et al. |
| 8,766,295 B2 | 7/2014 | Kim |
| 2011/0089447 A1 | 4/2011 | Kuo et al. |
| 2011/0151607 A1 | 6/2011 | Landis et al. |
| 2011/0309382 A1 | 12/2011 | Lowgren |
| 2012/0033430 A1 | 2/2012 | Ariyoshi |
| 2012/0061646 A1 | 3/2012 | Yi et al. |
| 2012/0228655 A1 | 9/2012 | Lin et al. |
| 2013/0099199 A1 | 4/2013 | Cha et al. |
| 2013/0112944 A1 | 5/2013 | Cha et al. |
| 2013/0314925 A1 | 11/2013 | Jiang et al. |
| 2014/0166974 A1* | 6/2014 | Yoo et al. .................. 257/13 |

FOREIGN PATENT DOCUMENTS

| | | |
|---|---|---|
| KR | 1020110109409 A | 10/2011 |
| KR | 1020120000814 A | 1/2012 |
| KR | 1020120040550 A | 4/2012 |
| KR | 1020130023939 A | 3/2013 |
| KR | 101270056 B1 | 5/2013 |

* cited by examiner

NANOSTRUCTURE SEMICONDUCTOR LIGHT EMITTING DEVICE

CROSS-REFERENCE TO RELATED APPLICATIONS

This application claims priority under 35 U.S.C. §119 to Korean Patent Application Nos. 10-2013-0143624 filed on Nov. 25, 2013, 10-2014-0035168 filed on Mar. 26, 2014 and 10-2014-0102513 filed on Aug. 8, 2014, with the Korean Intellectual Property Office, the entire disclosures of each of the above Korean Patent Applications being incorporated herein by reference.

BACKGROUND

Example embodiments relate to a three-dimensional nanostructure semiconductor light emitting device.

In recent years, as a new type of semiconductor light emitting diode (LED) technology, semiconductor light emitting devices using nanostructures have been developed. Semiconductor light emitting devices using nanostructures may have highly improved crystallinity, and may have an active layer obtained from a non-polar plane or a semi-polar plane to thereby prevent luminous efficiency from deteriorating due to polarization. In addition, such nanostructure semiconductor light emitting devices can emit light through a considerably large surface area, resulting in highly improved luminous efficiency. In order to effectively maintain the improved luminous efficiency, the nanostructure semiconductor light emitting devices are required to be further improved in terms of external quantum efficiency, i.e., light extraction efficiency.

SUMMARY

Example embodiments relate to a three-dimensional nanostructure semiconductor light emitting device having a light extraction structure in which a plurality of light emitting nanostructures are appropriately arranged to have a specific form.

According to an example embodiment, a nanostructure semiconductor light emitting device may include a plurality of light emitting nanostructures, each of which including a nanocore formed of or including a first conductivity-type semiconductor material, and an active layer and a second conductivity-type semiconductor layer sequentially disposed on a surface of the nanocore, a contact electrode disposed on a surface of the second conductivity-type semiconductor layer and formed of or including a transparent conductive material, a first light transmissive portion filling space between the plurality of light emitting nanostructures and formed of or including a material having a first refractive index, and a second light transmissive portion disposed on an upper surface of the first light transmissive portion to cover the plurality of light emitting nanostructures and formed of or including a material having a second refractive index higher than the first refractive index.

The upper surface of the first light transmissive portion may be lower than a height of the light emitting nanostructures.

According to an example embodiment, a portion of the second light transmissive portion may be disposed between the plurality of light emitting nanostructures to have an interface in contact with the first light transmissive portion.

The contact electrode may be disposed on the upper surface of the first light transmissive portion and on surfaces of portions of the light emitting nanostructures higher than the upper surface of the first light transmissive portion. In this case, a portion of the second light transmissive portion may be disposed between the plurality of light emitting nanostructures to have an interface in contact with the contact electrode.

Each of the plurality of light emitting nanostructures may include a main portion having side surfaces, each of which being a first crystal plane, and a tip portion having surfaces, each of which being a second crystal plane different from the first crystal plane.

The first crystal plane may be an m-plane, and the second crystal plane may be an r-plane. Alternatively, the first crystal plane may be an m-plane, and the second crystal plane may be a C-plane.

A portion of the second light transmissive portion may be disposed between the plurality of light emitting nanostructures to have an interface in contact with the first light transmissive portion, and the interface may be disposed on the side surfaces of the light emitting nanostructures.

The interface may be higher than 50% of a height of the main portion.

The contact electrode may be disposed on the side surfaces of the light emitting nanostructures to expose upper portions of the light emitting nanostructures. In this case, the contact electrode and the first light transmissive portion may have substantially the same height.

The first refractive index may be substantially 1.5 or lower, and the second refractive index may be substantially 1.7 or higher.

The first refractive index may be lower than a refractive index of the light emitting nanostructures, and a difference between the first refractive index and the second refractive index may be substantially 0.2 or greater.

The nanostructure semiconductor light emitting device may further include at least one intermediate light transmissive portion between the first light transmissive portion and the second light transmissive portion and formed of, or including, a material having a refractive index between the first refractive index and the second refractive index.

An upper surface of the second light transmissive portion may include a light extraction pattern. In this case, the light extraction pattern may have an uneven structure integrated with the second light transmissive portion.

According to another example embodiment, a nanostructure semiconductor light emitting device may include a plurality of light emitting nanostructures, a contact electrode disposed on surfaces of the plurality of light emitting nanostructures and formed of, or including, a transparent conductive material, and a light transmissive protective layer formed of, or including, a transparent material. The light transmissive protective layer may include a first light transmissive portion filling space between the plurality of light emitting nanostructures and formed of or including a material having a first refractive index, and a second light transmissive portion disposed on upper portions of the plurality of light emitting nanostructures and formed of or including a material having a second refractive index higher than the first refractive index.

An upper surface of the first light transmissive portion may be lower than a height of the light emitting nanostructures, and a portion of the second light transmissive portion may be between the plurality of light emitting nanostructures to have an interface in contact with the first light transmissive portion.

The first refractive index may be lower than a refractive index of the light emitting nanostructures.

According to another example embodiment, a nanostructure semiconductor light emitting device may include a plurality of light emitting nanostructures, each of which including a nanocore formed of or including a first conductivity-type semiconductor material, and an active layer and a second conductivity-type semiconductor layer sequentially disposed on a surface of the nanocore, a contact electrode disposed on a surface of the second conductivity-type semiconductor layer and formed of or including a transparent conductive material, a first light transmissive portion filling space between the plurality of light emitting nanostructures and formed of or including a material having a first refractive index, and a second light transmissive portion on an upper surface of the first light transmissive portion to cover the plurality of light emitting nanostructures, including a plurality of lenses, and formed of or including a material having a second refractive index higher than the first refractive index.

The second light transmissive portion may further include a plate disposed on the first light transmissive portion to cover the plurality of light emitting nanostructures, and the plurality of lenses may be arranged on the plate. Alternatively, the plurality of lenses may be arranged on the first light transmissive portion to cover at least one of the light emitting nanostructures.

Each of the plurality of lenses may be arranged to cover at least two of the light emitting nanostructures. Alternatively, the plurality of lenses may be arranged to cover the plurality of light emitting nanostructures, respectively.

According to another example embodiment, a light emitting module may include a circuit board having a first electrode structure and a second electrode structure, and the nanostructure semiconductor light emitting device as described above, wherein first and second electrodes of the nanostructure semiconductor light emitting device may be connected to the first and second electrode structures of the circuit board, respectively.

According to an example embodiment, a lighting device may include a light emitting module including the nanostructure semiconductor light emitting device as described above, a driver driving the light emitting module, and an external connector supplying voltage to the driver.

According to at least one example embodiment, a nanostructure semiconductor light emitting device includes a plurality of light emitting nanostructures, and a light transmissive protective layer including a first light transmissive portion having a first refractive index and a second light transmissive portion having a second refractive index different from the first refractive index. The first light transmissive portion may be between the plurality of light emitting nanostructures, and the second light transmissive portion may be on upper portions of the plurality of light emitting nanostructures.

BRIEF DESCRIPTION OF DRAWINGS

The above and other features and other advantages of several example embodiments will be more clearly understood from the following detailed description of non-limiting embodiments, as illustrated in the accompanying drawings, in which like reference characters refer to like parts throughout the different views. The drawings are not necessarily to scale, emphasis instead being placed upon illustrating principles of inventive concepts. In the drawings.

DETAILED DESCRIPTION

Figure 1:
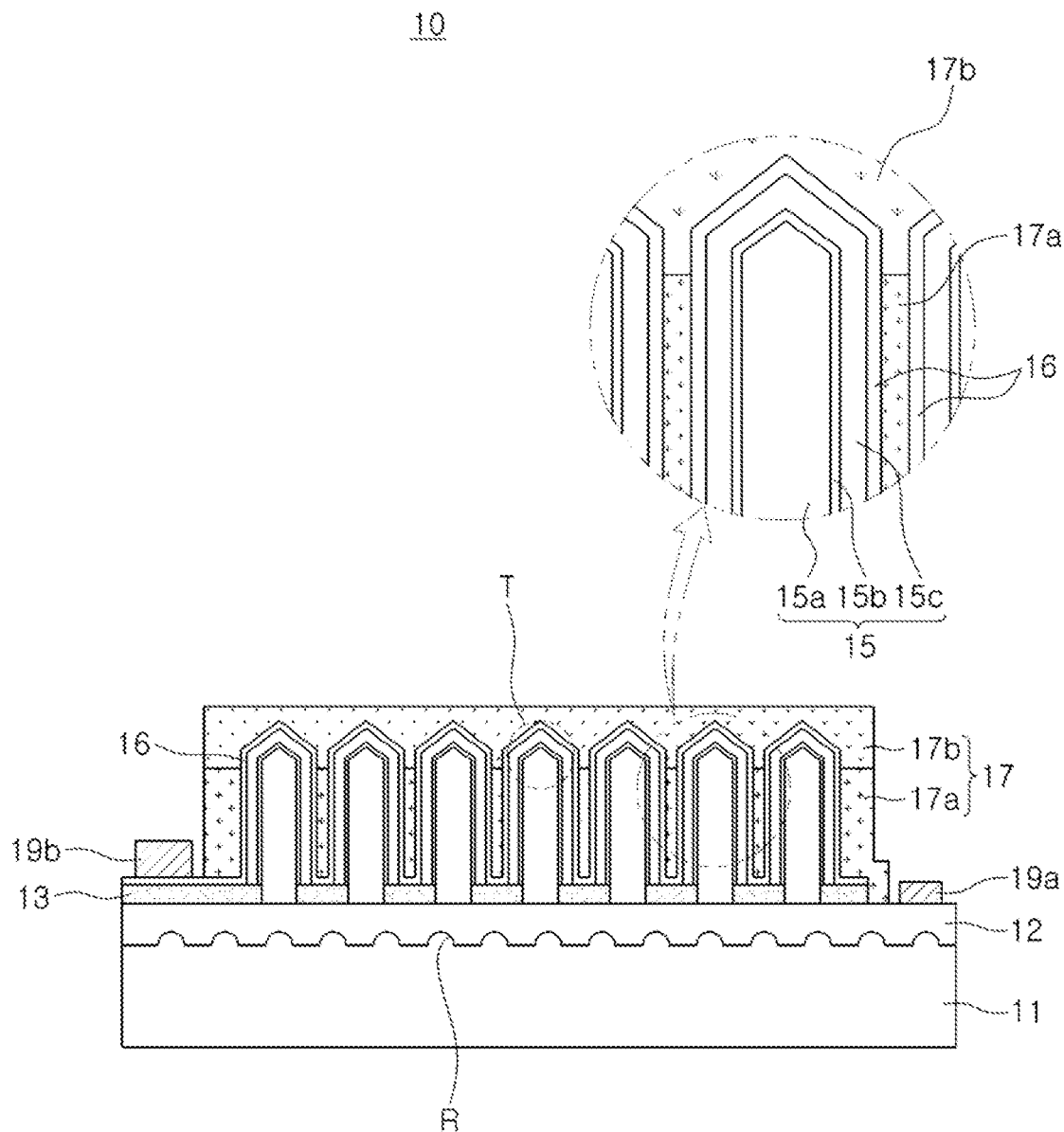
FIG. 1 is a cross-sectional view of a nanostructure semiconductor light emitting device according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower, " "above, " "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a nanostructure semiconductor light emitting device according to an example embodiment.

A nanostructure semiconductor light emitting device 10 illustrated in FIG. 1 may include a base layer 12 formed of or including a first conductivity-type semiconductor material and a plurality of light emitting nanostructures 15 on the base layer 12. In addition, the nanostructure semiconductor light emitting device 10 may include a substrate 11 having an upper surface on which the base layer 12 is disposed.

A convex pattern including uneven portions R may be formed on the upper surface of the substrate 11. The uneven portions R may improve light extraction efficiency and the quality of a single crystal grown thereon. The substrate 11 may be an insulating substrate, a conductive substrate or a semiconductor substrate. For example, the substrate 11 may be formed of include sapphire, SiC, Si, $MgAl_2O_4$, MgO, $LiAlO_2$, $LiGaO_2$ or GaN.

The base layer 12 may provide a growth surface for the light emitting nanostructures 15. The base layer 12 may be formed of or include a nitride semiconductor containing $Al_xIn_yGa_{1-x-y}N$ (0≤x<1, 0≤y<1, 0≤x+y<1) and may be doped with impurities. For example, the base layer 12 may be doped with n-type impurities such as silicon (Si).

An insulating layer 13 having openings may be formed on the base layer 12 and the openings may be provided to facilitate growth of the light emitting nanostructures 15 (especially, nanocores 15a). Portions of the base layer 12 may be exposed through the openings and the nanocores 15a may be formed on the exposed portions of the base layer 12. The insulating layer 13 may be used as or constitute a mask for growth of the nanocores 15a. The insulating layer 13 may be formed of or include an insulating material such as $SiO_2$ or $SiN_x$.

The light emitting nanostructures 15 may each include the nanocore 15a formed of or include a first conductivity-type semiconductor material, and an active layer 15b and a second conductivity-type semiconductor layer 15c sequentially formed on a surface of the nanocore 15a. The nanocore 15a may be formed of or include a nitride semiconductor containing $Al_xIn_yGa_{1-x-y}N$ (0≤x<1, 0≤y<1, 0≤x+y<1), similar to the base layer 12. For example, the nanocore 15a may be formed of or include n-type GaN. The active layer 15b may have a multi-quantum well (MQW) structure in which quantum well layers and quantum barrier layers are alternately stacked. For example, when the active layer 15b is formed of or include a nitride semiconductor, the active layer 15b may have a GaN/InGaN MQW structure. As necessary, the active layer 15b may have a single quantum well (SQW) structure. The second conductivity-type semiconductor layer 15c may be a crystal containing p-type $Al_xIn_yGa_{1-x-y}N$ (0≤x<1, 0≤y<1, 0≤x+y<1), and may be formed of or include a plurality of layers as necessary.

Figure 2:
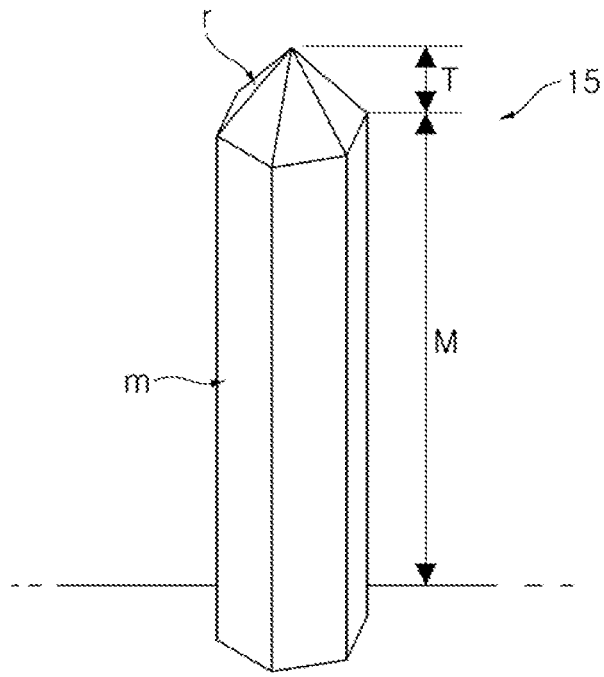
FIG. 2 is a schematic perspective view illustrating an example of a nanocore usable in the example embodiment of FIG. 1.

As illustrated in FIG. 2, the light emitting nanostructure 15 according to the present example embodiment may include a main portion M having a hexagonal prism structure and a tip portion T disposed on the top of the main portion M. The main portion M of the light emitting nanostructure 15 may have side surfaces, each of which is a first crystal plane (e.g. an m-plane) and the tip portion T of the light emitting nanostructure 15 may have facets, each of which is a second crystal plane (e.g. an r-plane) different from the first crystal plane.

The tip portion T of the light emitting nanostructure 15 may have a hexagonal pyramid structure.

The shape of the light emitting nanostructure 15 and the crystal planes thereof may be determined depending on the shape of the nanocore 15a and the crystal planes thereof. The light emitting nanostructure 15 usable in the present example embodiment may be changed to have various forms. That is, the light emitting nanostructure 15 may have different shapes and different crystal planes according to a shape of the grown nanocore or post-processing.

Figure 3:
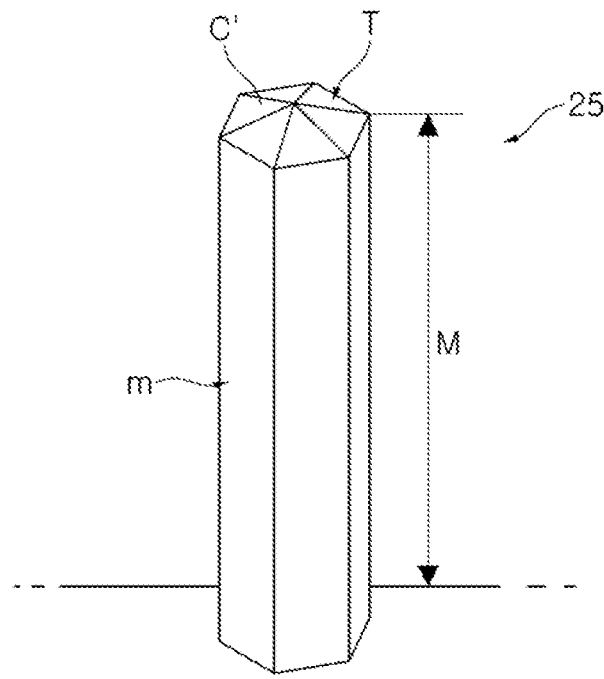
FIG. 3 is a schematic perspective view illustrating another example of a nanocore usable in the example embodiment of FIG. 1.

For example, as illustrated in FIG. 3, a main portion M of a light emitting nanostructure 25 may have side surfaces, each of which is a first crystal plane (an m-plane), and a tip portion T thereof may have a second crystal plane C' different from the first crystal plane, but the second crystal plane C' may not be completely semi-polar. In some example embodiments (see FIG. 17), the upper surface of the light emitting nanostructure may be substantially flat through a planarization process or the like.

The nanostructure semiconductor light emitting device 10 may include a contact electrode 16 connected to the second conductivity-type semiconductor layer 15c. The contact electrode 16 used in the present example embodiment may be formed of or include a transparent conductive material, but is not limited thereto. The contact electrode 16 may be formed of or include a transparent conductive oxide layer or a transparent conductive nitride layer in order to emit light in a direction opposite to the substrate. For example, the contact electrode 16 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$ and zinc magnesium oxide ($Zn_{(1-x)}Mg_xO$, 0≤x≤1). As necessary, the contact electrode 16 may include graphene.

The nanostructure semiconductor light emitting device 10 may include a light transmissive protective layer 17 on the upper surfaces of the light emitting nanostructures 15. The light transmissive protective layer 17 may be a passivation layer protecting the light emitting nanostructures 15.

The light transmissive protective layer 17 in the present example embodiment may be provided to the light emitting nanostructures 15 to improve light extraction efficiency. The light transmissive protective layer 17 may include a first light transmissive portion 17a formed of or include a material having a first refractive index and a second light transmissive portion 17b formed of or include a material having a second refractive index higher than the first refractive index. The first light transmissive portion 17a may be in space between the light emitting nanostructures 15, and the second light transmissive portion 17b may be, on the upper portions of the light emitting nanostructures 15.

As illustrated in FIG. 1, the second light transmissive portion 17b may be on the first light transmissive portion 17a to cover the light emitting nanostructures 15. Such a configuration of the light transmissive protective layer 17 may significantly improve light extraction efficiency in an upward direction.

Specifically, according to the Snell's law, a total internal reflection range of light moving through an interface between two materials having different refractive indices into a region having a relatively low refractive index may be increased, and thus, the amount of upwardly extracted light may be reduced or suppressed. On the contrary, a total internal reflection range of light moving through the interface into a region having a relatively high refractive index may be reduced, and thus, the amount of extracted light may be increased.

Figure 4A:
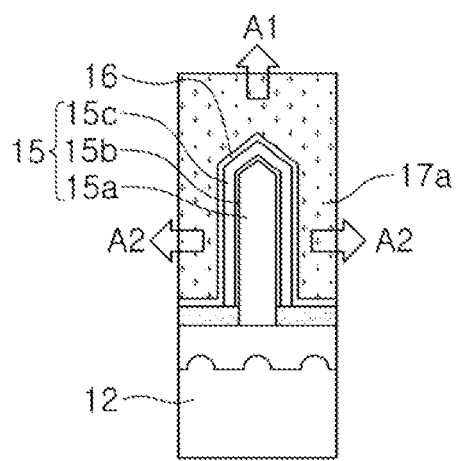
FIGS. 4A and 4B are cross-sectional views of a light emitting nanostructure illustrating the principle of improving luminous efficiency in the example embodiment of FIG. 1.
Figure 4B:
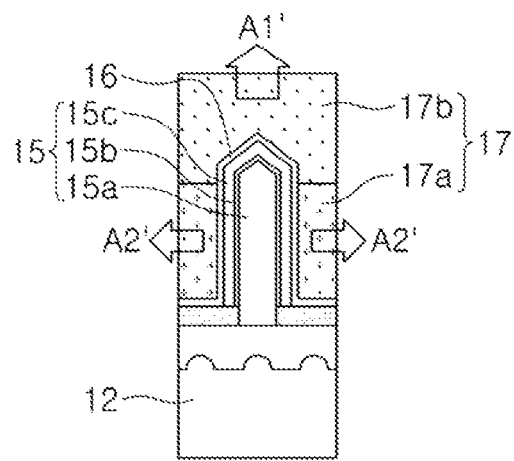

As compared with a case in which a single refractive layer is as illustrated in FIG. 4A, the light transmissive protective layer 17 used in the example embodiment illustrated in FIG. 4B includes the second light transmissive portion 17b disposed on the upper portions of the light emitting nanostructures 15 to increase the amount of light travelling upwardly and includes the first light transmissive portion 17a disposed in the space between the light emitting nanostructures 15 to reduce the amount of light travelling laterally. By reducing the amount of light travelling laterally (see A2->A2') and effectively extracting the light in the upward direction (see A1->A1'), effective luminous efficiency may be significantly improved in the upward direction.

In comparison with the protective layer of FIG. 4B including the first and second light transmissive portions, the first light transmissive portion 17a is only depicted as a light transmissive portion having a single refractive index in FIG. 4A by way of example, but even when only the second light transmissive portion 17b is used, the above-mentioned result may be obtained. That is, even when the second light transmissive portion 17b is taken as a light transmissive portion having a single refractive index of FIG. 4A, the amount of light travelling laterally (see A2) with respect to the light emitting nanostructures 15 increases, and accordingly, the amount of light travelling in the upward direction (see A1) from the light emitting nanostructures 15 is reduced.

As described above, the light emitting nanostructures 15 may include GaN having a refractive index of approximately 2.4. In this case, the second light transmissive portion 17b disposed on the upper portions of the light emitting nanostructures 15 may be formed of or include a material having the second refractive index (approximately 1.7 to 3) similar to the refractive index of the light emitting nanostructures 15, and the first light transmissive portion 17a disposed on the side surfaces of the light emitting nanostructures 15 may be formed of or include a material having the first refractive index (approximately 1.5 or below) lower than the second refractive index. In other words, the first refractive index may be lower than the refractive index of the light emitting nanostructures and a difference between the first refractive index and the second refractive index may be equal to or greater than 0.2. In some embodiments, the first light transmissive portion 17a may contain air, instead of any filling material.

The refractive indices of the first light transmissive portion 17a and the second light transmissive portion 17b may be determined in consideration of the refractive index of the light emitting nanostructures 15, and a desired light transmissive protective layer may be formed by selecting an appropriate material. Conditions of refractive indices of the first light transmissive portion 17a and the second light transmissive portion 17b will be described in detail with reference to FIGS. 6 and 7.

The nanostructure semiconductor light emitting device 10 may include first and second electrodes 19a and 19b. The first electrode 19a may be disposed on an exposed portion of the base layer 12 formed of or including the first conductivity-type semiconductor material. In addition, the second electrode 19b may be disposed on an extended and exposed region of the contact electrode 16.

FIGS. 5A through 5E are cross-sectional views illustrating sequential processes in an example method of manufacturing the nanostructure semiconductor light emitting device of FIG. 1.

Figure 5A:
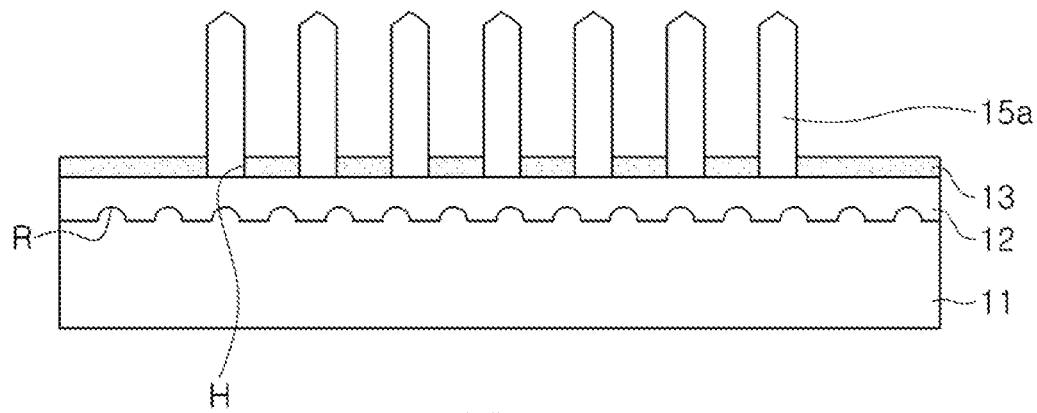
FIGS. 5A through 5E are cross-sectional views illustrating sequential processes in a method of manufacturing the nanostructure semiconductor light emitting device of FIG. 1.

As illustrated in FIG. 5A, the plurality of nanocores 15a may be formed on the base layer 12 formed of or including a first conductivity-type semiconductor material.

The uneven portions R may be formed on the upper surface of the substrate 11. The base layer 12 may be formed on the upper surface of the substrate 11. The insulating layer 13 having the openings may be formed on the base layer 12. The nanocores 15a may be formed on the exposed regions of the base layer 12 using the insulating layer 13 as a mask.

The nanocores 15a in the present example embodiment are formed through selective growth, but may be obtained by growing the nanocores using a mold having openings corresponding to desired nanocores and removing the mold.

Figure 5B:
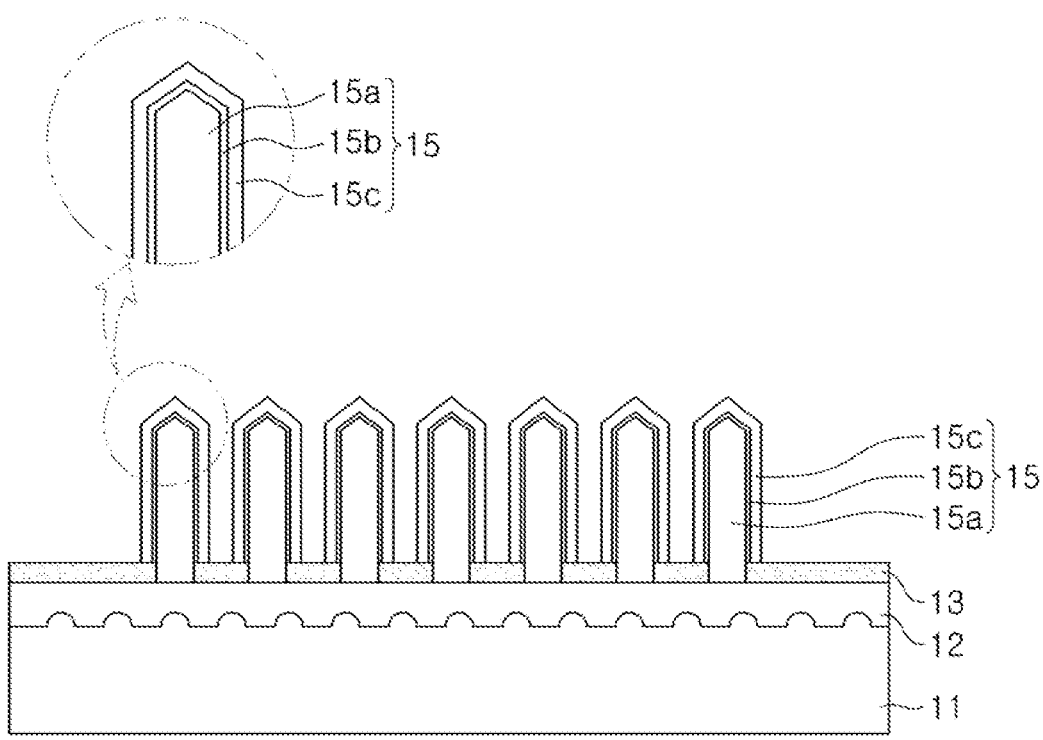

As illustrated in FIG. 5B, the active layer 15b and the second conductivity-type semiconductor layer 15c may be sequentially formed on the surface of each of the plurality of nanocores 15a.

Through this process, the plurality of light emitting nanostructures 15 may be formed. The active layer 15b may have a multiple quantum well (MQW) structure in which quantum well layers and quantum barrier layers are alternately stacked. For example, in the case in which the active layer 15b is formed of or including a nitride semiconductor, the active layer 15b may have a GaN/InGaN MQW structure. As necessary, the active layer 15b may have a single quantum well (SQW) structure. The second conductivity-type semiconductor layer 15c may be a crystal containing p-type $Al_xIn_yGa_{1-x-y}N$ ($0 \le x < 1$, $0 \le y < 1$, $0 \le x+y < 1$), and may be formed of or include a plurality of layers as necessary. For example, the second conductivity-type semiconductor layer 15c may include an AlGaN electron blocking layer and a GaN contact layer.

Figure 5C:
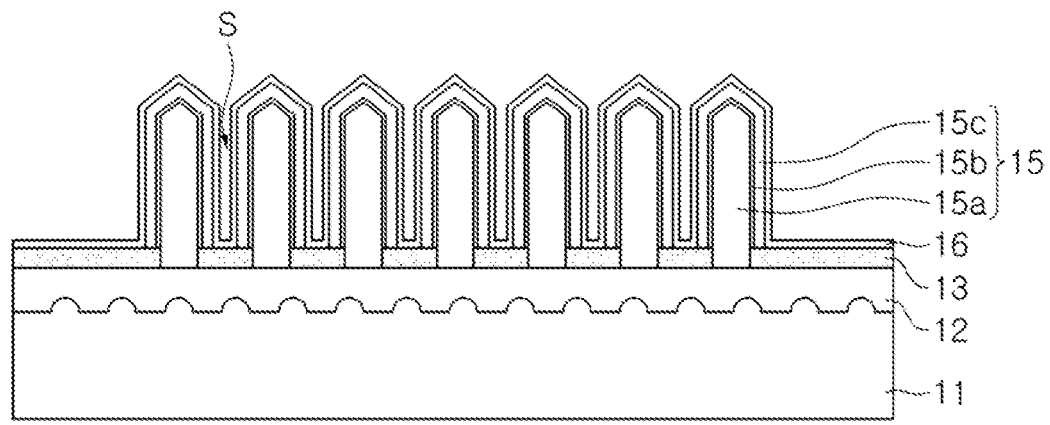

Next, as illustrated in FIG. 5C, the contact electrode 16 may be formed on the light emitting nanostructures 15.

The contact electrode 16 may be formed on the surfaces of the second conductivity-type semiconductor layers 15c. The contact electrode 16 used in the present example embodiment may be formed of or include a transparent conductive material, but is not limited thereto. The contact electrode 16 may be formed of or include a transparent conductive oxide layer or a transparent conductive nitride layer. For example, the contact electrode 16 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$ and zinc magnesium oxide ($Zn_{(1-x)}Mg_xO$, $0 \le x \le 1$). As necessary, the contact electrode 16 may include graphene. Space S may be present between the light emitting nanostructures 15.

Figure 5D:
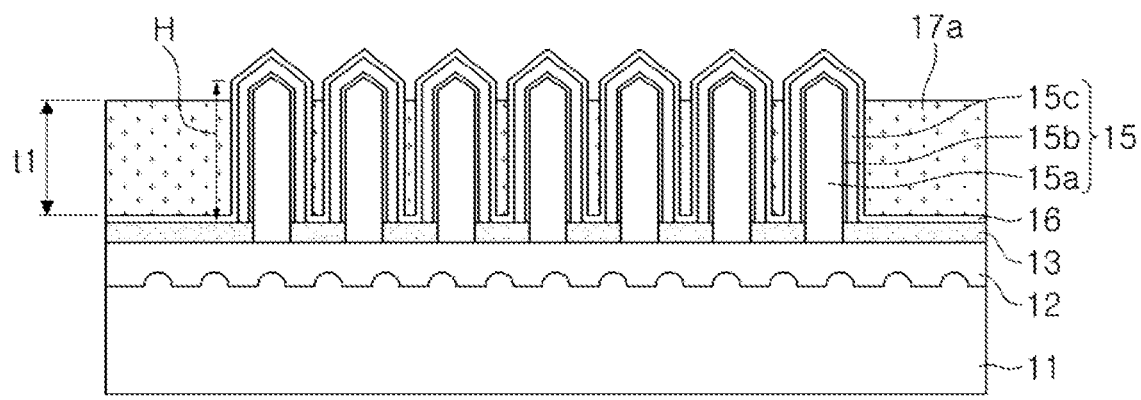

Thereafter, as illustrated in FIG. 5D, the first light transmissive portion 17a may be formed to fill the space S between the light emitting nanostructures 15.

The first light transmissive portion 17a may be formed of or include a material having a low refractive index such as $SiO_2$ (refractive index: 1.46). The first light transmissive portion 17a may be formed by a deposition process such as a chemical vapor deposition (CVD) process, a physical vapor deposition (PVD) process, or the like. Alternatively, the first light transmissive portion 17a may be formed of or include different materials that may be easily filled in the space S between the light emitting nanostructures 15 using different processes. For example, the first light transmissive portion 17a may be formed of or include tetraethylorthosilane (TEOS), borophospho silicate glass (BPSG), $CVD-SiO_2$, spin-on glass (SOG), or spin-on dielectric (SOD). By using the liquidity of such a material, the filling process maybe easily performed through a spin coating process or a reflow process.

Meanwhile, the first light transmissive portion 17a may also be formed of or include a light transmissive resin having a relatively low refractive index (1.4-1.7) and superior workability. For example, at least one resin being one of an epoxy resin, a silicon resin, a polyethylene resin and a polycarbonate resin may be used as or constitute the light transmissive resin. The first light transmissive portion 17a may have a porous structure in order to obtain a lower refractive index. For example, in a case in which the first light transmissive portion 17a is formed of or include porous silicon, the first light transmissive portion 17a may have a refractive index of approximately 1.2.

The first light transmissive portion 17a may be formed to have an appropriate thickness t1 such that an upper surface thereof is lower than a height of the light emitting nanostructure 15. Portions of the light emitting nanostructures 15 may not be covered with the first light transmissive portion 17a so as to be exposed. The thickness t1 of the first light transmissive portion 17a may be determined such that the upper surface of the first light transmissive portion 17a is higher than 50% of a height H of the main portion M of the light emitting nanostructure 15.

Figure 5E:
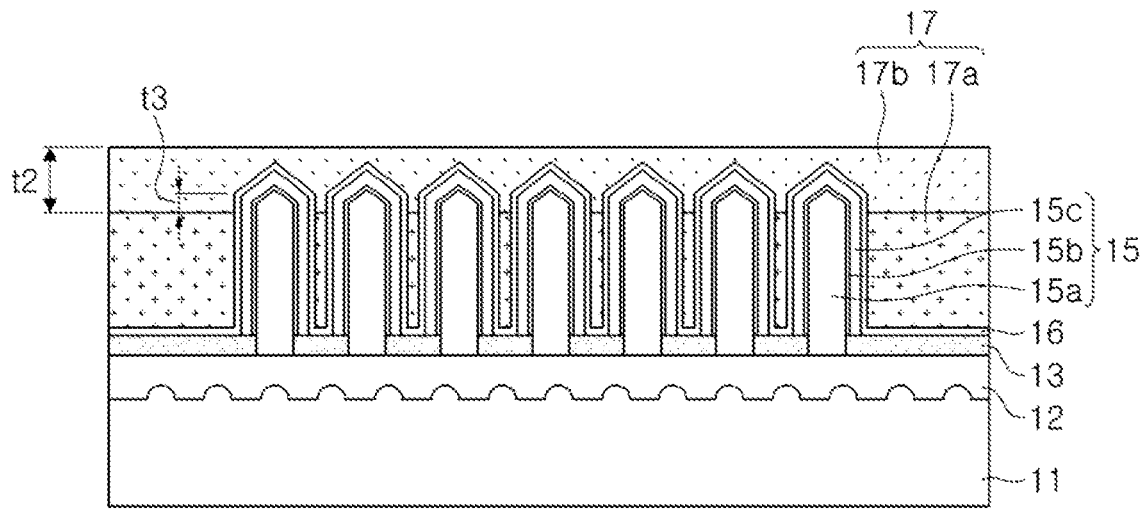

Thereafter, as illustrated in FIG. 5E, the second light transmissive portion 17b may be formed on the first light transmissive portion 17a.

The second light transmissive portion 17b may be formed to cover the exposed portions of the light emitting nanostructures 15. That is, the second light transmissive portion 17b may be formed to have an appropriate thickness t2 such that an upper surface thereof is higher than the overall height of the light emitting nanostructure 15. In the present example embodiment, the second light transmissive portion 17b may directly contact the first light transmissive portion 17a to form an interface therebetween. In addition, a portion of the second light transmissive portion 17b may be formed to fill the space between the light emitting nanostructures 15. In this manner, the portion of the second light transmissive portion 17b may be disposed on the main portion of the light emitting nanostructure 15. Such an arrangement of the second light transmissive portion 17b may allow light generated in the light emitting nanostructures 15 to be increasingly extracted upwardly through the second light transmissive portion 17b.

The second light transmissive portion 17b may be formed by a deposition process such as a chemical vapor deposition (CVD) process, a physical vapor deposition (PVD) process or the like. The refractive index of the second light transmissive portion 17b may be higher than the refractive index of the first light transmissive portion 17a. The refractive index of the second light transmissive portion 17b may be determined depending on the refractive index of the first light transmissive portion 17a. In a case in which the refractive index of the first light transmissive portion 17a is equal to or lower than approximately 1.5, the refractive index of the second light transmissive portion 17b may be equal to or higher than approximately 1.7.

In order to improve light extraction efficiency in an upward direction, the refractive index of the second light transmissive portion 17b may be close to or higher than the refractive index of the light emitting nanostructure 15. For example, in a case in which the refractive index of the light emitting nanostructure 15 formed of or including GaN is approximately 2.4, the refractive index of the second light transmissive portion 17b may be equal to or higher than 1.9, preferably, 2.0.

For example, the second light transmissive portion 17b may be formed of or include at least one of $TiO_2$ (2.8), SiC (2.69), ZnO (2.1), $ZrO_2$ (2.23), ZnS (2.66), SiN (2.05), $HfO_2$ (1.95) and diamond (2.44) (numbers in parentheses indicating refractive indices (@450 nm)).

Figure 6:
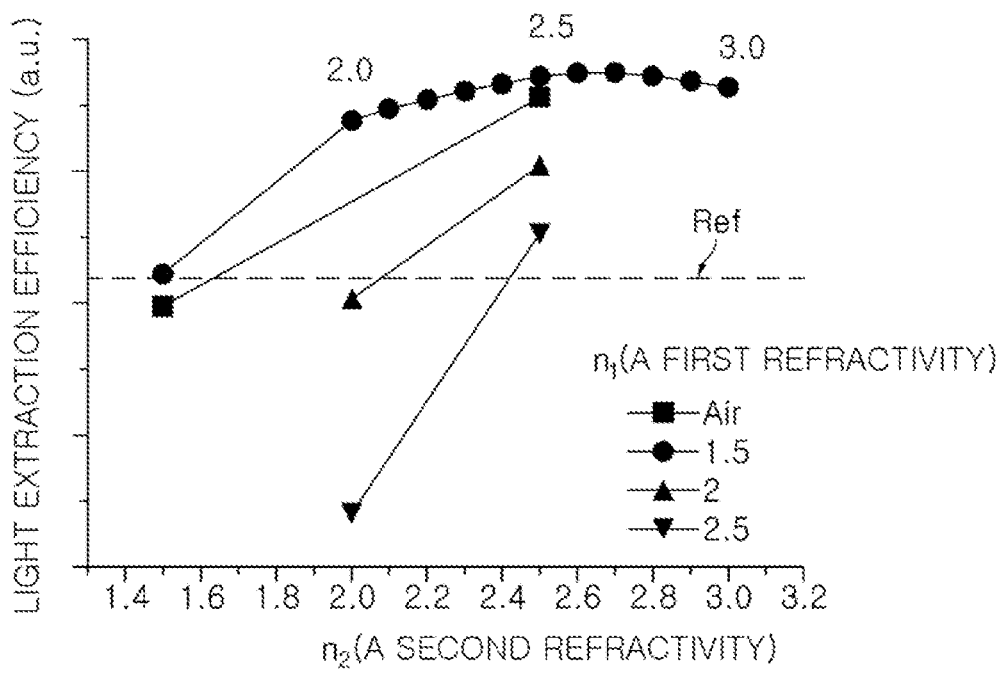
FIG. 6 is a graph illustrating changes in light extraction efficiency according to refractive indices of a first light transmissive portion and a second light transmissive portion.

FIG. 6 is a graph illustrating changes in light extraction efficiency according to refractive indices of the first light transmissive portion and the second light transmissive portion.

An x-axis indicates a second refractive index $n_2$ corresponding to the refractive index of the second light transmissive portion, and a y-axis indicates light extraction efficiency. A reference value Ref is a value of light extraction efficiency of a light emitting nanostructure to which no light transmissive protective layer is applied.

When a first refractive index $n_1$ corresponding to the refractive index of the first light transmissive portion was 1 (Air), 1.5, 2, or 2.5, the light extraction efficiency of the light emitting nanostructure in the upward direction was measured by changing the second refractive index $n_2$. When the first refractive index $n_1$ corresponding to the refractive index of the first light transmissive portion was higher than the second refractive index $n_2$, light extraction efficiency was equal to or less than the reference value Ref. When the first and second refractive indices were the same, light extraction efficiency was slightly increased only if the same refractive index (2.5) was higher than the refractive index (2.4) of the light emitting nanostructure.

According to at least one example embodiment, when the second refractive index was higher than the first refractive index, light extraction efficiency was considerably improved as compared to the light extraction efficiency of a light emitting nanostructure including a single refractive layer having a high refractive index ($n_2/n_1=2.5/2.5$). For example, when the refractive index ($n_2/n_1$) was 2.5/2.0, 2.4/1, 2.0/1.5, 2.5/1.5, or 3.0/1.5, light extraction efficiency was increased by approximately 5% to 7%. In particular, when the first refractive index of the first light transmissive portion was equal to or lower than 1.5, rather than 2.0, the effect of improving light extraction efficiency was further increased.

As illustrated in FIGS. 5D and 5E, the second light transmissive portion covering the upper portion of the light emitting nanostructure may be extended to a portion of the main portion of the light emitting nanostructure to partially cover the side surfaces thereof. In this manner, an increased amount of light may be extracted in the upward direction through the portion of the second light transmissive portion extended to the main portion of the light emitting nanostructure.

Figure 7:
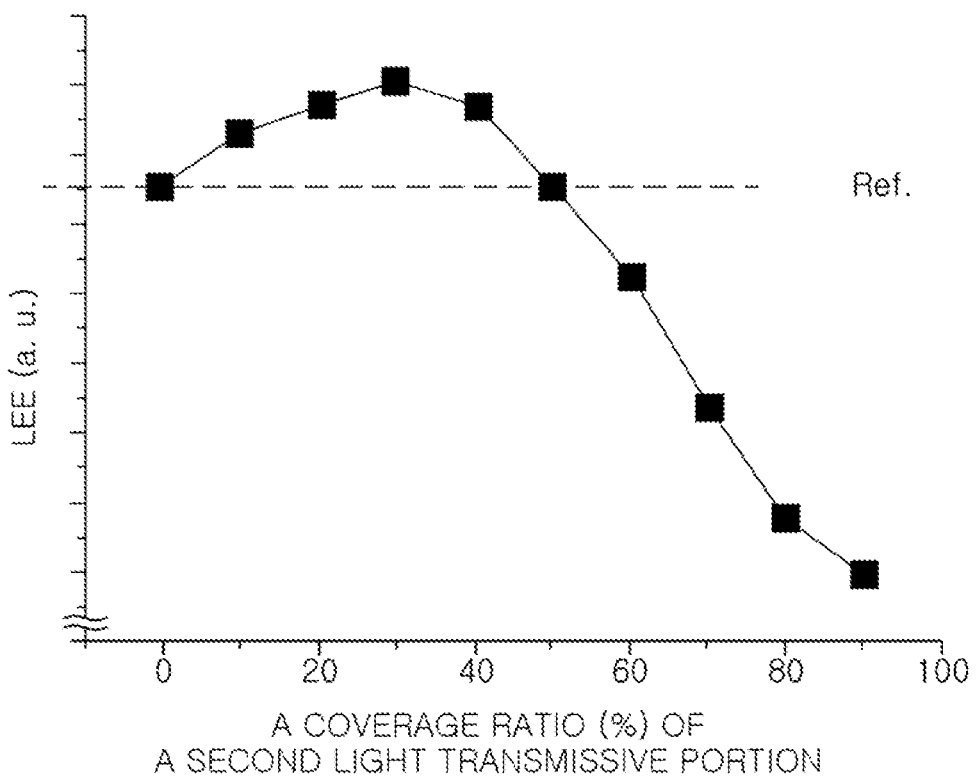
FIG. 7 is a graph illustrating changes in light extraction efficiency according to a location of an interface of a first light transmissive portion and a second light transmissive portion.

FIG. 7 is a graph illustrating changes in light extraction efficiency according to a location of an interface of a first light transmissive portion and a second light transmissive portion, according to at least one example embodiment. When a coverage ratio (%) of the second light transmissive portion is defined as a ratio of a thickness t3 of the portion of the second light transmissive portion covering the main portion of the light emitting nanostructure to the height of the main portion of the light emitting nanostructure (see FIG. 5E), in a case in which the coverage ratio is increased to approximately 50%, the light extraction efficiency of the light emitting nanostructure is higher than a reference value Ref. Here, the reference value Ref is a value of light extraction efficiency of a light emitting nanostructure to which a second light transmissive portion is applied while only being disposed on the tip portion of the light emitting nanostructure and not being extended to the main portion thereof.

By allowing the second light transmissive portion to be extended to an appropriate height of the main portion of the light emitting nanostructure, light extraction efficiency may be significantly improved.

The nanostructure semiconductor light emitting device according to an example embodiment may be manufactured using various methods. FIGS. 8A through 8E illustrate an example of a method of manufacturing a nanostructure semiconductor light emitting device, in which a process of filling nanocores using a mask as a mold structure may be performed to grow the nanocores. This process may be replaced by the process of forming the light emitting nanostructure illustrated in FIGS. 5A and 5B.

Figure 8A:
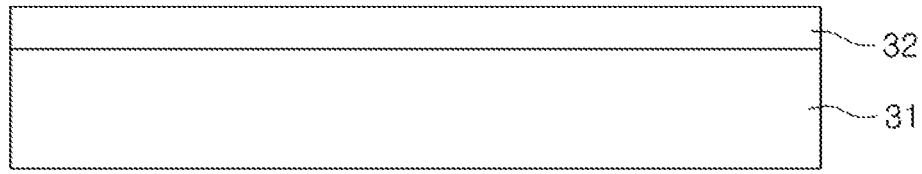
FIGS. 8A through 8E are cross-sectional views illustrating sequential processes in a method of manufacturing a nanostructure semiconductor light emitting device according to an example embodiment.

As illustrated in FIG. 8A, a base layer 32 may be provided by growing a first conductivity-type semiconductor material on a substrate 31.

The base layer 32 may provide a crystal growth surface for growing light emitting nanostructures thereon and may electrically connect one polarity of the light emitting nanostructures. Therefore, the base layer 32 may be formed of or include a semiconductor single crystal having electrical conductivity. When the base layer 32 is directly grown, the substrate 31 may be a crystal growth substrate. A buffer layer formed of or including $Al_xIn_yGa_{1-x-y}N$ ($0 \leq x \leq 1$, $0 \leq y \leq 1$, $0 \leq x+y \leq 1$) may be formed on the substrate 31 prior to the growth of the base layer 32, thereby forming a multilayer structure. The multilayer structure may include an undoped GaN layer and an AlGaN layer or a combination thereof as intermediate layers, in order to prevent current leakage from the base layer 32 toward the buffer layer and to improve crystallinity of the base layer 32.

Figure 8B:
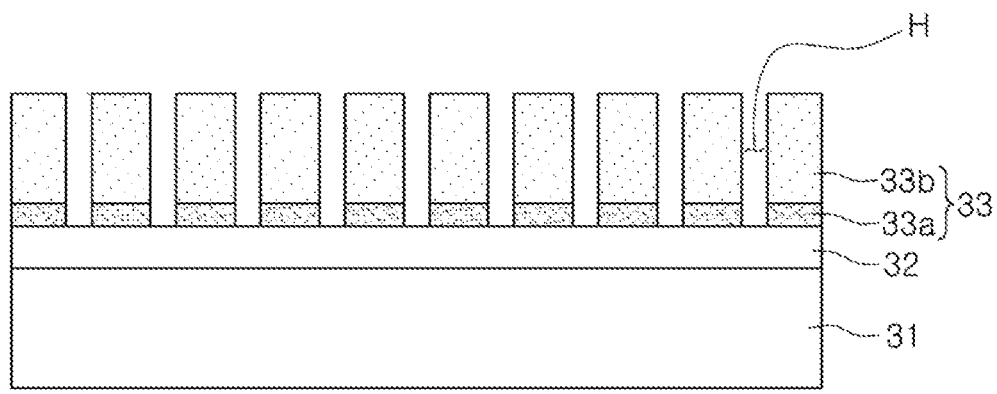

Next, as illustrated in FIG. 8B, a mask 33 having a plurality of openings H and including an etch stop layer may be formed on the base layer 32.

The mask 33 used in the present example embodiment may include a first material layer 33a formed on the base layer 32, and a second material layer 33b formed on the first material layer 33a and having an etching rate higher than the etching rate of the first material layer 33a.

The first material layer 33a may be provided as the etch stop layer. That is, the first material layer 33a may have an etching rate lower than the etching rate of the second material layer 33b under the same etching conditions. At least the first material layer 33a may be formed of or include a material having electrical insulating properties, and the second material layer 33b may also be formed of or include an insulating material as necessary.

The first and second material layers 33a and 33b may be formed of or include different materials to obtain a difference in etching rates. For example, the first material layer 33a may be a SiN layer and the second material layer 33b may be a $SiO_2$ layer. Alternatively, such a difference in etching rates may be obtained using pore density. By forming the second material layer 33b or the first and second material layers 33a and 33b using a porous material, a difference in porosity may be adjusted to obtain a difference in etching rates. In this case, the first and second material layers 33a and 33b may be formed of or include the same material having different porosities. For example, the first material layer 33a may be a $SiO_2$ layer having a first porosity and the second material layer 33b may be a $SiO_2$ layer having a second porosity higher than the first porosity. Accordingly, the etching rate of the first material layer 33a may be lower than the etching rate of the second material layer 33b under conditions under which the second material layer 33b is etched.

The overall thickness of the first and second material layers 33a and 33b may be selected in consideration of a desired height of a nanostructure. An etch stop level through the first material layer 33a may be set in consideration of an overall height of the mask 33 from the surface of the base layer 32. After the first and second material layers 33a and 33b are formed, for example sequentially, on the base layer 32, a plurality of openings H may be formed in the first and second material layers to expose regions of the base layer 32 therethrough. The openings H may be obtained by forming a photoresist on the mask 33 and performing a lithography process and a wet/dry etching process. The size of each opening H may be selected in consideration of a desired size of the light emitting nanostructure. For example, the opening H exposing the surface of the base layer 32 may have a width of 600 nm or less, specifically, a width of 50 nm to 500 nm.

The openings H may be formed through a semiconductor process, for example, a deep-etching process, to have a relatively high aspect ratio. The openings H may have an aspect ratio of 5:1 or higher, specifically, 10:1 or higher.

While varied depending on etching conditions, in general, each opening H in the first and second material layers 33a and 33b may have a width decreasing toward the base layer 32.

In general, a dry etching process may be used as the deep-etching process, and reactive ions generated from plasma or ion beams generated in high vacuum may be used. Compared to wet etching, such dry etching allows for precision machining of a micro-structure without geometric constraints. A CF-based gas may be used for oxide film etching of the mask 33. For example, an etchant obtained by combining at least one of $O_2$ and Ar with a gas such as $CF_4$, $C_2F_6$, $C_3F_8$, $C_4F_8$, or $CHF_3$ may be used.

Figure 9A:
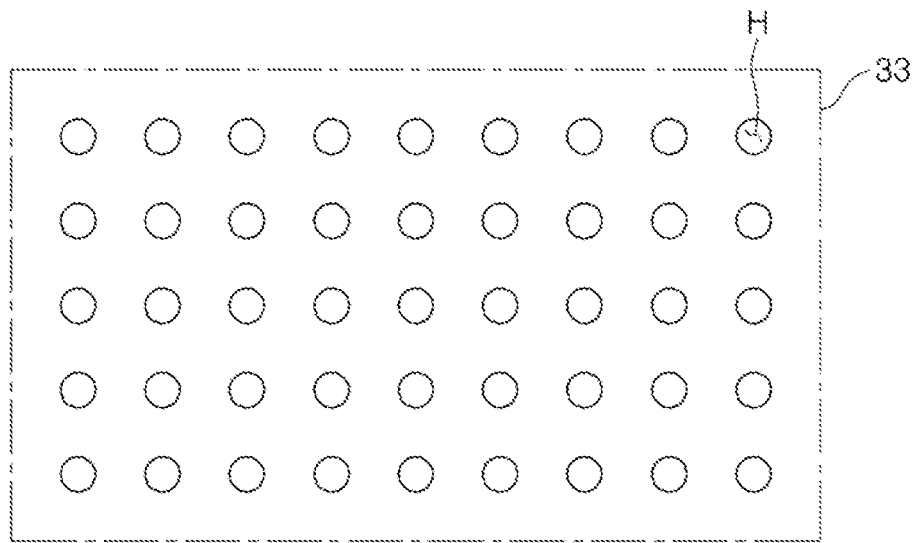
FIGS. 9A and 9B are plan views illustrating examples of a mask including openings, according to at least one example embodiment.
Figure 9B:
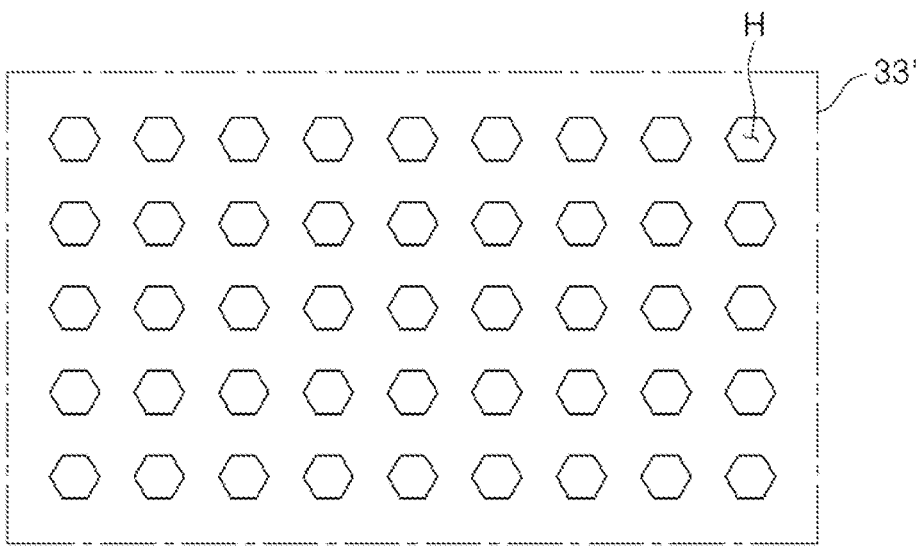

Cross-sectional shapes of the openings H and the arrangement thereof may be variously modified. For example, the openings H may have various cross-sectional shapes such as a polygonal shape, a quadrangular shape, an elliptical shape or a circular shape. The mask 33 illustrated in FIG. 8B may have an array of openings H having a circular cross-section as illustrated in FIG. 9A, but the mask 33 may have other shapes and arrangements as necessary. For example, the mask 33 may have an array of openings H having regular hexagonal cross-sections, like a mask 33' as illustrated in FIG. 9B.

Figure 10A:
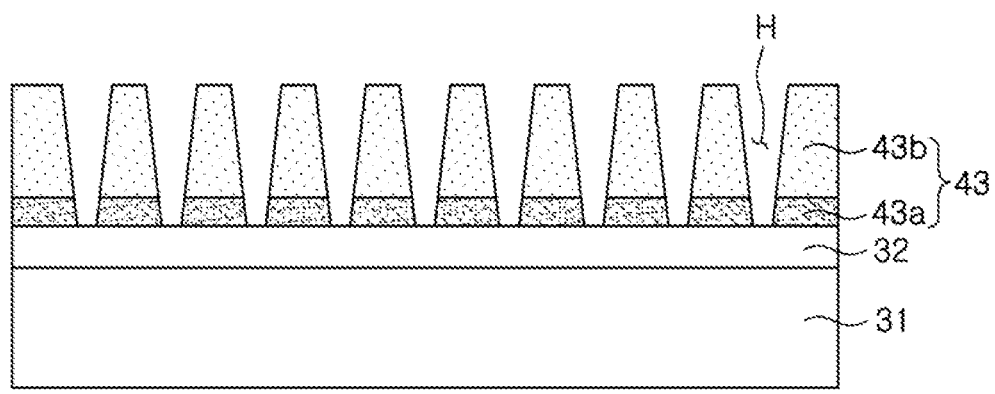
FIGS. 10A and 10B are cross-sectional views illustrating examples of a mask including openings, according to at least one example embodiment.
Figure 10B:
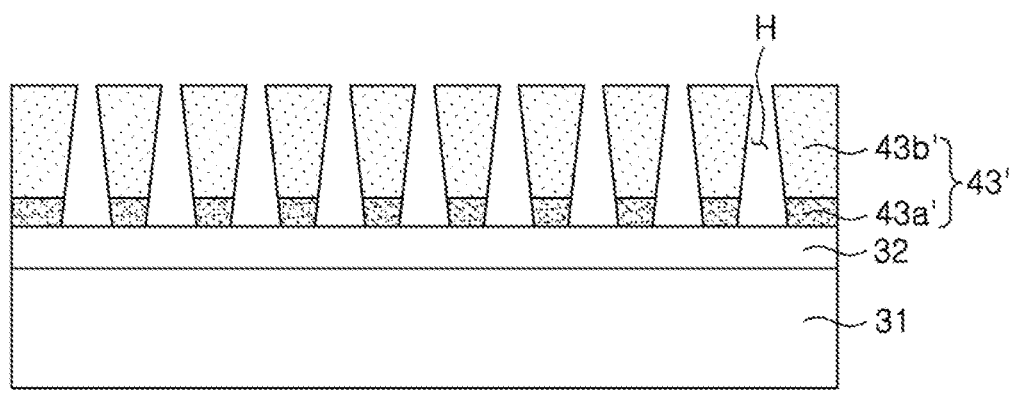

The openings H illustrated in FIG. 8B may have a rod structure having a uniform diameter (or width), but the example embodiments are not limited thereto and the openings H may have various other structures by using an appropriate etching process. For example, masks having different shapes are illustrated in FIGS. 10A and 10B. Referring to FIG. 10A, a mask 43 including first and second material layers 43a and 43b may have openings H having a rod structure of which a cross-sectional area is increased toward an upper portion thereof. Referring to FIG. 10B, a mask 43' including first and second material layers 43a' and 43b' may have openings H having a rod structure of which a cross-sectional area is decreased toward an upper portion thereof.

Figure 8C:
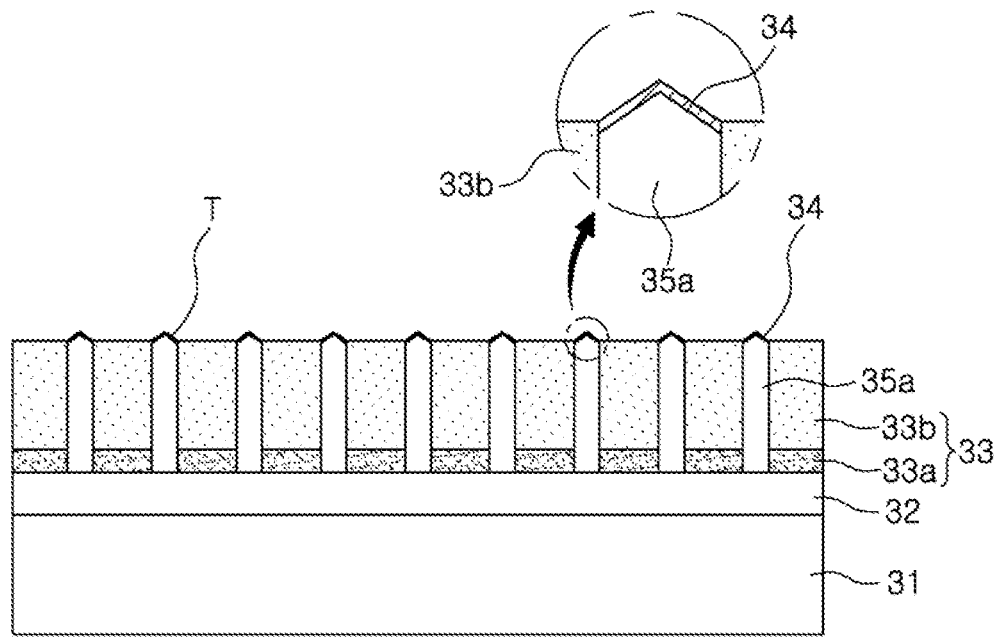

Next, as illustrated in FIG. 8C, a first conductivity-type semiconductor material may be grown on the exposed regions of the base layer 32 to fill the plurality of openings H, thus forming a plurality of nanocores 35a, and a current blocking intermediate layer 34 may be subsequently formed on tip portions T of the nanocores 35a.

The first conductivity-type semiconductor material of the nanocores 35a may be or include an n-type nitride semiconductor material and may be or include a material identical to the material of the first conductivity-type semiconductor material of the base layer 32. For example, the base layer 32 and the nanocores 35a may be formed of or include n-type GaN.

A nitride single crystal constituting the nanocore 35a may be formed using metal-organic chemical vapor deposition (MOCVD) or molecular beam epitaxy (MBE), and in this case, the mask 33 acts as a mold for the growing nitride single crystal to provide the nanocores 35a corresponding to the shape of the openings H. Namely, the nitride single crystal may be selectively grown on the regions of the base layer 32 exposed through the openings H, while filling the openings H, and thus, the shape of the grown nitride single crystal corresponds to the shape of the openings H.

With the mask 33 being retained, the current blocking intermediate layer 34 may be formed on surfaces of the tip portions T of the nanocores 35a. Thus, the current blocking intermediate layer 34 may be easily formed on desired positions of the tip portions T, even without performing a process of forming an additional mask.

The current blocking intermediate layer 34 may be or include a semiconductor layer which is not intentionally doped or may be or include a semiconductor layer which is doped with a second conductivity-type impurity different from that of the nanocores 35a. For example, in a case in which the nanocores 35a are formed of or include n-type GaN, the current blocking intermediate layer 34 may be an undoped GaN layer or may be a GaN layer doped with a p-type impurity such as magnesium (Mg). In this case, the nanocores 35a and the current blocking intermediate layer 34 may be continuously formed by changing only the types of impurity during the same growth process. In this manner, the process of forming the current blocking intermediate layer 34 and the mold process are combined to further simplify the overall process.

Figure 8D:
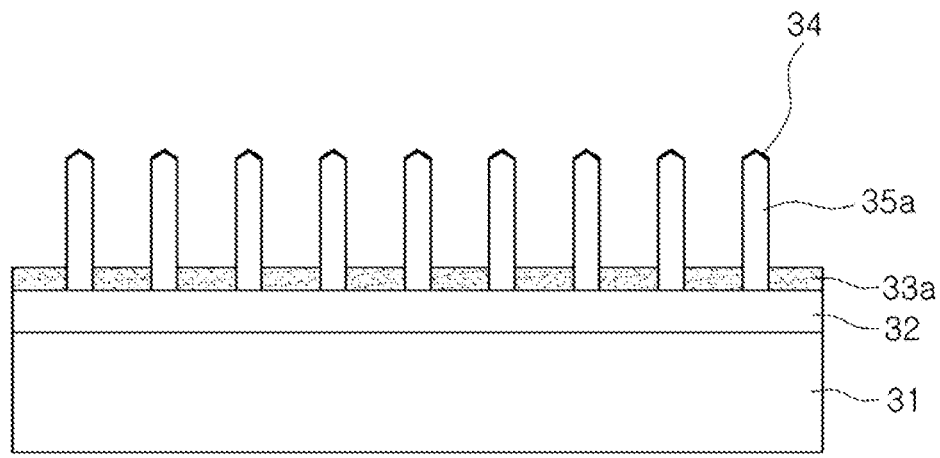

Then, as illustrated in FIG. 8D, the mask 33 may be partially removed to the level of the first material layer 33a serving as an etch stop layer to thereby expose portions of the side surfaces of the plurality of nanocores 35a.

In the present example embodiment, by using an etching process of selectively removing the second material layer 33b, only the second material layer 33b may be removed, while the first material layer 33a may be retained. The residual first material layer 33a may serve to prevent the active layer 35b and the second conductivity-type semiconductor layer 35c from being connected to the base layer 32 in a subsequent growth process.

In the present example embodiment, an additional heat treatment process may be performed during the process of forming the light emitting nanostructures using the mask having openings as a mold in order to enhance crystallinity.

Prior to the forming of the current blocking intermediate layer 34, a stabilizing process (a heat treatment) may be performed while the nanocores 35a are being grown to enhance crystallinity of the nanocores 35a. Namely, when the nanocores 35a are grown to reach a desired growth intermediate point (a height ranging from approximately 0.2 μm to 1.8 μm from the base layer), supply of a TMGa source, a Group-III element source of GaN, may be stopped and a heat treatment may be performed at a temperature (ranging from approximately 1000° C. to 1200° C.) similar to the temperature of the substrate during the growth of the nanocores for approximately 5 seconds to five minutes under an $NH_3$ atmosphere.

In addition, after the nanocores 35a are completely grown and the upper layer 33b of the mask 33 is removed, the surfaces of the nanocores 35a may be heat-treated under desired, or alternatively predetermined conditions to change a crystal plane of each nanocore 35a into a stable plane advantageous for crystal growth, like a semi-polar or non-polar crystal plane. This process will be described with reference to FIGS. 11A and 11B.

Figure 11A:
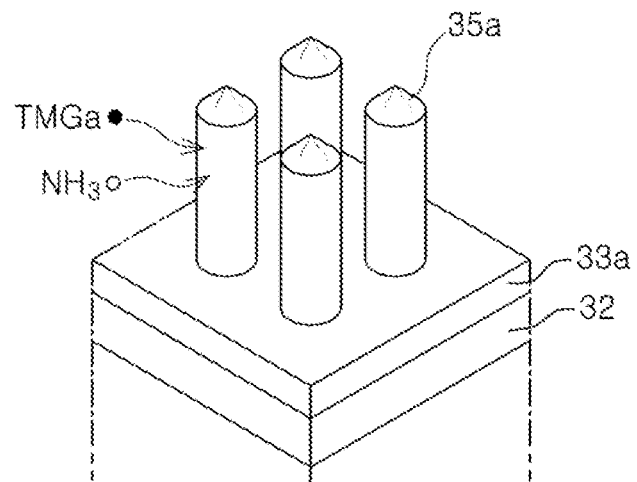
FIGS. 11A and 11B are views illustrating heat treatment processes applicable to the example embodiment of FIG. 8D.
Figure 11B:
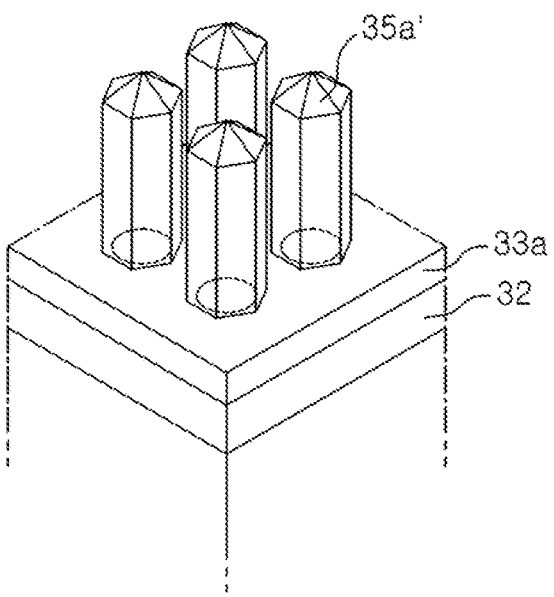

FIGS. 11A and 11B are schematic views illustrating a heat treatment process applicable to the process of FIG. 8D.

FIG. 11A illustrates the nanocores 35a obtained in the process of FIG. 8D. The nanocores 35a may have crystal planes determined depending on the shape of the openings. Although differing depending on the shape of the openings, in general, the surfaces of the nanocores 35a obtained thusly may be relatively unstable crystal planes, which may not be advantageous for subsequent crystal growth.

In the present example embodiment, when the openings have a cylindrical rod shape, the side surfaces of each nanocore 35a may be curved surfaces, rather than particular crystal planes.

When such nanocores 35a are heat-treated, unstable crystals on the surfaces thereof are rearranged to have stable crystal planes such as semi-polar or non-polar planes. As for heat treatment conditions, the nanocores may be heat-treated at a temperature equal to or higher than substantially 600° C., and in a specific example, at a temperature ranging from substantially 800° C. to substantially 1200° C., for a few seconds to tens of minutes (1 second to 60 minutes) to obtain desired stable crystal planes.

In the heat treatment process, if the substrate temperature is lower than substantially 600° C., it may be difficult to grow and rearrange crystals of the nanocores, causing difficulty in obtaining a heat treatment effect, and if the substrate temperature is lower than 1200° C., nitrogen (N) may be evaporated from the GaN crystal planes to degrade crystallinity. Also, it may be difficult to obtain a sufficient heat treatment effect for a period of time shorter than 1 second, and a heat treatment performed for tens of minutes, for example, for a period of time longer than 60 minutes, may degrade manufacturing process efficiency.

For example, when the nanocores 35a are grown on a C(0001) plane of a sapphire substrate (a (111) plane in case of a silicon substrate), the nanocores 35a having a cylindrical shape may be heat-treated in an appropriate temperature range as mentioned above to change curved surfaces (side surfaces), unstable crystal planes, into a hexagonal prism (35a' in FIG. 11B) having non-polar planes (m-plane) as stable crystal planes. Stabilization of the crystal planes may be realized through the heat treatment process performed at a high temperature such as, for example, 800° C. to 200° C.

It may be understood that in a case in which crystals positioned on the surface of the nanocore are rearranged at a high temperature such as, for example, at 800° C. to 200° C., or a source gas remains within a chamber, such a residual source gas is deposited and partial regrowth for obtaining stable crystal planes is performed.

In particular, in view of regrowth, a heat treatment process may be performed under an atmosphere within a chamber in which a residual source gas is present, or may be performed under conditions in which a small amount of source gas is supplied. For example, as illustrated in FIG. 11A, in case of an MOCVD chamber, TMGa and $NH_3$ remain and a heat treatment process is performed under the atmosphere with the residual TMGa and $NH_3$ to allow the source gas to react with the surfaces of the nanocores to thereby perform partial regrowth for obtaining stable crystal planes. Due to this regrowth, widths of the heat-treated nanocores 35a' maybe slightly increased, relative to the widths of the nanocores 35a prior to the heat treatment process (please refer to FIGS. 11A and 11B).

In this manner, crystallinity of the nanocores may be enhanced by performing the additional heat treatment process. Namely, through the heat treatment process, non-uniformities (for example, defects, or the like) present on the surfaces of the nanocores after the removal of the mask may be removed and stability of the internal crystals may be greatly enhanced through rearrangement. The heat treatment process may be performed under conditions similar to the conditions of the growth process of the nanocores within the chamber after the removal of the mask. For example, the heat treatment process may be performed at a temperature (for example, substrate temperature) ranging from substantially 800° C. to substantially 1200° C., but a similar effect may also be obtained even with a heat treatment process performed at a temperature equal to or higher than substantially 600° C.

Figure 8E:
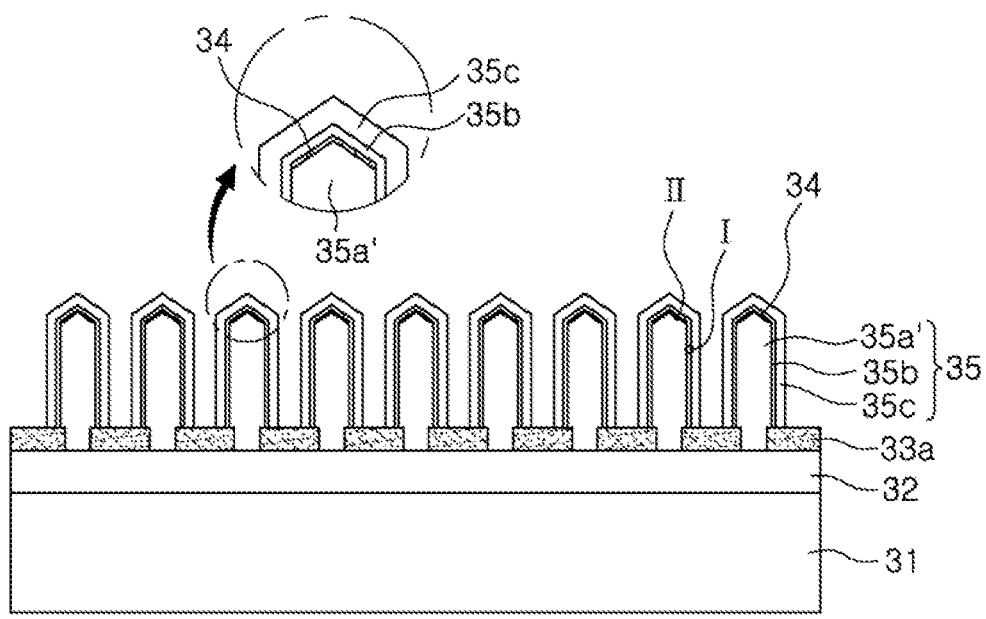

Subsequently, as illustrated in FIG. 8E, the active layer 35b and the second conductivity-type semiconductor layer 35c are sequentially grown on the surfaces of the plurality of nanocores 35a'.

Through this process, each light emitting nanostructure 35 may have a core-shell structure including the nanocore 35a' formed of or including the first conductivity-type semiconductor material, and a shell layer formed of or including the active layer 35b covering the nanocore 35a' and the second conductivity-type semiconductor layer 35c.

The nanocore 35a' may have a tip portion having different crystal planes from the crystal planes of the side surfaces thereof, and as mentioned above, portions II of the active layer and the second conductivity-type semiconductor layer formed on the tip portion of the nanocore and portions I of the active layer and the second conductivity-type semiconductor layer formed on the side surfaces of the nanocore may have different compositions and/or thicknesses. This may result in leakage currents and a problematic wavelength in emitted light, and in order to address such problems, the current blocking intermediate layer 34 may be disposed on the tip portion of the nanocore 35a. Due to the selective disposition of the current blocking intermediate layer 34, a current flow through the active layer region formed on the side surfaces of the nanocore 35a' is normally guaranteed, while a current flow through the active layer region formed on the tip portion of the nanocore 35a' may be blocked by the current blocking intermediate layer 34.

Accordingly, leakage currents concentrated on the tip portion of the nanocore 35a' may be reduced or suppressed, whereby efficiency may be enhanced and a desired wavelength of emitted light may be accurately designed.

The mask used in this example embodiment includes the two material layers, but the example embodiments are not limited thereto and a mask including three or more layers may also be used.

For example, in case of a mask having first to third material layers sequentially formed on the base layer, the second material layer, as an etch stop layer, may be formed of or include a material different from the materials of the first and third material layers. The first and third material layers may be formed of or include the same material as necessary.

Under etching conditions of the third material layer, at least the second material layer has an etching rate lower than the etching rate of the third material layer, so the second material layer may act as an etch stop layer. At least the first material layer may be formed of or include a material having electrical insulation properties, and the second or third material layer may also be formed of or include an insulating material as necessary.

FIGS. 12A through 12D are cross-sectional views illustrating major processes of forming light emitting nanostructures using the mask 43 illustrated in FIG. 10A.

Figure 12A:
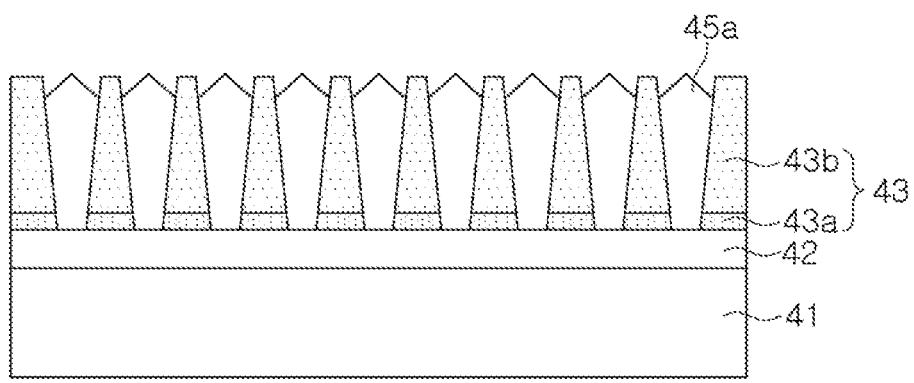
FIGS. 12A through 12D are cross-sectional views illustrating sequential processes in forming nanocores using the mask of FIG. 10A.

As illustrated in FIG. 12A, nanocores 45a may be grown on a base layer 42 using the mask 43. The mask 43 has openings, each of which having a width decreasing toward a lower portion thereof. The nanocores 45a may be grown to have a shape corresponding to the shape of the openings.

In order to further enhance crystallinity of the nanocores 45a, a heat treatment process may be performed one or more times during the growth of the nanocores 45a. In particular, surfaces of a tip portion of each nanocore 45a may be rearranged to be hexagonal pyramidal crystal planes, thus obtaining a stable crystal structure and guaranteeing high quality of a crystal grown in a subsequent process.

The heat treatment process may be performed under the temperature conditions as described above. For example, for process convenience, the heat treatment process may be performed at a temperature equal or similar to the growth temperature of the nanocores 45a. Also, the heat treatment process may be performed in a manner of stopping a metal source such as TMGa, while maintaining a pressure and a temperature equal or similar to the growth pressure and temperature of the nanocores 45a. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process performed during the growth process of the nanocores 45a may prevent degradation of crystallinity that may be caused when the nanocores 45a are grown at a fast speed, and thus, fast crystal growth and excellent crystallinity may be promoted.

A period of time for a heat treatment process and the number of heat treatment processes for stabilization may be variously modified according to heights and diameters of final nanocores. For example, in a case in which a width of each opening ranges from 300 nm to 400 nm and a height of each opening (thickness of the mask) is approximately 2.0 µm, a stabilization time duration ranging from approximately 10 seconds to 60 seconds maybe inserted into a middle point, i.e., approximately 1.0 µm to grow nanocores having desired high quality. The stabilization process may be omitted according to core growth conditions.

Figure 12B:
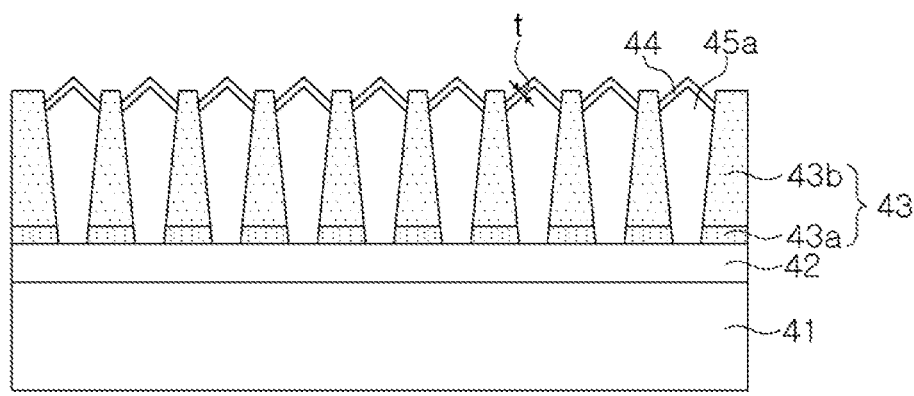

Subsequently, as illustrated in FIG. 12B, a current blocking intermediate layer 44 may be formed on the tip portions of the nanocores 45a.

After the nanocores 45a are formed to have a desired height, the current blocking intermediate layer 44 may be formed on the surfaces of the tip portions of the nanocores 45a with the mask 43 retained. Thus, the current blocking intermediate layer 44 may be easily formed on the desired regions (the surfaces of the tip portions) of the nanocores 45a without forming an additional mask.

The current blocking intermediate layer 44 may be a semiconductor layer which is not intentionally doped or may be a semiconductor layer which is doped with a second conductivity-type impurity different from that of the nanocores 45a. For example, in a casein which the nanocores 45a are formed of or include n-type GaN, the current blocking intermediate layer 44 may be an undoped GaN layer or a GaN layer doped with magnesium (Mg) as a p-type impurity. In this case, by changing types of impurity during the same growth process, the nanocores 45a and the current blocking intermediate layer 44 may be consecutively formed. For example, in case of stopping silicon (Si) doping and injecting magnesium (Mg) and growing the same for approximately 1 minute under the same conditions as the conditions of the growth of the n-type GaN nanocores, the current blocking intermediate layer 44 having a thickness ranging from approximately 200 nm to 300 nm may be formed, and such a current blocking intermediate layer 44 may effectively block a leakage current of a few µA or more. In this manner, the current blocking intermediate layer may be simply formed during the mold-type process as in the present example embodiment.

Figure 12C:
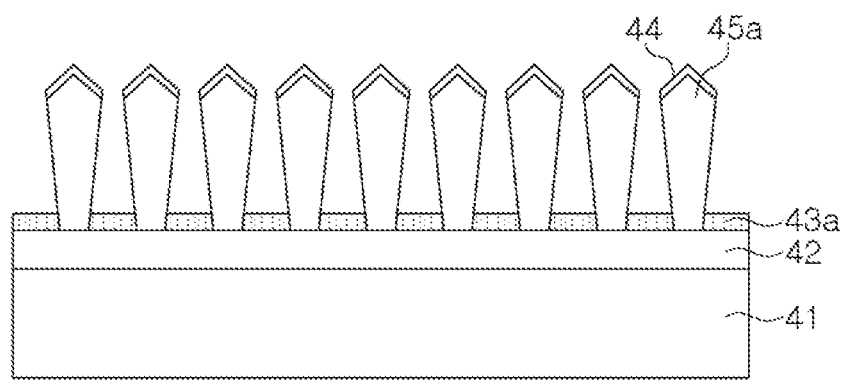

Subsequently, as illustrated in FIG. 12C, the mask 43 may be partially removed to the level of a first material layer 43a serving as an etch stop layer to thereby expose portions of the side surfaces of the plurality of nanocores 45a.

In the present example embodiment, by using the etching process of selectively removing a second material layer 43b, only the second material layer 43b may be removed, while the first material layer 43a may be retained. The residual first material layer 43a may serve to prevent an active layer and a second conductivity-type semiconductor layer from being connected to the base layer 42 in a follow-up growth process.

In the present example embodiment, an additional heat treatment process may be performed during the process of forming the light emitting nanostructures using the mask having the openings as a mold in order to enhance crystallinity.

Figure 12D:
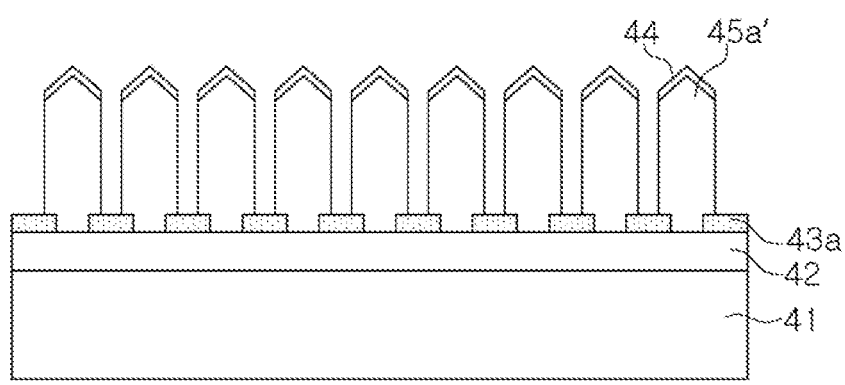

After the second material layer 43b of the mask 43 is removed, the surfaces of the nanocores 45a may be heat-treated under desired, or alternatively predetermined conditions to change unstable crystal planes of the nanocores 45a into stable crystal planes (please refer to FIGS. 11A and 11B). In particular, in the present example embodiment, the nanocores 45a are grown in the openings having inclined side walls such that they have inclined side walls corresponding to the shape of the openings, but as illustrated in FIG. 12D, after the heat treatment process is performed, crystals are rearranged and regrown so nanocores 45a' may have a substantially uniform diameter (or width). Also, the tip portions of the nanocores 45a may have an incomplete hexagonal pyramidal shape immediately after being grown, while the tip portions of the nanocores 45a' may have a hexagonal pyramidal shape having uniform facets after the heat treatment process. After the removal of the mask, the nanocore having a non-uniform width may be regrown (and/or rearranged) to form a hexagonal prism structure having a uniform width through the heat treatment process.

The light emitting nanostructures obtained by the above-described process may be combined with the light transmissive protective layer obtained by the process illustrated in FIGS. 5C through 5E, thereby providing a desired nanostructure semiconductor light emitting device. The example embodiments are not limited thereto, and according to some embodiments, various types of light transmissive protective layer in which first and second light transmissive portions are combined may be provided. In particular, according to the embodiments illustrated in FIGS. 13, 14 and 18, a current blocking intermediate layer 54 is provided as a high resistance element, similar to the structure obtained in the above-described process.

Figure 13:
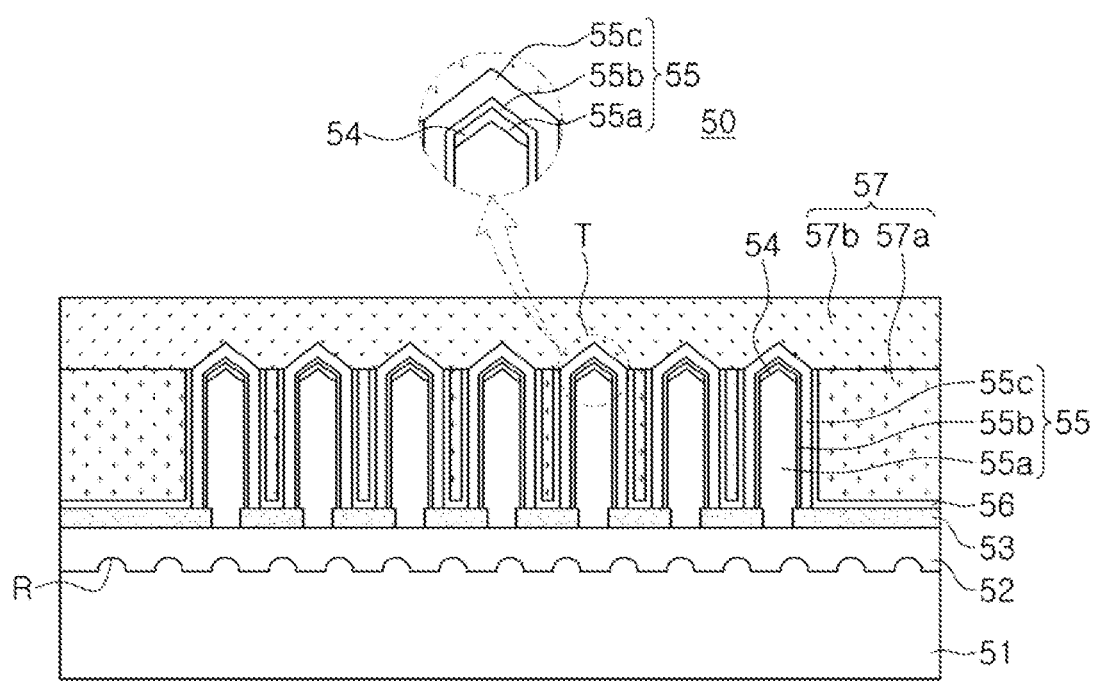
FIG. 13 is a cross-sectional view of a nanostructure semiconductor light emitting device according to an example embodiment.

FIG. 13 is a cross-sectional view illustrating a nanostructure semiconductor light emitting device according to an example embodiment.

A nanostructure semiconductor light emitting device 50 illustrated in FIG. 13 may include a substrate 51 having a convex pattern including uneven portions R, a base layer 52 formed on the substrate 51 using a first conductivity-type semiconductor material, and a plurality of light emitting nanostructures 55 disposed on the base layer 52.

The substrate 51 may be an insulating substrate, a conductive substrate or a semiconductor substrate. For example, the substrate 51 may be formed of or include sapphire, SiC, Si, MgAl$_2$O$_4$, MgO, LiAlO$_2$, LiGaO$_2$ or GaN. The base layer 52 may provide a growth surface for the light emitting nanostructures 55. The base layer 52 maybe formed of or include an n-type nitride semiconductor containing Al$_x$In$_y$Ga$_{1-x-y}$N ($0 \leq x < 1$, $0 \leq y < 1$, $0 \leq x+y < 1$).

Nanocores 55a may be formed on regions of the base layer 52 exposed through openings of an insulating layer 53. For example, the insulating layer 53 may be formed of or include an insulating material such as SiO$_2$ or SiN$_x$. The light emitting nanostructures 55 may each include the nanocore 55a formed of or including a first conductivity-type semiconductor material, and an active layer 55b and a second conductivity-type semiconductor layer 55c sequentially formed on a surface of the nanocore 55a.

The nanostructure semiconductor light emitting device 50 may include a contact electrode 56 connected to the second conductivity-type semiconductor layer 55c. The contact electrode 56 used in the present example embodiment may be formed of or include a transparent conductive material.

A light transmissive protective layer 57 may include a first light transmissive portion 57a formed of or including a material having a first refractive index and a second light transmissive portion 57b formed of or including a material having a second refractive index higher than the first refractive index. The first light transmissive portion 57a may be disposed in space between the light emitting nanostructures 55 and the second light transmissive portion 57b may be disposed on upper portions of the light emitting nanostructures 55.

In the present example embodiment, the contact electrode may be disposed on side surfaces of the light emitting nanostructure 55 so that a tip portion T of the light emitting nanostructure 55 is exposed. In this case, the second light transmissive portion 57b may directly contact the tip portion T of the light emitting nanostructure 55 without contacting the contact electrode 56. This may be performed through an etching back process for selective removal of the contact electrode 56.

As necessary, after the first light transmissive portion 57a is formed, a level of the first light transmissive portion 57a may be adjusted during the process of selectively removing the contact electrode 56. In this case, the contact electrode 56 may be formed to have a height equal to the level of the first light transmissive portion 57a.

Due to the above-described disposition of the first light transmissive portion 57a and the second light transmissive portion 57b, light travelling toward the side surfaces of the light emitting nanostructure 55 may be reduced or suppressed, while light traveling upwardly may be effectively extracted. As a result, effective luminous efficiency may be significantly improved in an upward direction.

In the present example embodiment, the nanocore 55a may have the tip portion T having different crystal planes from the plane areas of the side surfaces thereof. The tip portion T of the nanocore 55a may have inclined crystal planes, unlike the planes of the side surfaces thereof.

As illustrated in FIG. 13, the current blocking intermediate layer 54 may be formed on a surface of the tip portion of the nanocore 55a. The current blocking intermediate layer 54 may be disposed between the active layer 55b and the nanocore 55a.

The current blocking intermediate layer 54 may be formed of or include a material having high electrical resistance in order to block a leakage current that may be caused at the tip portion T of the nanocore 55a. For example, the current blocking intermediate layer 54 may be a semiconductor layer which is not intentionally doped or may be a semiconductor layer which is doped with a second conductivity-type impurity different from that of the nanocores 55a. For example, in a case in which the nanocores 55a are formed of or include n-type GaN, the current blocking intermediate layer 54 may be an undoped GaN layer or a GaN layer doped with magnesium (Mg) as a p-type impurity. Such a current blocking intermediate layer 54 may be a high resistance region formed of or including the same material (for example, GaN) but implemented with various doping concentrations or doping materials, without being particularly distinguished from an adjacent layer. For example, GaN may be grown, while an n-type impurity is supplied thereto, to form a nanocore and here, GaN may continue to be grown, while the supply of the n-type impurity is blocked or a p-type impurity such as magnesium (Mg) is supplied thereto, to form a desired current blocking intermediate layer. Alternatively, while GaN for a nanocore is being grown, a source of aluminum (Al) and/or indium (In) maybe additionally supplied to form a current blocking intermediate layer having a different composition $Al_xIn_yGa_{1-x-y}N$ ($0 \leq x<1$, $0 \leq y<1$, $0 \leq x+y<1$).

In a case in which the current blocking intermediate layer 54 is formed of or include a semiconductor layer, the current blocking intermediate layer 54 may have a thickness equal to or greater than approximately 50 nm in order to have sufficient electrical resistance. A concentration of the second conductivity-type impurity in the current blocking intermediate layer 54 may be approximately $1.0 \times 10^{16}/cm^3$ or higher. In the case of the current blocking intermediate layer 54 doped with the second-conductivity type impurity, a thickness and concentration thereof may be appropriately adjusted to be complementary to each other. For example, when the thickness of the current blocking intermediate layer 54 is relatively thin, a doping concentration therein may be increased to secure high resistance, and vice versa.

In the present example embodiment, a current flow through the active layer region formed on the tip portion T of the nanocore 55a may be blocked by the current blocking intermediate layer 54. Therefore, a leakage current generated at the tip portion T of the nanocore 55a may be effectively blocked.

Figure 14:
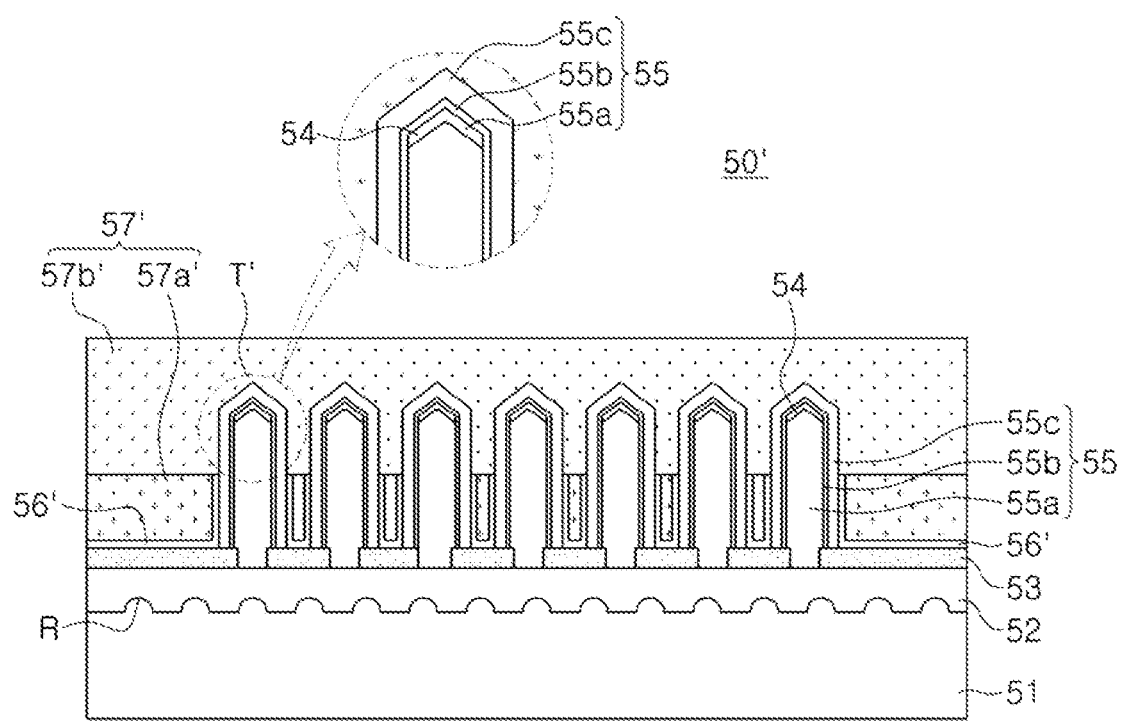
FIG. 14 is a cross-sectional view of a nanostructure semiconductor light emitting device according to an example embodiment.

A nanostructure semiconductor light emitting device 50' illustrated in FIG. 14 has a structure similar to the structure of the nanostructure semiconductor light emitting device 50 illustrated in FIG. 13, and respective corresponding elements thereof designated by the same reference numerals as the reference numerals of FIG. 13 may be understood with reference to the aforementioned description of FIG. 13, except that the nanostructure semiconductor light emitting device 50' may have a contact electrode 56' different from the corresponding element of FIG. 13.

As illustrated in FIG. 14, the contact electrode 56' may be disposed on portions of the side surfaces of the light emitting nanostructure 55 other than upper portions of the side surfaces. The upper portions of the side surfaces of the light emitting nanostructure 55 on which no contact electrode 56' is disposed may contact a light transmissive protective layer 57'.

In addition, according to the present example embodiment, a level of a first light transmissive portion 57a' may be provided to be similar to a height of the contact electrode 56'. A second light transmissive portion 57b' may be disposed on a region T' a portion of the side surfaces of the light emitting nanostructure 55. The contact electrode 56' may be not formed on the region T'. Most of the light toward the second light transmissive portion 57b' in the region T' can travel without interference due to contact electrode 56', whereby light extraction efficiency may be further improved.

Figure 15:
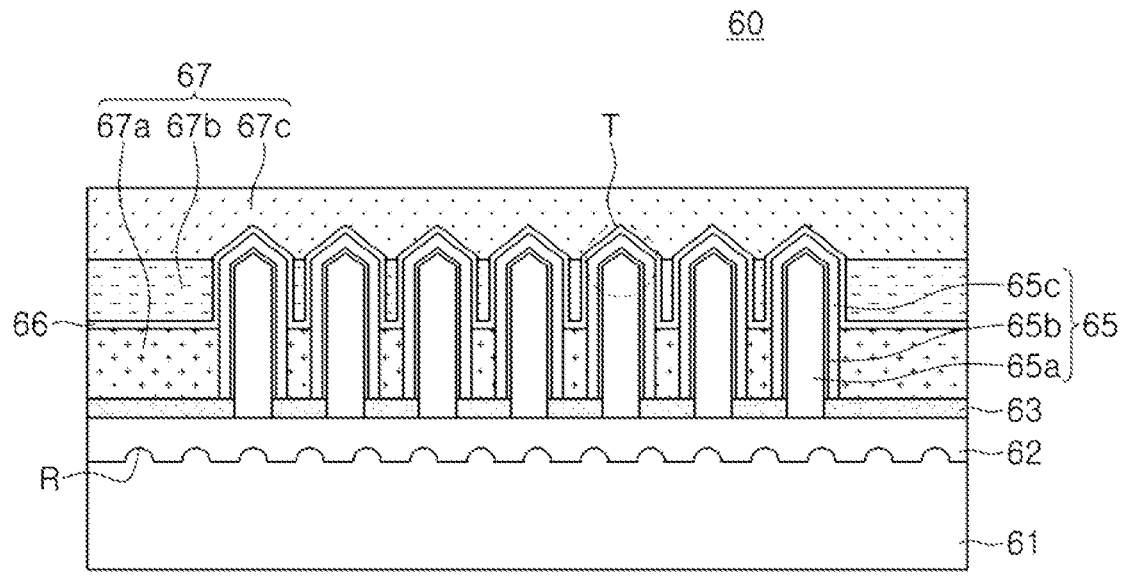
FIG. 15 is a cross-sectional view of a nanostructure semiconductor light emitting device according to an example embodiment.

FIG. 15 is a cross-sectional view illustrating a nanostructure semiconductor light emitting device according to an example embodiment. Descriptions of the preceding example embodiments may be combined with descriptions of the present example embodiment, unless otherwise mentioned.

A nanostructure semiconductor light emitting device 60 illustrated in FIG. 15 may include a substrate 61 having a convex pattern R, a base layer 62 formed on the substrate 61 using a first conductivity-type semiconductor material, and a plurality of light emitting nanostructures 65 disposed on the base layer 52.

The substrate 61 may be an insulating substrate, a conductive substrate or a semiconductor substrate. The base layer may provide a growth surface for the light emitting nanostructures 65. The base layer 62 may be formed of or include an n-type nitride semiconductor. Nanocores 65a may be formed on regions of the base layer 62 exposed through openings of an insulating layer 63.

The light emitting nanostructures 65 may each include the nanocore 65a formed of or including a first conductivity-type semiconductor material, and an active layer 65b and a second conductivity-type semiconductor layer 65c sequentially formed on a surface of the nanocore 65a.

A light transmissive protective layer 67 may include a first light transmissive portion 67a formed of or including a material having a first refractive index and a second light transmissive portion 67c formed of or including a material having a second refractive index higher than the first refractive index. In the present example embodiment, the light transmissive protective layer 67 may further include an intermediate light transmissive portion 67b between the first light transmissive portion 67a and the second light transmissive portion 67c. A refractive index of the intermediate light transmissive portion 67b may be higher than the first refractive index and lower than the second refractive index. The first light transmissive portion 67a may be disposed in space between the light emitting nanostructures 65. The refractive index of the first light transmissive portion 67a used in the present example embodiment may be lower than the refractive index of the corresponding first light transmissive portion in the preceding example embodiment. The intermediate light transmissive portion 67b used in the present example embodiment may be exemplified as a single layer. However, a plurality of intermediate light transmissive portions may be provided to have different refractive indices. For example, the plurality of intermediate light transmissive portions may be disposed in a manner such that the refractive indices thereof are increased from lower portions toward upper portions thereof.

A contact electrode 66 may be disposed on an upper surface of the first light transmissive portion 67a and a surface of a portion of the light emitting nanostructure 65 higher than the upper surface of the first light transmissive portion 67a. In this case, the intermediate light transmissive portion 67b may be disposed in space between the light emitting nanostructures 65 and have an interface in contact with the contact electrode 66. In a case in which the intermediate light transmissive portion 67b is not used, a portion of the second light transmissive portion 67c may be disposed between the light emitting nanostructures 65 and have an interface in contact with the contact electrode 66.

The second light transmissive portion 67c may be disposed on the intermediate light transmissive portion 67b to cover tip portions T of the plurality of light emitting nanostructures 65.

Figure 16:
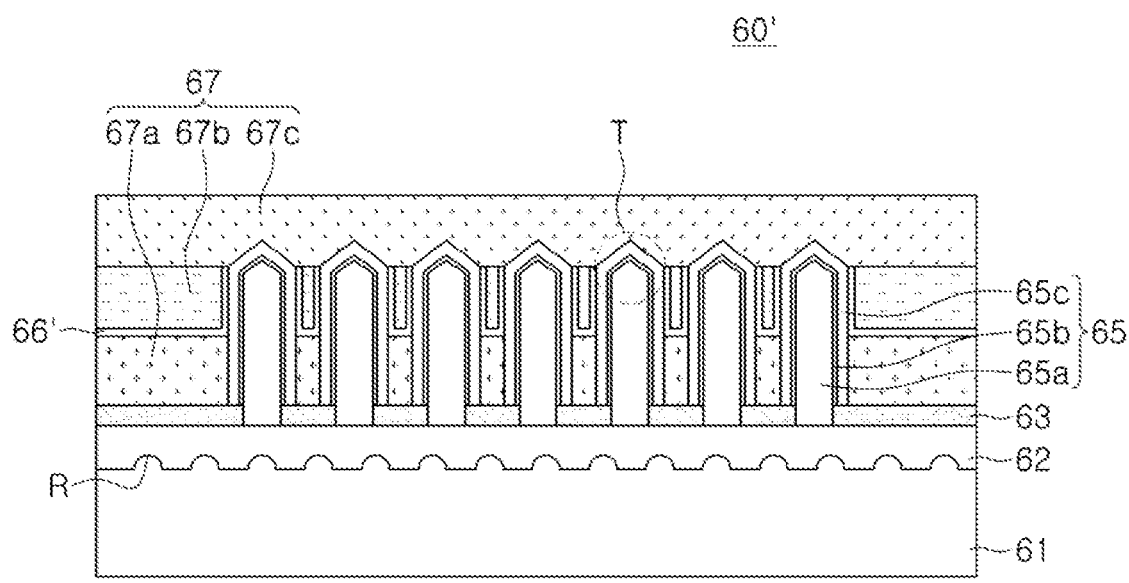
FIG. 16 is a cross-sectional view of a nanostructure semiconductor light emitting device according to an example embodiment.

FIG. 16 is a cross-sectional view illustrating a nanostructure semiconductor light emitting device according to an example embodiment. Descriptions of the preceding example embodiments may be combined with descriptions of the present example embodiment, unless otherwise mentioned.

A nanostructure semiconductor light emitting device 60' illustrated in FIG. 16 has a structure similar to the structure of the nanostructure semiconductor light emitting device 60 illustrated in FIG. 15, except that a contact electrode 66' is formed to expose the tip portion T of the light emitting nanostructure 65.

That is, in the present example embodiment, the contact electrode 66' may be formed on the side surfaces of the light emitting nanostructure 65 to expose the tip portion T of the light emitting nanostructure 65. Accordingly, the second light transmissive portion 67c may directly contact the tip portion T of the light emitting nanostructure 65 without contacting the contact electrode 66'. Details thereof may be understood with reference to the corresponding description in the example embodiment of FIG. 13.

Figure 17:
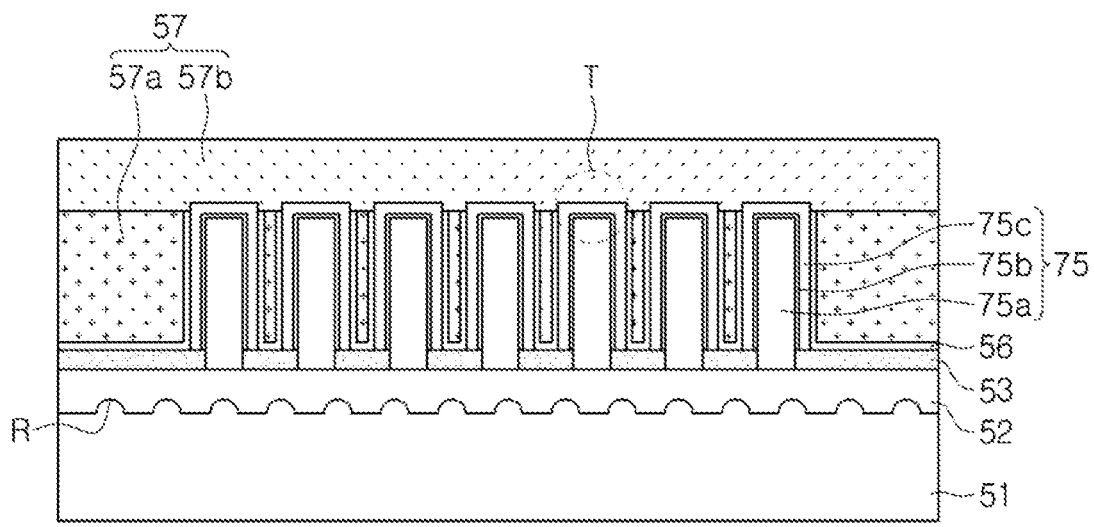
FIG. 17 is a cross-sectional view of a nanostructure semiconductor light emitting device according to an example embodiment.

FIG. 17 is a cross-sectional view illustrating a nanostructure semiconductor light emitting device according to an example embodiment. Descriptions of the preceding example embodiments may be combined with descriptions of the present example embodiment, unless otherwise mentioned.

A nanostructure semiconductor light emitting device 70 illustrated in FIG. 17 includes light emitting nanostructures 75, each of which has a flat tip portion T.

That is, the tip portion T of the light emitting nanostructure 75 is flat. Such a structure may be obtained by performing planarization on a tip portion T of a nanocore 75a after the growth of the nanocore 75a and sequentially forming an active layer 75b and a second conductivity-type semiconductor layer 75c. The light emitting nanostructure 75 may have different shapes and different crystal planes.

Figure 18:
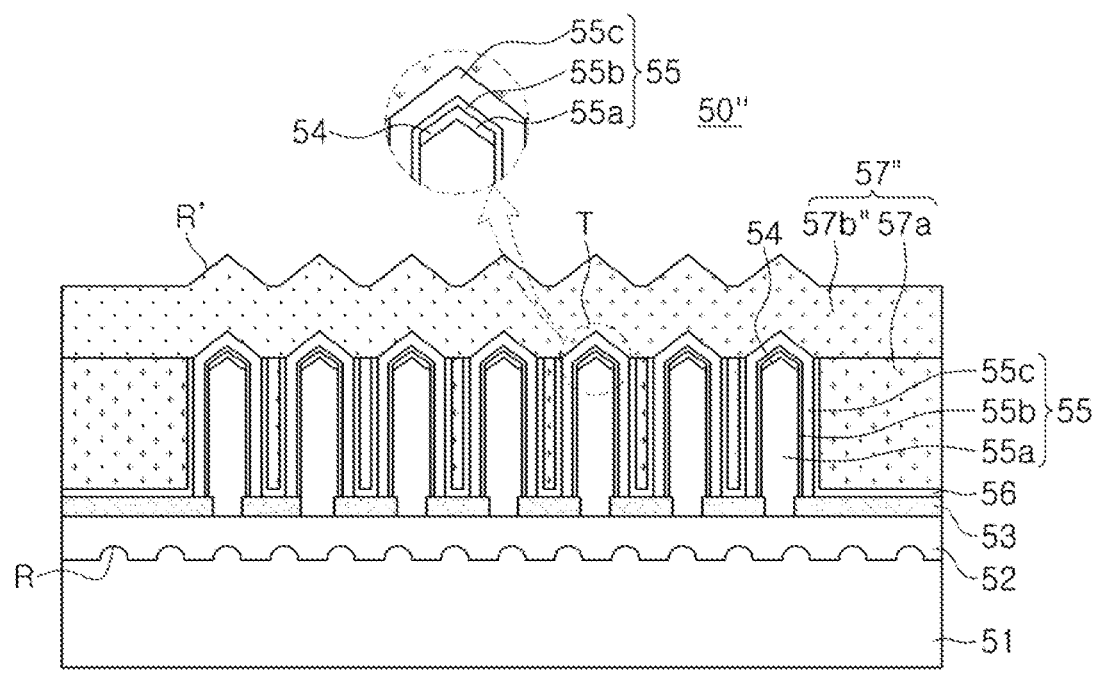
FIG. 18 is a cross-sectional view of a nanostructure semiconductor light emitting device according to an example embodiment.

FIG. 18 is a cross-sectional view illustrating a nanostructure semiconductor light emitting device according to an example embodiment. Descriptions of the preceding example embodiments may be combined with descriptions of the present example embodiment, unless otherwise mentioned.

A nanostructure semiconductor light emitting device 50'' illustrated in FIG. 18 has a structure similar to the structure of the nanostructure semiconductor light emitting device 50 illustrated in FIG. 13, except that an uneven pattern P is provided on an upper surface of a second light transmissive portion 57b'' as a light extraction pattern.

The second light transmissive portion 57b'' may include the light extraction pattern having an uneven surface in order to improve light extraction efficiency. The light extraction pattern may be formed of or include a regular or irregular uneven pattern R'. Such an uneven pattern R' may be formed of or include separate layers that may have different refractive indices. As in the present example embodiment, the uneven pattern R' may be formed by processing the surface of the second light transmissive portion 57b''. In this case, the uneven pattern P may be understood as being integrated with the second light transmissive portion 57b''.

Hereinafter, examples of a nanostructure semiconductor light emitting device using a lens structure in a second light transmissive portion will be provided in example embodiments.

Figure 19:
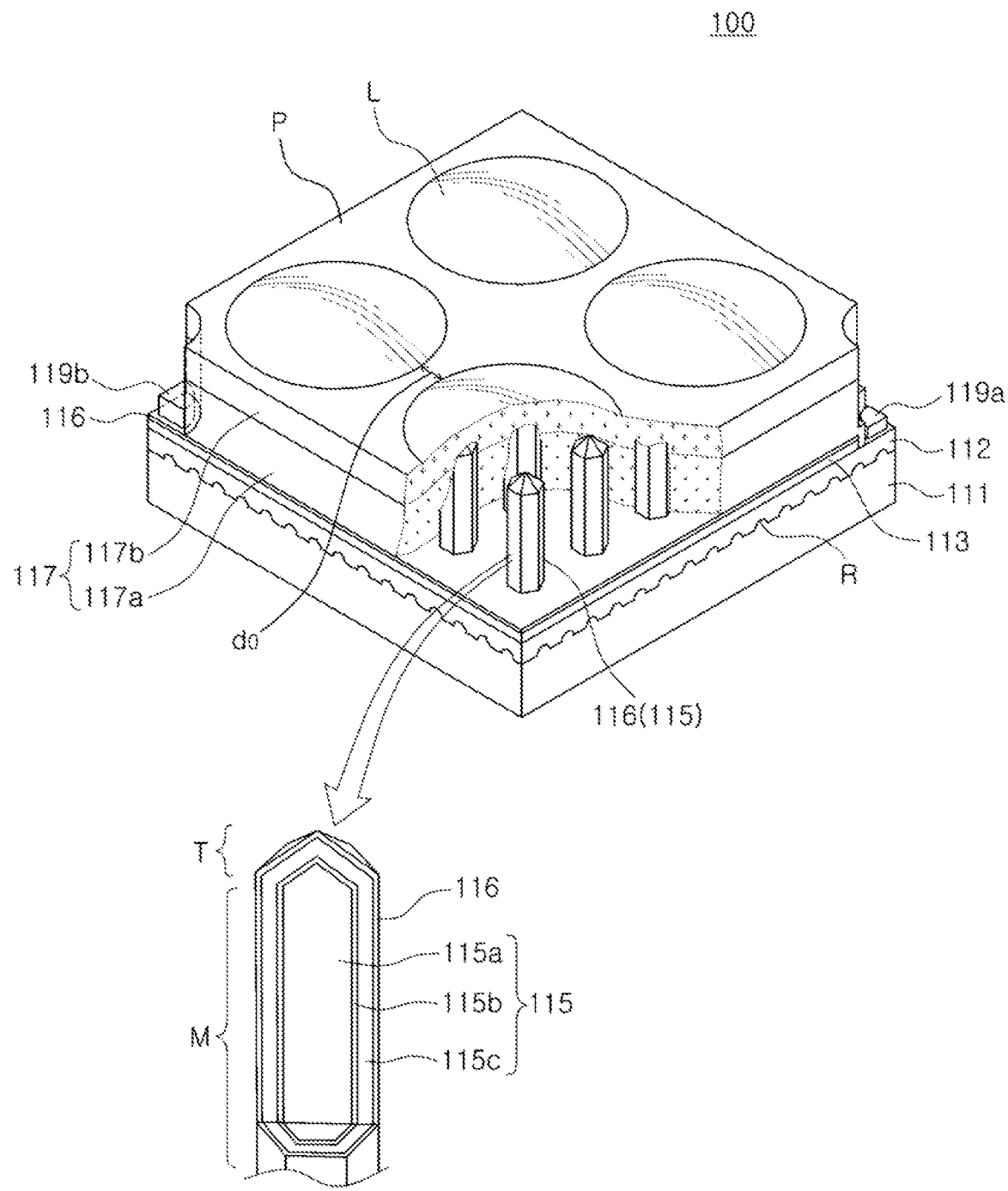
FIG. 19 is a schematic perspective view of a nanostructure semiconductor light emitting device according to an example embodiment.
Figure 20:
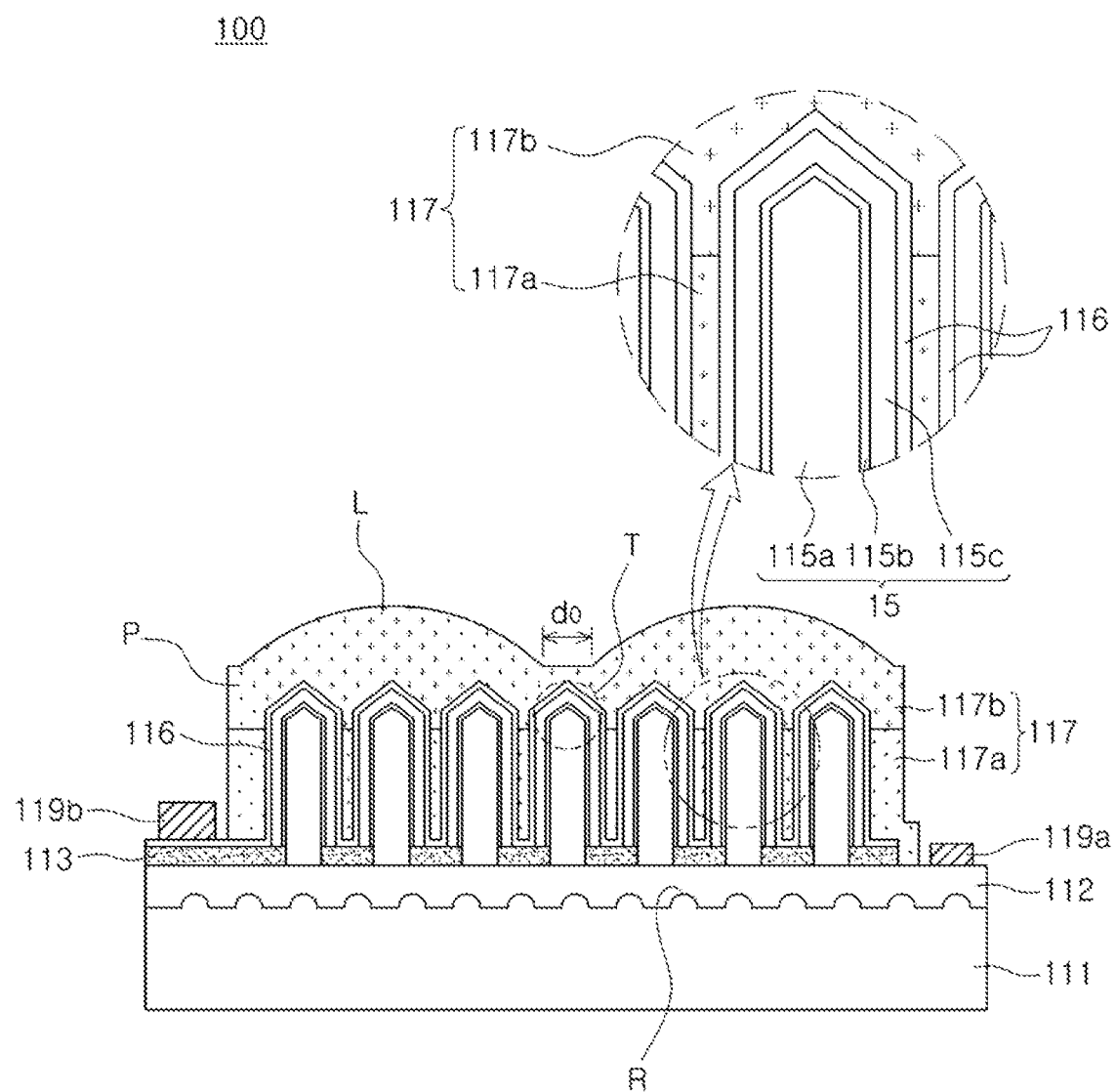
FIG. 20 is a cross-sectional view of the nanostructure semiconductor light emitting device of FIG. 19.

FIG. 19 is a schematic perspective view of a nanostructure semiconductor light emitting device according to an example embodiment, and FIG. 20 is a cross-sectional view of the nanostructure semiconductor light emitting device of FIG. 19.

A nanostructure semiconductor light emitting device 100 illustrated in FIG. 19 may include a base layer 112 formed of or including a first conductivity-type semiconductor material and a plurality of light emitting nanostructures 115 disposed on the base layer 112. In addition, the nanostructure semiconductor light emitting device 100 may include a substrate 111 having an upper surface on which the base layer 112 is disposed. Details of respective elements in the present example embodiment may be understood with reference to details of the corresponding elements in the example embodiment of FIGS. 1 and 2.

A convex pattern R may be formed on the upper surface of the substrate 111. The uneven portions R may improve light extraction efficiency and the quality of a single crystal grown thereon. The base layer 112 may be formed of or include a nitride semiconductor doped with first conductivity-type impurities. For example, the base layer 112 may be formed of or include n-type GaN. An insulating layer 113 having openings may be formed on the base layer 112 and the openings may be provided to facilitate growth of the light emitting nanostructures 115 (especially, nanocores 115a).

The light emitting nanostructures 115 may each include the nanocore 115a formed of or including a first conductivity-type semiconductor material, and an active layer 115b and a second conductivity-type semiconductor layer 115c sequentially formed on a surface of the nanocore 115a. The nanocore 115a may be formed of or include a first conductivity-type nitride semiconductor material, similar to the base layer 112. For example, the nanocore 115a may be formed of or include n-type GaN. The active layer 115b may have a MQW structure in which quantum well layers and quantum barrier layers are alternately stacked. For example, in the case in which the active layer 115b is formed of or include a nitride semiconductor, the active layer 115b may have a GaN/InGaN MQW structure. The second conductivity-type semiconductor layer 115c may be formed of or include a second conductivity-type nitride semiconductor, and may include a plurality of layers as necessary.

The light emitting nanostructure 115 used in the present example embodiment may include a main portion M having a hexagonal prism structure and a tip portion T disposed on the top of the main portion M. The main portion M of the light emitting nanostructure 115 may have side surfaces, each of which is a first crystal plane, and the tip portion T of the light emitting nanostructure 115 may have facets, each of which is a second crystal plane different from the first crystal plane.

The nanostructure semiconductor light emitting device 100 may include a contact electrode 116 connected to the second conductivity-type semiconductor layer 115c. The contact electrode 116 used in the present example embodiment may be formed of or include a transparent conductive material. The nanostructure semiconductor light emitting device 100 may include first and second electrodes 119a and 119b.

The nanostructure semiconductor light emitting device 100 may include a light transmissive protective layer 117 formed on the upper surface of the light emitting nanostructure 115. The light transmissive protective layer 17 may serve as a passivation layer protecting the light emitting nanostructures 115.

The light transmissive protective layer 117 used in the present example embodiment may be provided to the light emitting nanostructures 115 to improve light extraction efficiency.

As illustrated in FIG. 20, the light transmissive protective layer 117 may include a first light transmissive portion 117a formed of or including a material having a first refractive index and a second light transmissive portion 117b formed of or including a material having a second refractive index higher than the first refractive index.

The first light transmissive portion 117a may be formed by filling the material having the first refractive index in space between the light emitting nanostructures 115, and may be formed to have a thickness allowing portions of the plurality of light emitting nanostructures 115 to not be covered therewith.

The second light transmissive portion 117b may be disposed on the first light transmissive portion 117a to cover the portions of the plurality of light emitting nanostructures 115. In the present example embodiment, the second light transmissive portion 117b may include a plate P covering the light emitting nanostructures 115 and a plurality of lenses L arranged on the plate P. In the present example embodiment, the plate P and the lenses L may be formed of or include the same material having the second refractive index, but are not limited thereto. The plate P and the lenses L may be formed of or include materials having different refractive indices. For example, a refractive index of the lenses L may be higher than the refractive index of the plate P.

As illustrated in FIG. 19, four convex lenses L may be arranged on the light transmissive protective layer 117, and sizes thereof may correspond to the sizes of regions, each of which including several light emitting nanostructures 115 disposed therein. The lenses L may be spaced apart from each other by desired, or alternatively predetermined intervals $d_0$.

The light transmissive protective layer 117 used in the present example embodiment may effectively extract light in an upward direction, as described above with reference to FIGS. 4A and 4B.

Figure 21A:
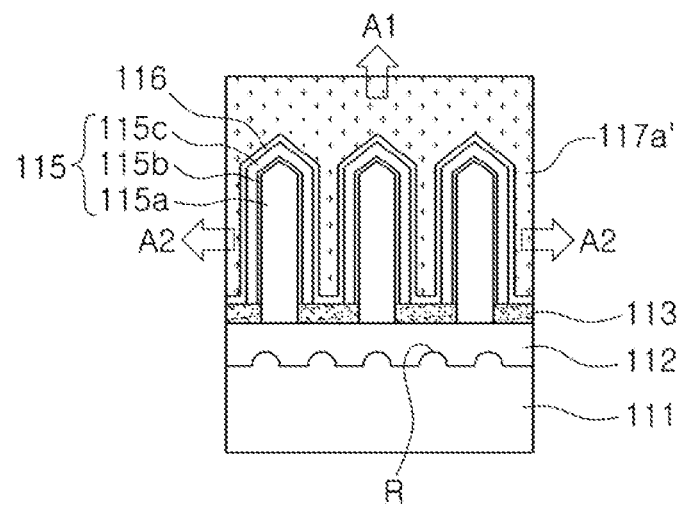
FIGS. 21A and 21B are cross-sectional views of a light emitting nanostructure illustrating the effect of improving light extraction efficiency in the example embodiment of FIG. 19.
Figure 21B:
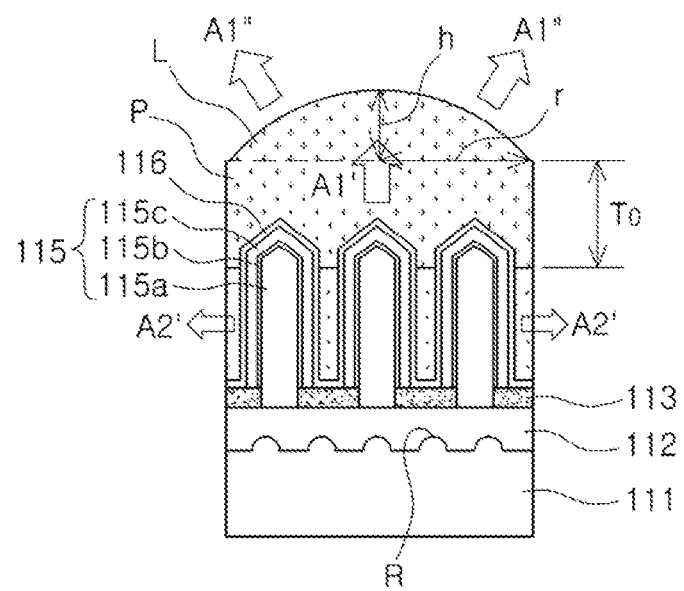

Specifically, as compared with a case in which a light transmissive protective layer 117a' having a single refractive index is as illustrated in FIG. 21A, the light transmissive protective layer 117 used in the present example embodiment illustrated in FIG. 21B may significantly increase the amount of light extracted in the upward direction. That is, as illustrated in FIG. 21B, the amount of light travelling laterally (see A2->A2') may be reduced by disposing the first light transmissive portion 117a having a relatively low refractive index in the space between the light emitting nanostructures 115, and the amount of light travelling upwardly (see A1->A1') may be significantly increased by disposing the second light transmissive portion 117b having a relatively high refractive index on the upper portions of the light emitting nanostructures 115. In addition, by disposing the lenses L on a light emitting surface, the light (see A1") may be effectively extracted. By reducing the amount of light travelling laterally and effectively extracting the light in the upward direction, the light extraction efficiency may be significantly improved in the desired upward direction.

In comparison with the protective layer of FIG. 21B including the first and second light transmissive portions, the first light transmissive portion 117a is only depicted as a light transmissive portion having a single refractive index in FIG. 21A by way of example, but even when only the second light transmissive portion 117b is used, the above-mentioned result may be obtained.

In addition, the light travelling upwardly may be effectively extracted by using the arrangement of the lenses L, and the angle of light may be adjusted by using the shape and arrangement of the lenses L to thereby obtain a desired radiation pattern.

Figure 22:
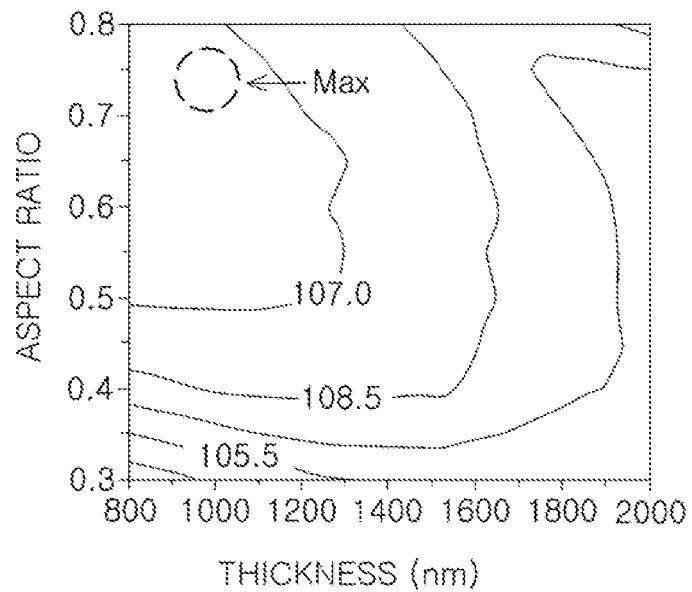
FIG. 22 is a graph illustrating changes in light extraction efficiency according to an aspect ratio of a lens and a thickness of a plate.

In order to determine the effect of the second light transmissive portion 117b used in the present example embodiment, changes in light extraction efficiency according to an aspect ratio of the lens L and a thickness $T_0$ of the plate P were measured, and the measurement results are provided in a graph of FIG. 22. Here, the aspect ratio of the lens L is defined as a ratio of a height h of the lens L to a radius r of the lens L, as illustrated in FIG. 21B. Light extraction efficiency in FIG. 22 is illustrated as an improved value as compared with the case of FIG. 21A in which the light transmissive protective layer 117a' having a relatively low refractive index is used.

As illustrated in FIG. 22, it can be seen that as the aspect ratio of the lens L was increased to a desired, or alternatively predetermined level (e.g. aspect ratio: approximately 0.9 or lower), light extraction efficiency was improved. On the other hand, the thickness $T_0$ of the plate P was reduced under desired, or alternatively predetermined aspect ratio conditions. For example, in a section in which the thickness $T_0$ of the plate P was approximately 1300 nm or less and the aspect ratio of the lens L was approximately 0.5 or higher, light extraction efficiency was improved by approximately 7%, and in a section indicated by Max, light extraction efficiency was improved by 7% or greater.

As described above, the light emitting nanostructures 115 may include GaN having a refractive index of approximately 2.4. In this case, the second light transmissive portion 117b disposed on the upper portions of the light emitting nanostructures 115 may be formed of or include a material having the second refractive index (approximately 1.7 to 3) similar to the refractive index of the light emitting nanostructures 115, and the first light transmissive portion 117a disposed on the side surfaces of the light emitting nanostructures 115 may be formed of or include a material having the first refractive index (approximately 1.5 or below) lower than the second refractive index. In other words, the first refractive index may be lower than the refractive index of the light emitting nanostructures and a difference between the first refractive index and the second refractive index may be equal to or greater than 0.2. In some embodiments, the first light transmissive portion 117a may contain air, instead of being formed as any material layer.

The refractive indices of the materials forming the first light transmissive portion 117a and the second light transmissive portion 117b may be determined in consideration of the refractive index of the light emitting nanostructures 115. The refractive index of the second light transmissive portion 117b may be determined according to the refractive index of the first light transmissive portion 117a. In a case in which the refractive index of the first light transmissive portion 117a is approximately 1.5 or lower, the refractive index of the second light transmissive portion 117b may be approximately 1.7 or higher. As in the present example embodiment, the lenses L as well as the plate P may also be formed of or include the same material.

In order to improve light extraction efficiency in an upward direction, the refractive index of the second light transmissive portion 117b may be closer to the refractive index of the light emitting nanostructure 115 rather than the refractive index of the first light transmissive portion 117a, or may be higher than the refractive index of the light emitting nanostructure 115. For example, similar to the preceding example embodiments, the second light transmissive portion 117b may be formed of or include at least one of $TiO_2$ (2.8), SiC (2.69), ZnO (2.1), $ZrO_2$ (2.23), ZnS (2.66), SiN (2.05), $HfO_2$ (1.95) and diamond (2.44) (numbers in parentheses indicating refractive indices (@450 nm)). For example, in a case in which the refractive index of the light emitting nanostructure 115 formed of or including GaN is approximately 2.4, the refractive index of the second light transmissive portion 117b may be equal to or higher than 1.9, preferably, 2.0.

As described above, the light travelling upwardly may be effectively extracted by using the lenses L along with the multilayer structure having different refractive indices, and the angle of light may be adjusted by using the shape and arrangement of the lenses L, thereby obtaining a desired radiation pattern. To this end, the lenses usable in example embodiments may be variously modified.

Figure 23:
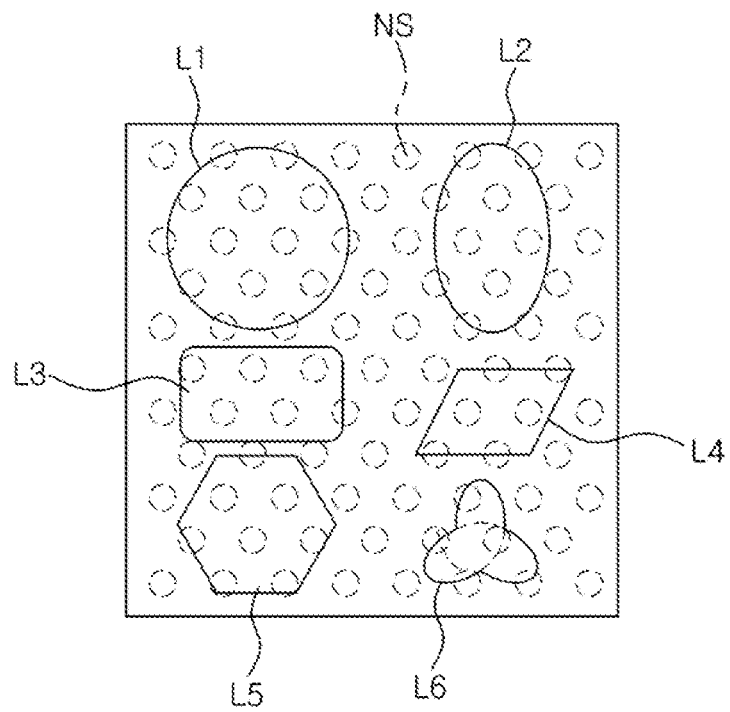
FIG. 23 is a plan view illustrating various shapes of lenses usable in example embodiments.

FIG. 23 is a plan view illustrating that lenses having various shapes usable in example embodiments are arranged on an upper surface of a nanostructure semiconductor light emitting device.

As illustrated in FIG. 23, the lenses may be circular L1, oval L2, and polygonal when viewed from above. For example, such polygonal lenses may be quadrangular L3, parallelogrammic L4, and hexagonal L5. In addition, the lenses may have a complex shape as indicated by L6.

Figure 24A:
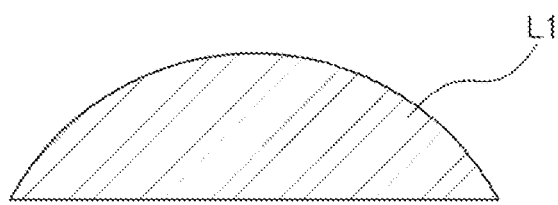
FIGS. 24A and 24B are cross-sectional views illustrating various shapes of lenses usable in example embodiments.
Figure 24B:

FIGS. 24A and 24B are cross-sectional views illustrating various shapes of lenses usable in example embodiments. The overall surface of a convex lens L1 illustrated in FIG. 24A may have a degree of curvature. Alternatively, a convex lens L2 illustrated in FIG. 24B may have an upper flat surface. That is, the shape of the convex lens L2 illustrated in FIG. 24B may be obtained by cutting an upper portion of the convex lens L1 illustrated in FIG. 24A.

As described above, the lenses usable in the example embodiments may have various shapes. Here, the size of the lens is illustrated as corresponding to a plurality of light emitting nanostructures NS, but is not limited thereto, and the size of the lens may correspond to a single light emitting nanostructure NS (see FIGS. 27 and 30).

FIGS. 25A through 25D are cross-sectional views illustrating sequential processes in a method of manufacturing the nanostructure semiconductor light emitting device of FIG. 19.

Figure 25A:
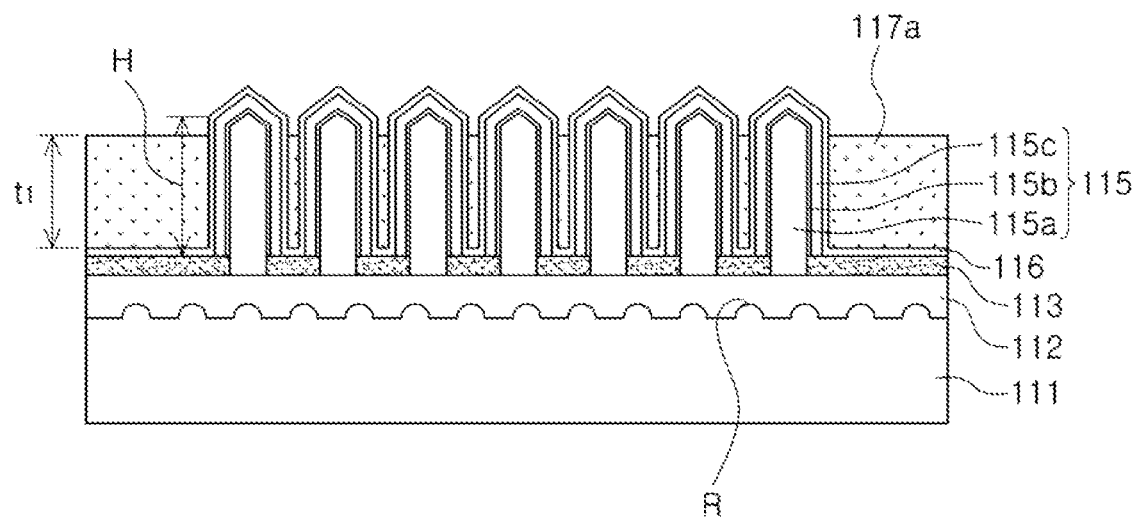
FIGS. 25A through 25D are cross-sectional views illustrating sequential processes in a method of manufacturing the nanostructure semiconductor light emitting device of FIG. 19.

FIG. 25A illustrates the light emitting nanostructures 115 provided with the first light transmissive part 117a. The structure illustrated in FIG. 25A may be understood to correspond to the structure illustrated in FIG. 5D, which is obtained through the processes illustrated in FIGS. 5A through 5C. In addition, the light emitting nanostructures 115 used in the present example embodiment may be formed through the processes illustrated in FIGS. 8A through 8E.

The first light transmissive portion 117a may be formed to fill the space between the light emitting nanostructures 115, and a thickness t1 thereof may be appropriately adjusted such that the upper surface thereof is lower than the height of the light emitting nanostructures 115. Therefore, the portions of the light emitting nanostructures 115 which are not covered with the first light transmissive portion 117a may be exposed.

Figure 25B:
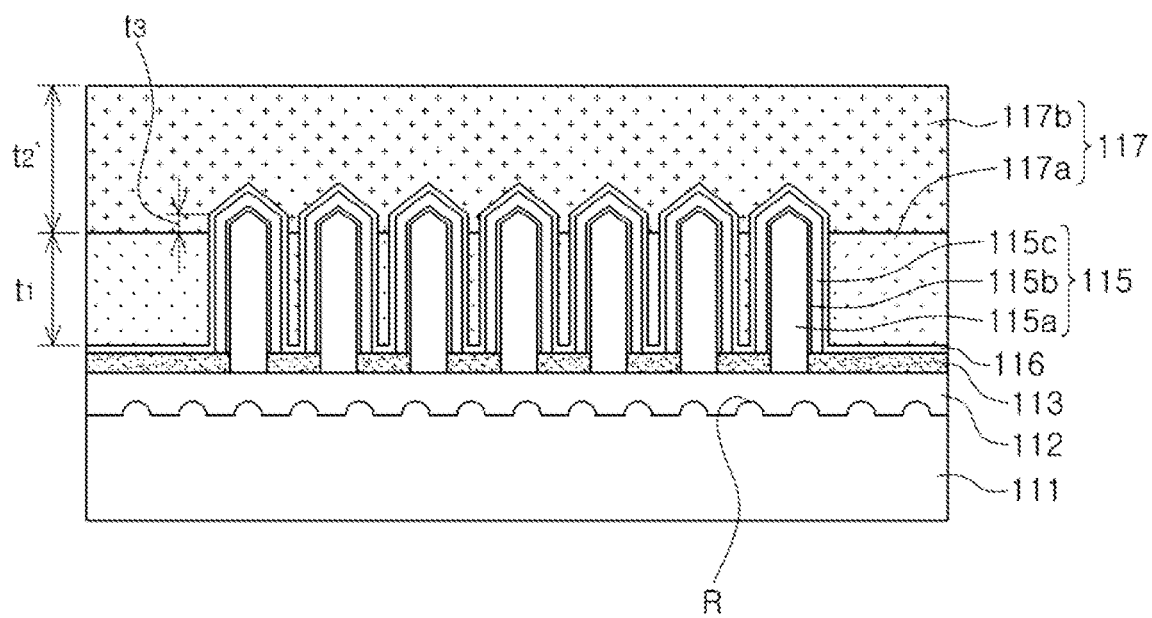

Next, as illustrated in FIG. 25B, the second light transmissive portion 117b may be formed on the first light transmissive portion 117a.

The second light transmissive portion 117b may be disposed on the first light transmissive portion 117a to cover the exposed portions of the light emitting nanostructures 115. In the present process, a thickness t2' of the second light transmissive portion 117b may be determined in consideration of a desired height of the lenses and a thickness of the plate. The thickness t2' of the second light transmissive portion 117b may be equal to or greater than the sum of the desired height of the lenses and the thickness of the plate.

The second light transmissive portion 117b may directly contact the light emitting nanostructures 115 to form an interface therebetween. As in the present example embodiment, the second light transmissive portion 117b may fill the remaining space between the light emitting nanostructures 115. Since the second light transmissive portion 117b contacts the portion of the main portion of the light emitting nanostructure 115, such an arrangement of the second light transmissive portion 117b may allow light generated in the light emitting nanostructures 115 to be increasingly extracted upwardly through the second light transmissive portion 117b. A thickness t3 of the portion of the second light transmissive portion 117b in contact with the main portion of the light emitting nanostructure 115 may be less than 50% of a height H of the main portion of the light emitting nanostructure 115.

The second light transmissive portion 117b may be formed by a deposition process such as a chemical vapor deposition (CVD) process, a physical vapor deposition (PVD) process, or the like. The refractive index of the second light transmissive portion 117b may be higher than the refractive index of the first light transmissive portion 117a. The refractive index of the second light transmissive portion 117b may be determined depending on the refractive index of the first light transmissive portion 117a. In a case in which the refractive index of the first light transmissive portion 117a is equal to or lower than approximately 1.5, the refractive index of the second light transmissive portion 117b may be equal to or higher than approximately 1.7.

Then, the plurality of lenses L may be formed to be arranged on the light emitting surface of the second light transmissive portion 117b. The forming of the lenses in the present example embodiment may be performed through a dry etching process using a photoresist pattern PR as illustrated in FIGS. 25C and 25D.

Figure 25C:
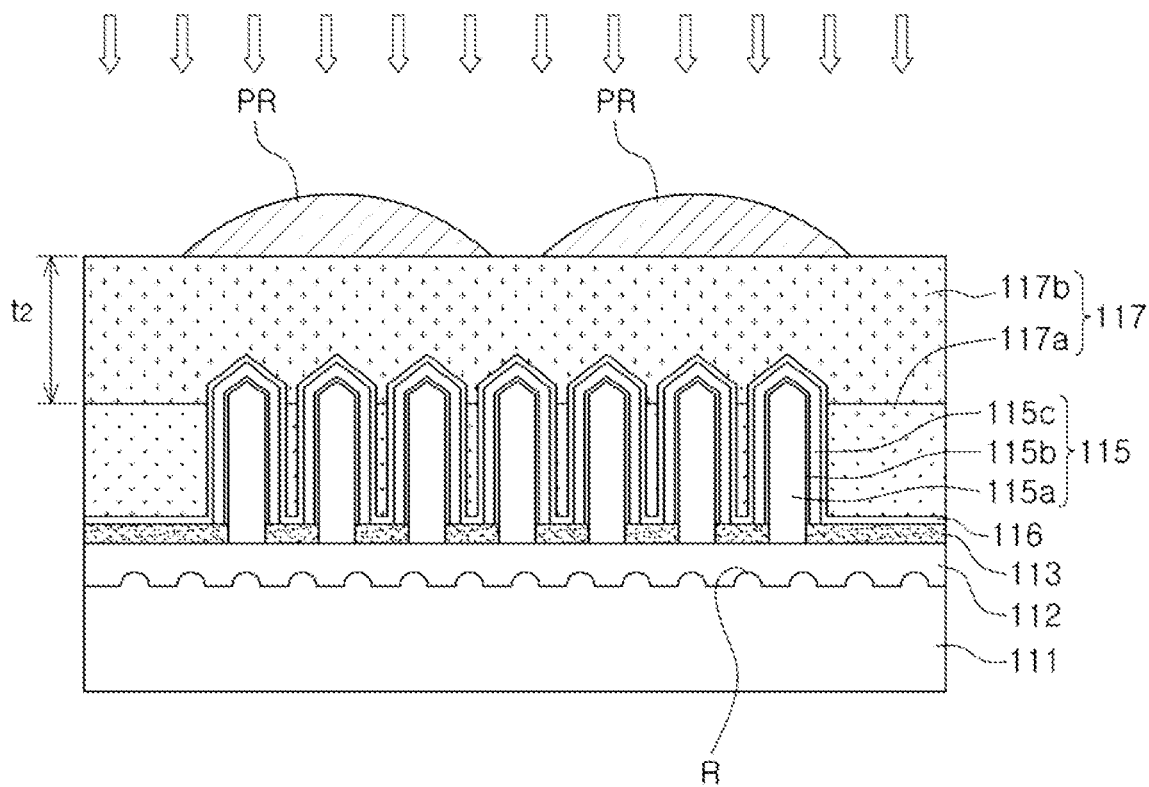
Figure 25D:
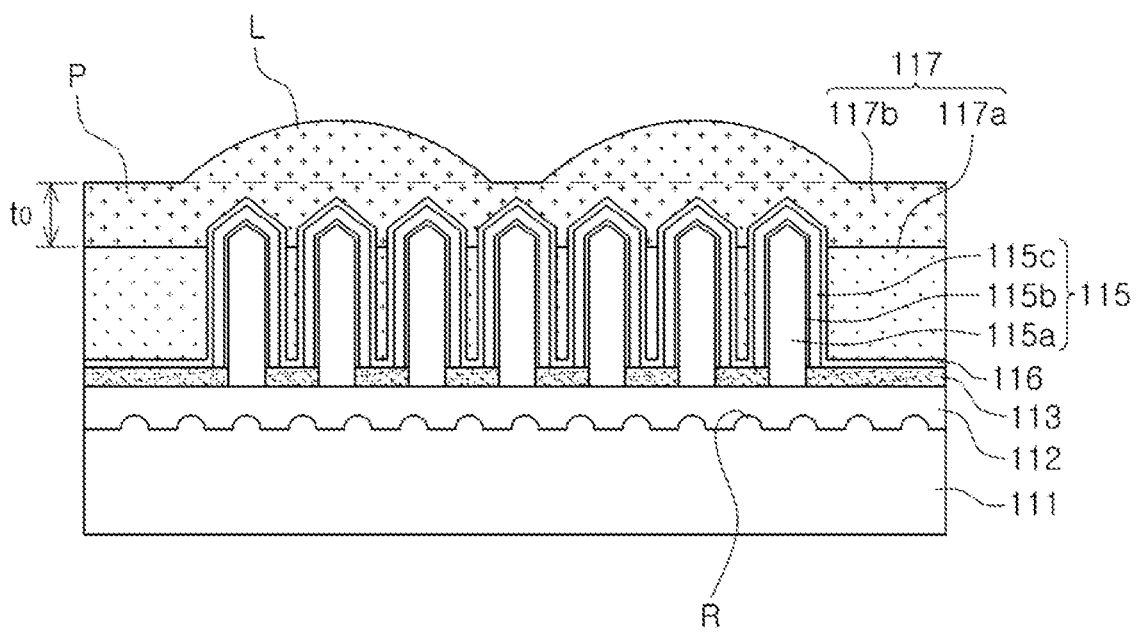

As illustrated in FIG. 25C, the photoresist pattern PR having a desired lens shape may be formed on the second light transmissive portion 117b, and the second light transmissive portion 117b may be dry-etched using the photoresist pattern PR. The photoresist pattern PR having a desired lens shape may be obtained by forming a primary photoresist pattern using a lithography process and subsequently performing a heat treatment and a reflow process on the formed pattern.

During the dry-etching process, the photoresist pattern PR having a desired lens shape and the exposed portions of the second light transmissive portion 117b may be etched simultaneously such that a plate P has a desired thickness $t_0$. Then, as illustrated in FIG. 25D, the desired lens shape of the photoresist pattern PR may be transferred to the second light transmissive portion 117b, and thus, the desired shaped lenses L may be formed.

Figure 26:
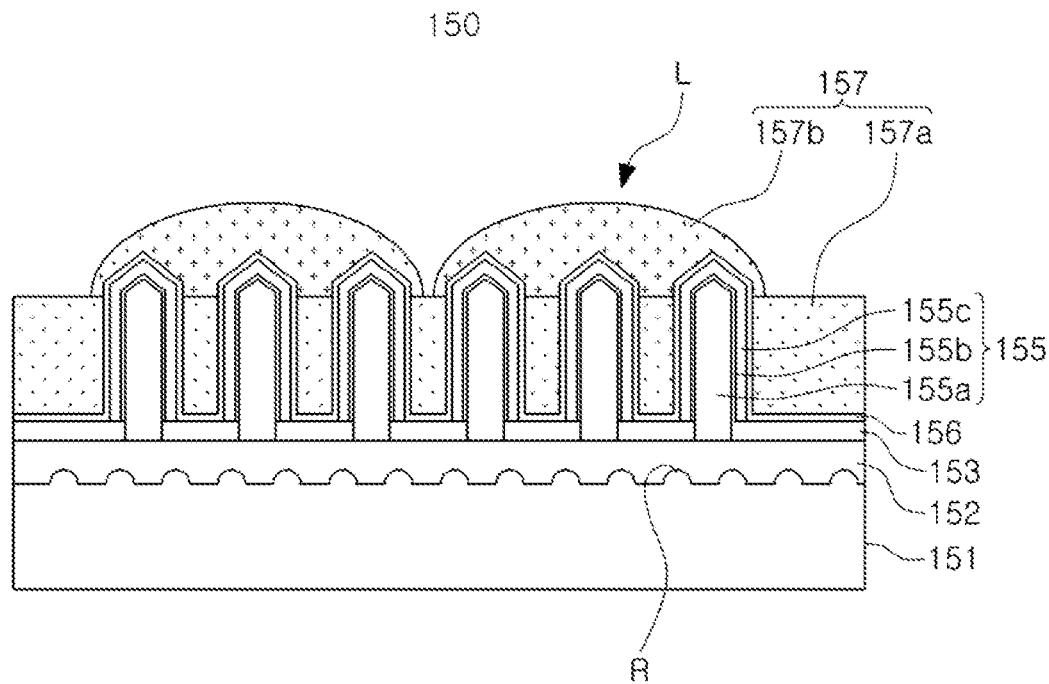
FIGS. 26 through 28 are cross-sectional views of nanostructure semiconductor light emitting devices according to example embodiments.

FIG. 26 is a cross-sectional view of a nanostructure semiconductor light emitting device according to an example embodiment.

A nanostructure semiconductor light emitting device 150 illustrated in FIG. 26 may include a substrate 151 having uneven portions R, a base layer 152 disposed on the substrate 151 and formed of or including a first conductivity-type semiconductor material, and a plurality of light emitting nanostructures 155 disposed on the base layer 152.

An insulating layer 153 having openings may be formed on the base layer 152 and nanocores 155a may be formed on portions of the base layer 152 exposed through the openings. The light emitting nanostructures 155 may each include the nanocore 155a formed of or including a first conductivity-type semiconductor material, and an active layer 155b and a second conductivity-type semiconductor layer 155c sequentially formed on a surface of the nanocore 155a.

A contact electrode 156 may be disposed on the surfaces of the light emitting nanostructures 155 so as to be connected to the second conductivity-type semiconductor layers 155c. The contact electrode 156 used in the present example embodiment may be formed to cover almost the entirety of the second conductivity-type semiconductor layers 155c.

A light transmissive protective layer 157 may include a first light transmissive portion 157a formed of or including a material having a first refractive index and a second light transmissive portion 157b formed of or including a material having a second refractive index higher than the first refractive index. The first light transmissive portion 157a may be formed to fill space between the light emitting nanostructures 155 and the second light transmissive portion 157b may be formed to cover upper portions of the light emitting nanostructures 155.

The second light transmissive portion 157b used in the present example embodiment may be provided as lenses L without a plate. The upper portions of the light emitting nanostructures 155 may be covered with the lenses L, not with the plate. The lenses L may be formed through a dry-etching process using a photoresist pattern, as in the processes of FIGS. 25C and 25D. At this time, by forming the second light transmissive portion 157b to have a relatively reduced thickness, the structure of the lenses without the plate may be obtained.

Figure 27:
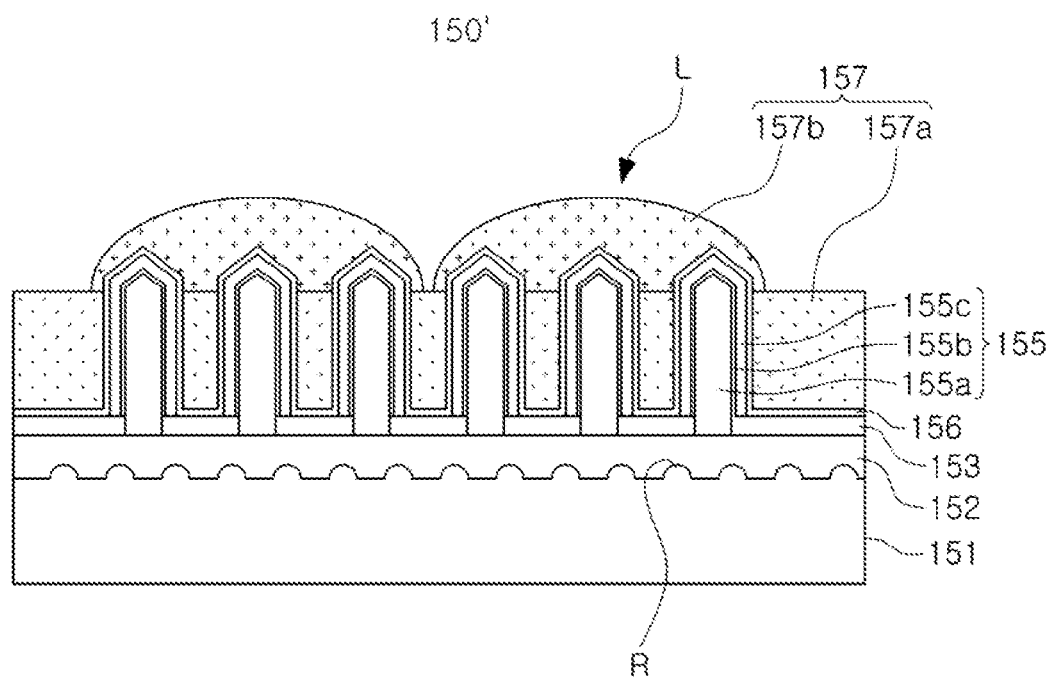

A nanostructure semiconductor light emitting device 150' according to another example embodiment illustrated in FIG. 27 may include a light transmissive protective layer 157'. The light transmissive protective layer 157'may include a second light transmissive portion 157b' provided as a plurality of lenses L corresponding to the plurality of light emitting nanostructures 155, respectively. The plurality of lenses L may have a convex shape while covering the upper portions of the light emitting nanostructures 155. Since a refractive index of the second light transmissive portion 157b' used in the present example embodiment is also higher than the refractive index of the first light transmissive portion 157a, light generated in the light emitting nanostructures 155 maybe effectively extracted through the second light transmissive portion 157b'.

Figure 28:
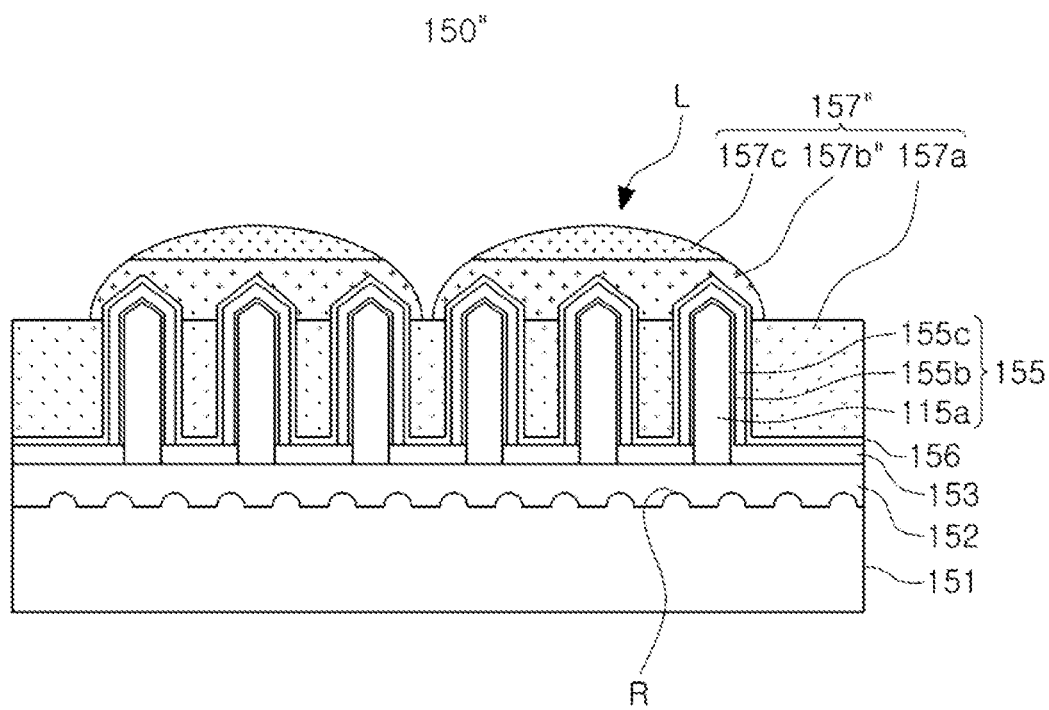

A nanostructure semiconductor light emitting device 150" according to another example embodiment illustrated in FIG. 28 may include a light transmissive protective layer 157". The light transmissive protective layer 157" may provide lenses L, each of which corresponds to the plurality of light emitting nanostructures 155, as in the structure of FIG. 26, and includes an additional third light transmissive portion 157c in addition to a second light transmissive portion 157b". The second light transmissive portion 157b" may have a shape as illustrated in FIG. 24B, and the third light transmissive portion 157c may be disposed on an upper flat surface of the second light transmissive portion 157b" and may have a convex shape. The second and third light transmissive portions 157b" and 157c may be formed of or include two light transmissive materials having different refractive indices. For example, a refractive index of the second light transmissive portion 157b" may be higher than the refractive index of the first light transmissive portion 157a, but may be lower than the refractive index of the third light transmissive portion 157c. The lens L may be obtained by stacking two light transmissive material layers having different refractive indices and dry-etching the stacked layers using a photoresist pattern.

FIGS. 29 through 33 illustrate the effect of additionally improving light extraction efficiency by removing portions of contact electrodes according to example embodiments.

Figure 29:
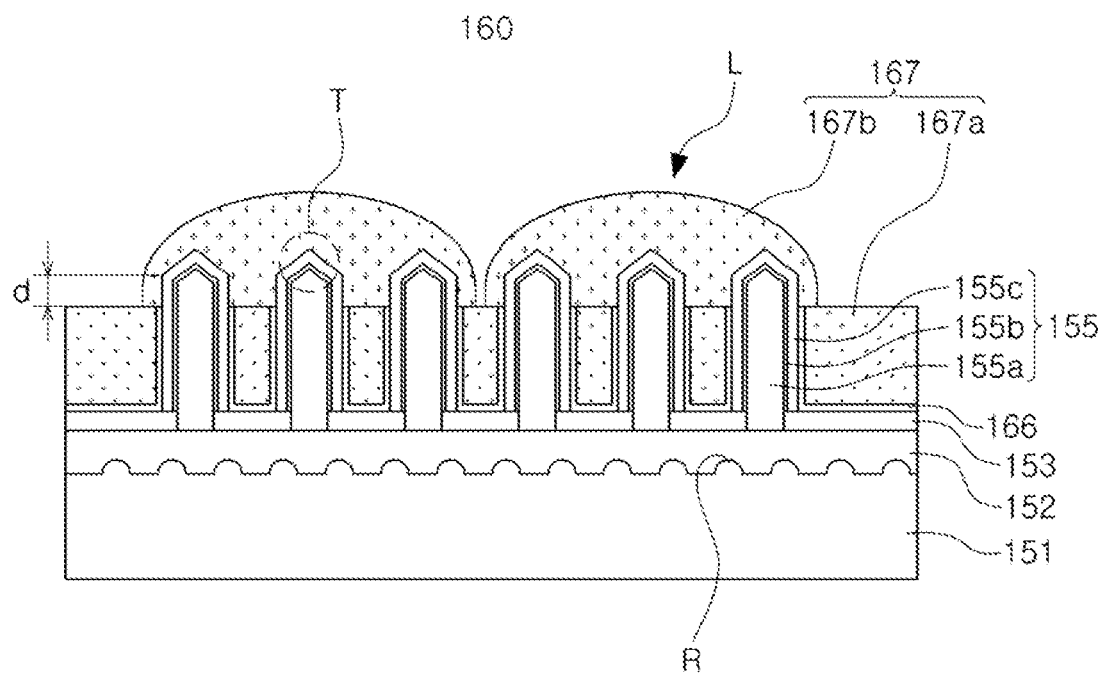
FIGS. 29 through 33 are cross-sectional views of nanostructure semiconductor light emitting devices having partial contact electrodes according to example embodiments.

A nanostructure semiconductor light emitting device 160 illustrated in FIG. 29 may include a light transmissive protective layer 167 similar to the light transmissive protective layer 157 illustrated in FIG. 26.

The light transmissive protective layer 167 may include a first light transmissive portion 167a and a second light transmissive portion 167b disposed on the first light transmissive portion 167a and provided as lenses L covering the plurality of light emitting nanostructures 155. However, unlike the preceding example embodiments, a contact electrode 166 may be disposed on portions of the light emitting nanostructures 155 except for tip portions T thereof and portions of sides surfaces thereof extended from the tip portions.

Even when the contact electrode 166 is formed of or include a transparent electrode material such as ITO, loss of light may occur while passing through the contact electrode 166, resulting in a deterioration of light extraction efficiency.

In the present example embodiment, light emitted from the upper portions of the light emitting nanostructures 155 covered with the second light transmissive portion 167b may be directly introduced into the second light transmissive portion 167b having a relatively high refractive index without passing through the contact electrode 166, and thus the loss of light that maybe caused by the contact electrode 166 may be prevented. The effect of improving light extraction efficiency resulting from the removal of the portions of the contact electrode 166 will be described with reference to FIG. 34.

Figure 34:
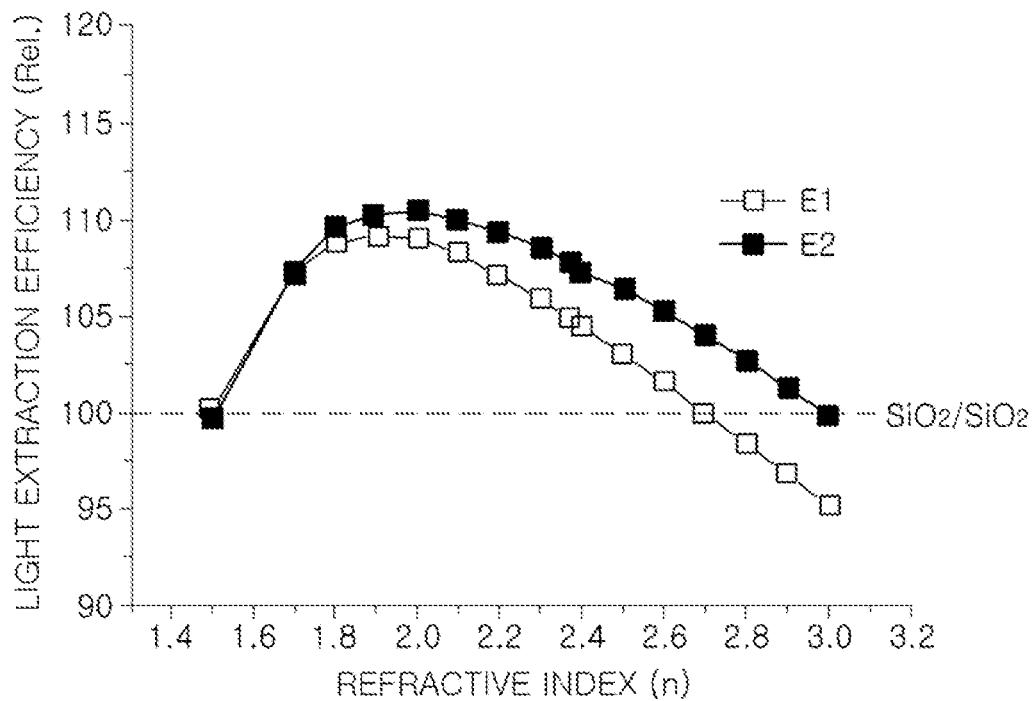
FIG. 34 is a graph illustrating the effect of improving light extraction efficiency according to use of a partial contact electrode.

FIG. 34 is a graph illustrating comparison results obtained by measuring light extraction efficiency between a case E1 in which a contact electrode was entirely deposited and a case E2 in which a partial contact electrode from which portions thereof were removed was used.

Specifically, the graph of FIG. 34 illustrates changes in light extraction efficiency as a refractive index n of the second light transmissive portion of each case was increased, with the same condition in which the first light transmissive portion was formed of or included $SiO_2$ (refractive index: 1.46). Here, a reference value (100%) refers to light extraction efficiency measured when the first and second light transmissive portions were formed of or included $SiO_2$.

With reference to FIG. 34, it can be seen that in the case E1 in which the contact electrode was entirely deposited, light extraction efficiency was improved by approximately 8%, and in the case E2 in which the portions of the contact electrode in contact with the second light transmissive portion were removed, light extraction efficiency was improved by approximately 10% to 12% (where n ranges from 1.8 to 2.2).

Meanwhile, as described in the preceding example embodiments, light extraction efficiency in the example embodiment of FIG. 29 may be further improved by increasing a thickness d of the portion of the second light transmissive portion 167b in contact with the main portion of the light emitting nanostructure 155 within an appropriate range (less than 50% of the height of the main portion of the light emitting nanostructure 155).

The selective removal of the contact electrode may be performed by depositing the contact electrode on the entirety of the light emitting nanostructures 155, forming the first light transmissive portion in the space between the light emitting nanostructures 155, and performing an etch-back process on the contact electrode along with the first light transmissive portion. During the etch-back process, the first light transmissive portion 167a and the contact electrode 166 may have the same level and the upper portions of the light emitting nanostructures 155 higher than the level may be exposed. Then, the second light transmissive portion 167b may be formed thereon, and thus, the structure illustrated in FIG. 29 may be obtained.

Figure 30:
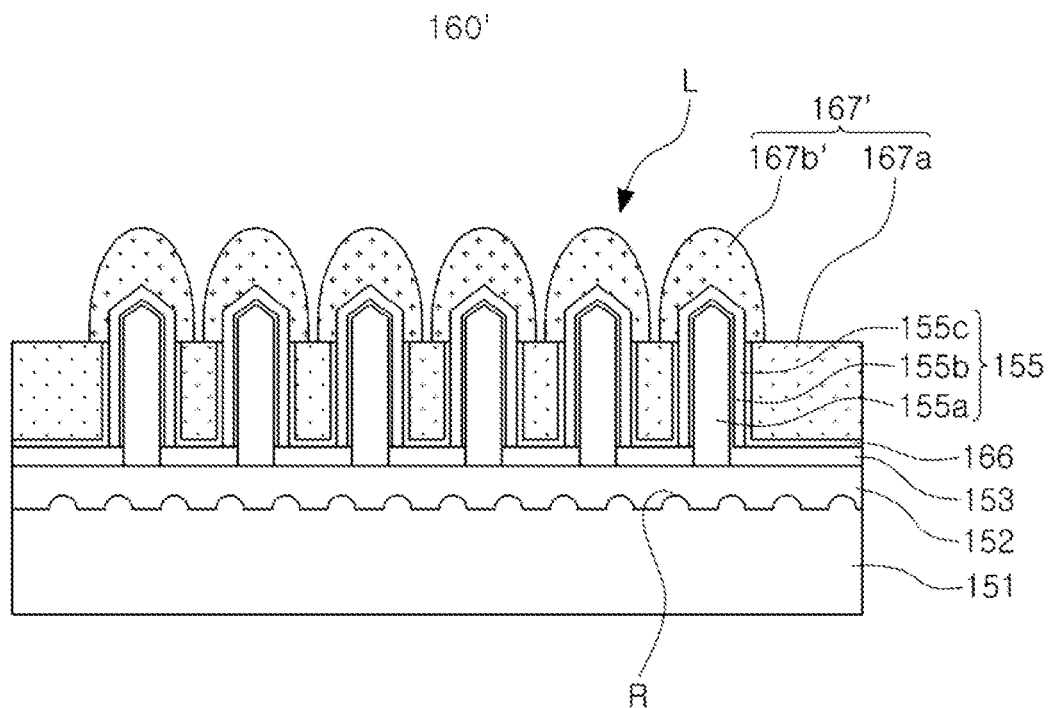

A nanostructure semiconductor light emitting device 160' illustrated in FIG. 30 may include a light transmissive protective layer 167' similar to the light transmissive protective layer 157' illustrated in FIG. 27. The light transmissive protective layer 167'may include a second light transmissive portion 167b' provided as a plurality of lenses L corresponding to the plurality of light emitting nanostructures 155, respectively. In the present example embodiment, light emitted from the upper portions of the light emitting nanostructures 155 covered with the second light transmissive portion 167b' may be directly introduced into the second light transmissive portion 167b' having a relatively high refractive index without passing through the contact electrode 166, and thus the loss of light that may be caused by the contact electrode 166 may be prevented.

Figure 31:
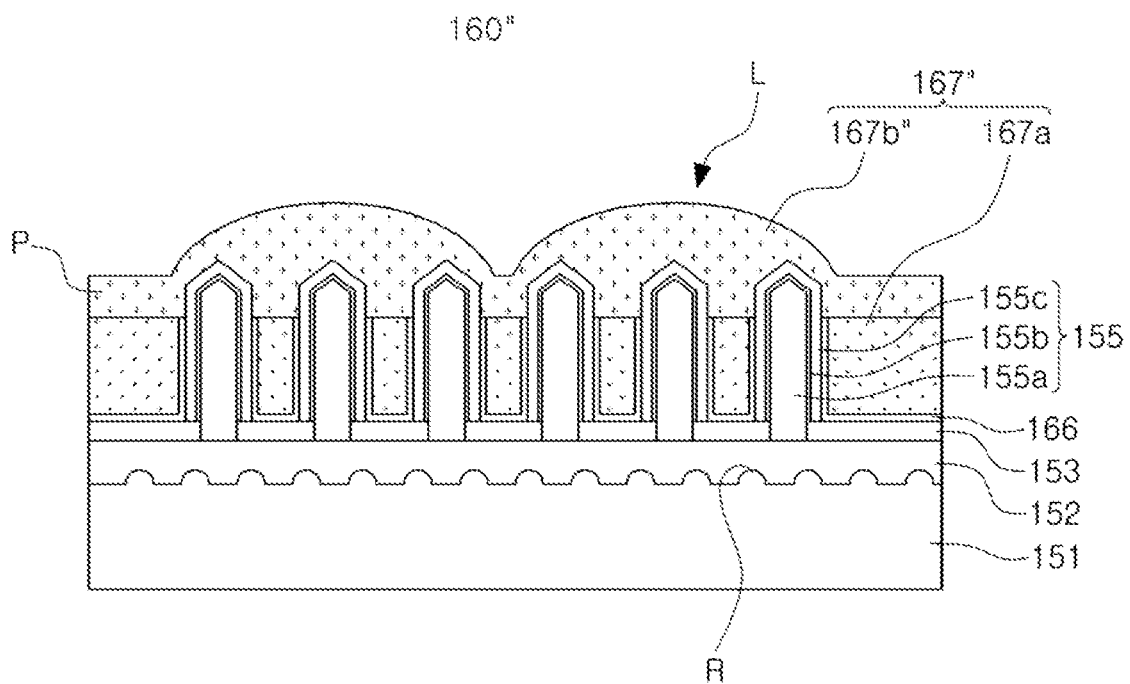

A nanostructure semiconductor light emitting device 160" illustrated in FIG. 31 may include a light transmissive protective layer 167" similar to the light transmissive protective layer 117 illustrated in FIG. 20. A second light transmissive portion 167b" of the light transmissive protective layer 167" may include a plate P and a plurality of lenses disposed on the plate. Each of the lenses may correspond to the plurality of light emitting nanostructures 155. In the present example embodiment, light emitted from the upper portions of the light emitting nanostructures 155 covered with the second light transmissive portion 167b" may be directly introduced into the second light transmissive portion 167b" having a relatively high refractive index without passing through the contact electrode 166, and thus the loss of light that maybe caused by the contact electrode 166 may be prevented.

In the preceding example embodiments, the etch-back process may be performed on the first light transmissive portion and the contact electrode simultaneously, such that the first light transmissive portion and the contact electrode have substantially the same level. On the contrary, in another example embodiment, the first light transmissive portion and the contact electrode may have different levels. This embodiment will be described by using a nanostructure semiconductor light emitting device 190 illustrated in FIG. 32.

Figure 32:
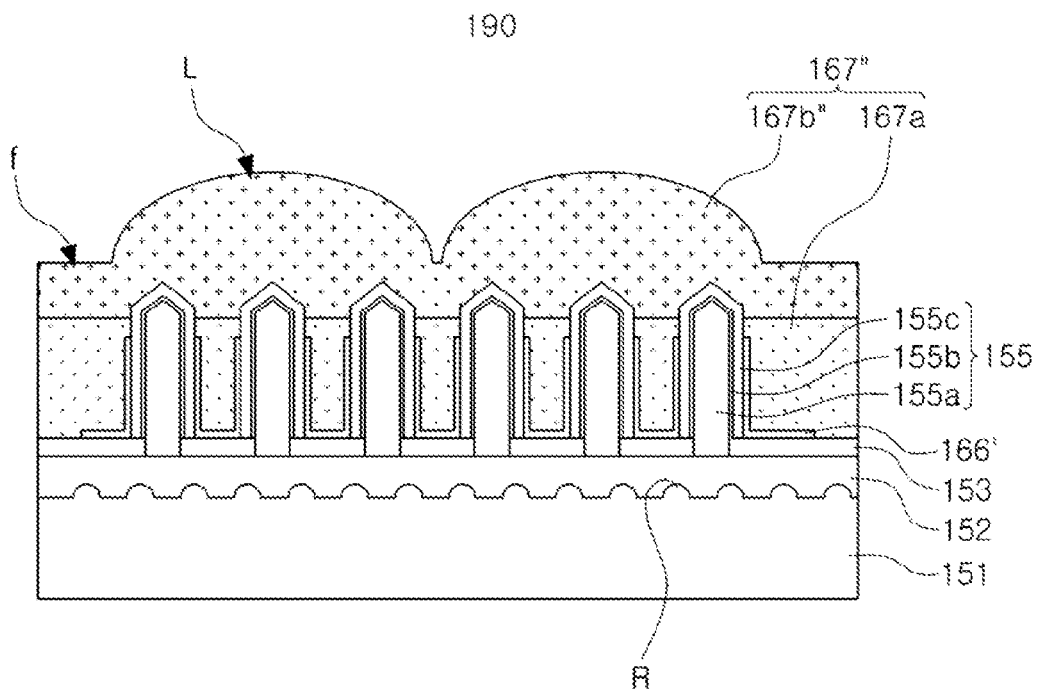

With reference to FIG. 32, a contact electrode 166' may be partially removed to expose the upper portions of the light emitting nanostructures 155 similar to the preceding example embodiments, but the contact electrode 166' and the first light transmissive portion 167a may have different levels unlike the embodiments illustrated in FIGS. 29 and 30. That is, as illustrated in FIG. 32, the top of the contact electrode 166' may be lower than the upper surface of the first light transmissive portion 167a. Such a structure may be obtained by partially removing the contact electrode 166' prior to forming the first light transmissive portion 167a, and then forming the first light transmissive portion 167a while allowing the upper surface of the first light transmissive portion 167a and the top of the contact electrode 166' to have different levels. On the contrary, in some embodiments, the first light transmissive portion may be formed to be lower than the top of the contact electrode.

In addition, the structure of the contact electrode may be variously modified by using a method of forming the first light transmissive portion. This embodiment will be described by using a nanostructure semiconductor light emitting device 190' illustrated in FIG. 33.

Figure 33:
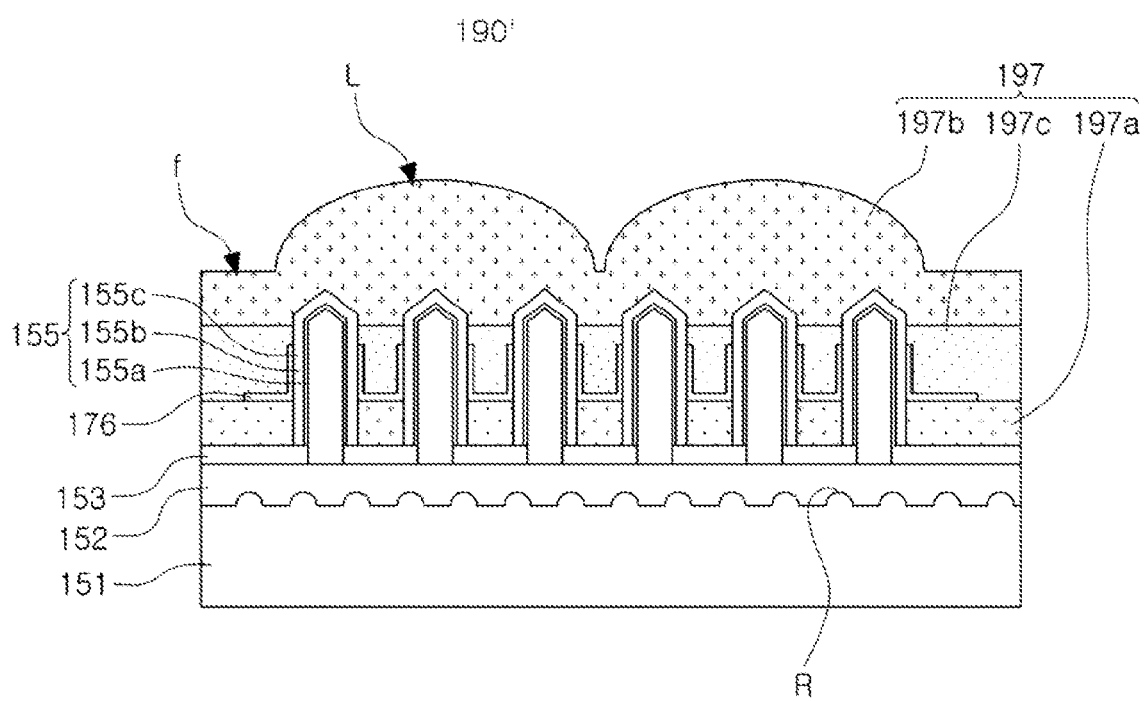

With reference to FIG. 33, a first light transmissive portion 197a and a contact electrode 176 which is partially removed may have different levels similar to the embodiment illustrated in FIG. 32, but the contact electrode 176 may be disposed on a portion (namely, the first light transmissive portion 197a) of a light transmissive protective layer 197 unlike the preceding example embodiments. Such a structure according to the present example embodiment may be obtained through processes to be described below. After the first light transmissive portion 197a is formed, the contact electrode 176 may be formed on an upper surface of the first light transmissive portion 197a to be in contact with the surfaces of the light emitting nanostructures 155. Upper portions of the contact electrode 176 may be removed, and an additional light transmissive portion 197c may be formed prior to forming a second light transmissive portion 197b. In the present example embodiment, the additional light transmissive portion 197c may be formed while allowing the portions of the light emitting nanostructures 155 to remain exposed. Subsequently, the second light transmissive portion 197b having lenses L may be formed on the partially removed contact electrode 176, In the present example embodiment, a contact area between the additional light transmissive portion 197c and the light emitting nanostructures 155 may be appropriately adjusted by using a height of the first light transmissive portion 197a and/or a removed area of the contact electrode 176.

In addition, a refractive index of the additional light transmissive portion 197c may be adjusted as necessary. For example, the refractive index of the additional light transmissive portion 197c may be between a refractive index of the first light transmissive portion 197a and a refractive index of the second light transmissive portion 197b. Alternatively, the refractive index of the additional light transmissive portion 197c may be substantially the same as that of the first light transmissive portion 197a.

Figure 35:
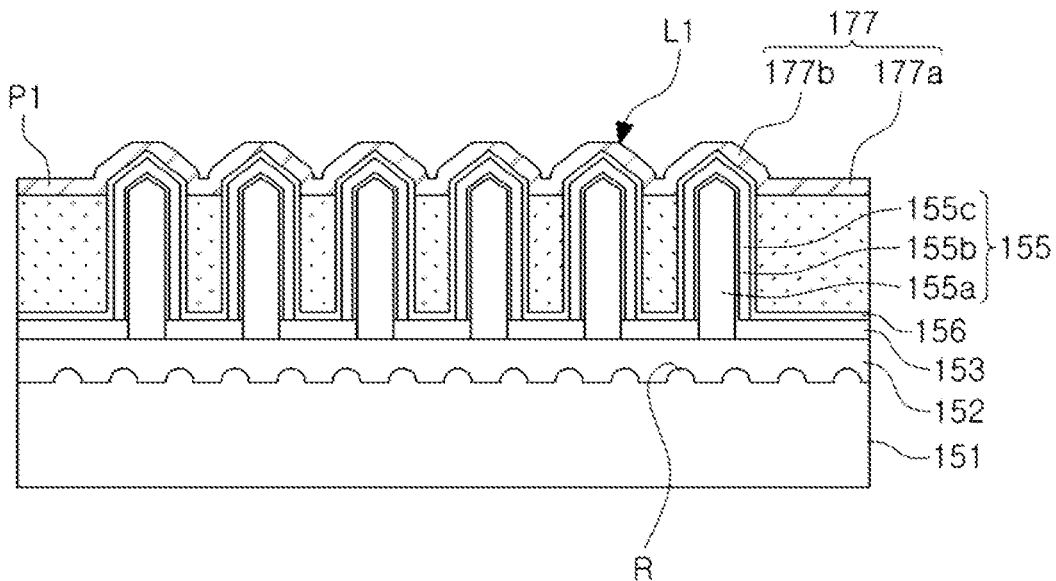
FIGS. 35 through 37 are cross-sectional views of nanostructure semiconductor light emitting devices having lenses, which are naturally formed, according to example embodiments.
Figure 36:
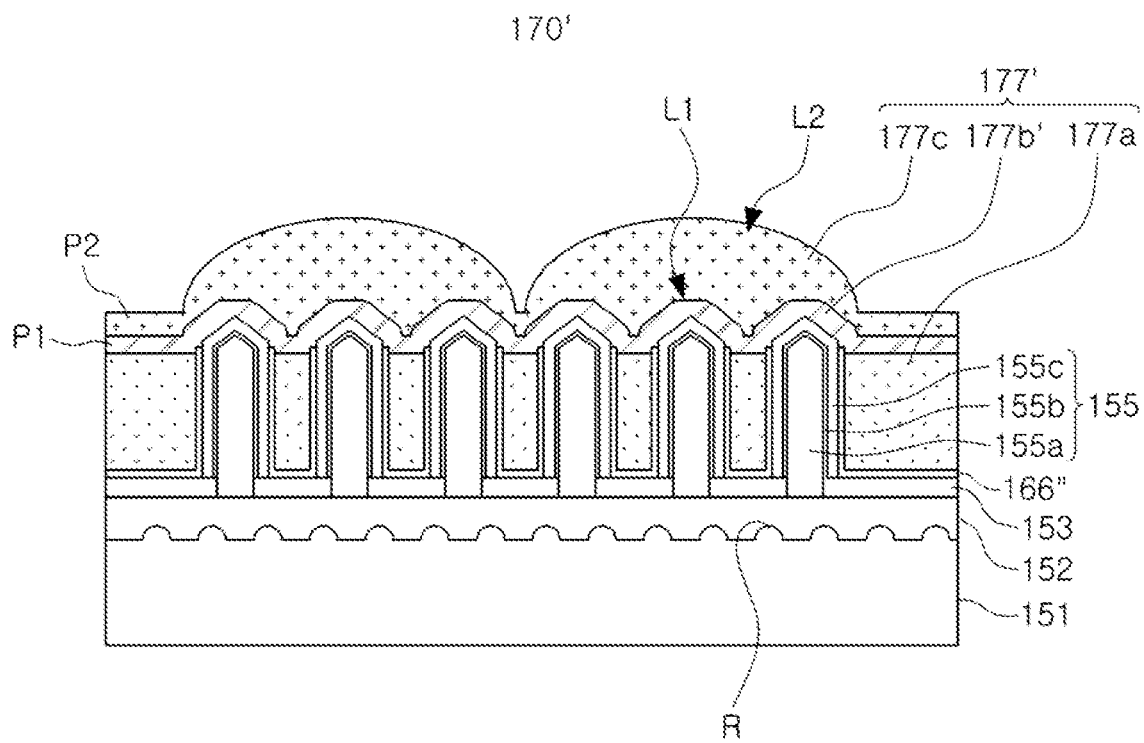
Figure 37:
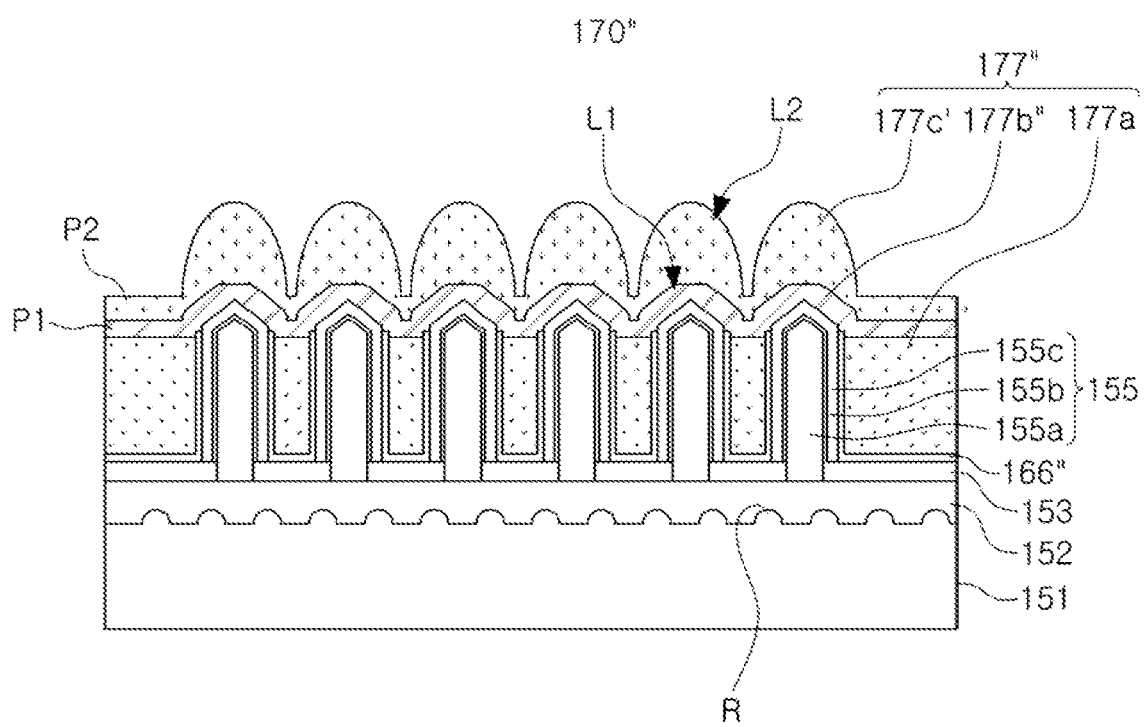

FIGS. 35 through 37 illustrate various examples of lenses that may be formed using a deposition process.

A nanostructure semiconductor light emitting device 170 illustrated in FIG. 35 may include a light transmissive protective layer 177 having a first light transmissive portion 177a and a second light transmissive portion 177b disposed on the first light transmissive portion 177a. Unlike the preceding example embodiments, the second light transmissive portion 177b may be formed by depositing a light transmissive material having a relatively high refractive index on upper portions of the light emitting nanostructures 155 and a surface of the first light transmissive portion 177a.

In the present example embodiment, the upper portions of the light emitting nanostructures 155 may have protruding structures higher than the surface of the first light transmissive portion 177a. In a case in which a material for the second light transmissive portion 177b is uniformly deposited, the second light transmissive portion 177b may have convex lens structures L1 in positions corresponding to the positions of the protruding structures. In addition, the second light transmissive portion 177b may include a plate P1 disposed on the surface of the first light transmissive portion 177a. Since the second light transmissive portion 177b has the convex structures corresponding to the upper portions of the light emitting nanostructures 155 even in the case that a surface thereof is not fully curved, an optical action (e.g., light collecting) similar to a lens may be performed thereby. In addition, additional lithography and etch-back processes are not necessary, and thus the lens structures L1 may be obtained with a simplified process.

A nanostructure semiconductor light emitting device 170' illustrated in FIG. 36 may include a light transmissive protective layer 177' having the first light transmissive portion 177a, a second light transmissive portion 177b' in contact with the upper portions of the light emitting nanostructures 155 from which a contact electrode 166" is partially removed, and an additional third light transmissive portion 177c.

The contact electrode 166" may allow the upper portions of the light emitting nanostructures 155 to be exposed. Unlike the preceding example embodiments, the top of the contact electrode 166" may be higher than the first light transmissive portion 177a. Such a structure may be obtained by removing the upper portion of the contact electrode 166" prior to forming the first light transmissive portion 177a or partially removing the contact electrode 166" along with the first light transmissive portion 177a after forming the first light transmissive portion 177a, wherein an etching rate of the first light transmissive portion 177a is higher than the etching rate of the contact electrode 166".

The third light transmissive portion 177c may be disposed on the second light transmissive portion 177b', and may have an additional lens structure. A refractive index of the first light transmissive portion 177a may be lower than the refractive index of the light emitting nanostructures 155, and a refractive index of the second light transmissive portion 177b' may be higher than the refractive index of the first light transmissive portion 177a. A refractive index of the third light transmissive portion 177c may be higher than the refractive index of the second light transmissive portion 177b'.

Lens structures L1 of the second light transmissive portion 177b' may be disposed to correspond to the light emitting nanostructures 155, respectively, while each of lens structures L2 of the third light transmissive portion 177c may be disposed to correspond to the plurality of light emitting nanostructures 155. Such complex lens structures L1 and L2 may provide various optical paths. The third light transmissive portion 177c may have a plate P2 connecting the lens structures L2 to each other.

A nanostructure semiconductor light emitting device 170" illustrated in FIG. 37 may include a light transmissive protective layer 177" having a third light transmissive portion 177c', in addition to the first light transmissive portion 177a and the second light transmissive portion 177b' similar to the light transmissive portions illustrated in FIG. 36. Unlike the preceding example embodiment, lens structures L2 of the third light transmissive portion 177c' may correspond to the light emitting nanostructures 155, respectively.

Figure 38:
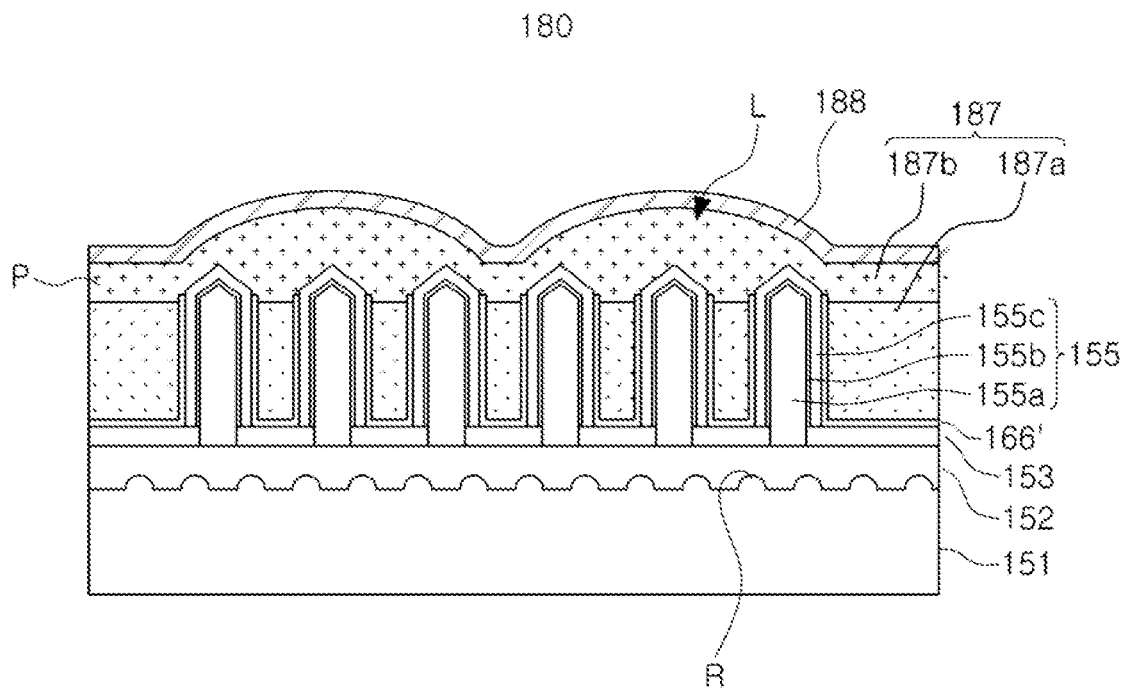
FIGS. 38 and 39 are cross-sectional views of nanostructure semiconductor light emitting devices having anti-reflection films according to example embodiments.
Figure 39:
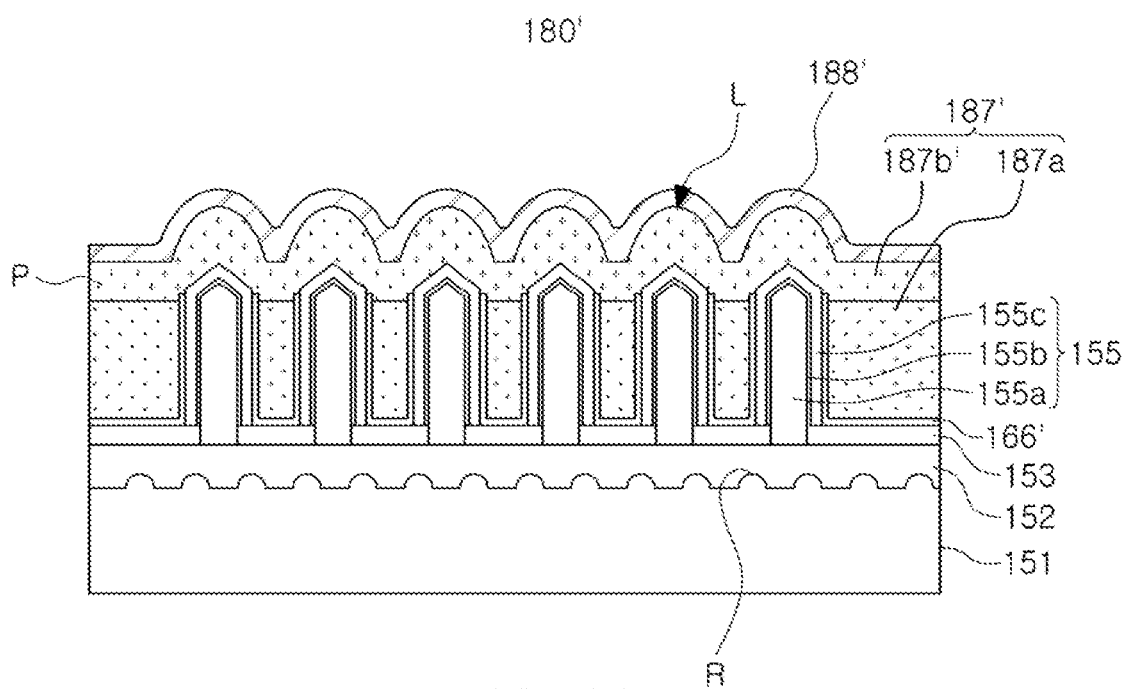

FIGS. 38 and 39 are cross-sectional views of nanostructure semiconductor light emitting devices having anti-reflection films according to example embodiments.

A nanostructure semiconductor light emitting device 180 illustrated in FIG. 38 may include a light transmissive protective layer 187 similar to the layer illustrated in FIG. 31. The light transmissive protective layer 187 may include a first light transmissive portion 187a filling the space between the light emitting nanostructures 155 while exposing the upper portions of the light emitting nanostructures 155, and a second light transmissive portion 187b having a plate P covering the upper portions of the light emitting nanostructures 155 and having a plurality of lenses L arranged on an upper surface of the plate P. An anti-reflection film 188 may be coated on a surface of the second light transmissive portion 187b, thereby further improving light extraction efficiency.

A nanostructure semiconductor light emitting device 180' illustrated in FIG. 39 may include a light transmissive protective layer 187' having the first light transmissive portion 187a and a second light transmissive portion 187b' having lenses L corresponding to the light emitting nanostructures 155, respectively, unlike the preceding example embodiment. The second light transmissive portion 187b' may be disposed on the surface of the first light transmissive portion 187a and may include the plate P connecting the lenses L to each other. An anti-reflection film 188' may be disposed on a surface of the second light transmissive portion 187b'.

Figure 40:
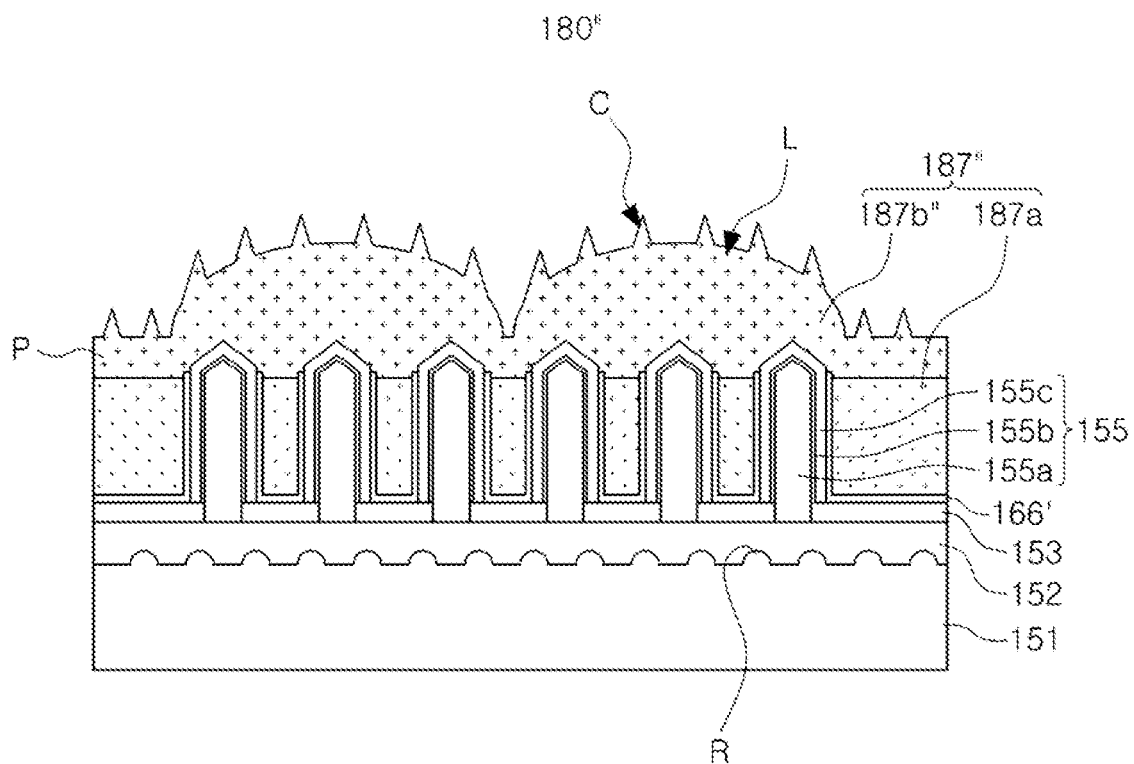
FIG. 40 is a cross-sectional view of a nanostructure semiconductor light emitting device having an uneven structure according to an example embodiment.

FIG. 40 is a cross-sectional view of a nanostructure semiconductor light emitting device having an uneven structure according to an example embodiment.

A nanostructure semiconductor light emitting device 180" illustrated in FIG. 40 may include a light transmissive protective layer 187" having the first light transmissive portion 187a and a second light transmissive portion 187b" disposed on the first light transmissive portion 187a. The second light transmissive portion 187b" may include lenses L, each of which corresponds to the plurality of light emitting nanostructures 155, and the plate on which the lenses are arranged. A surface of the second light transmissive portion 187b" used in the present example embodiment may be provided with uneven portions C. Such uneven portions C may also be employed in the preceding example embodiments. In particular, the uneven portions C may also be provided on an interface between portions having different refractive indices, as well as a light emitting surface. For example, the uneven portions C may also be provided on an interface between the first and second light transmissive portions or an interface between the second and third light transmissive portions in the example embodiments illustrated in FIGS. 33, 36 and 37.

As described above, the light transmissive protective layer may have various structures in example embodiments. The elements described in the preceding example embodiments may be combined with each other to create further example embodiments. For example, the current blocking intermediate layer 34 illustrated in FIG. 8E may be employed in the light emitting nanostructures provided in all the preceding example embodiments to create further example embodiments. These example embodiments based on the above-mentioned combination are within the scope of the present invention.

Figure 41:
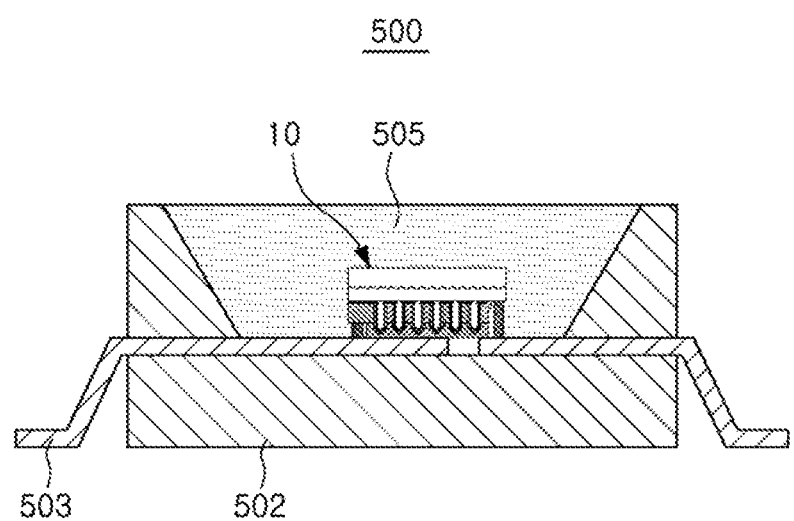
FIGS. 41 through 43 illustrate examples of a semiconductor light emitting device package to which a nanostructure semiconductor light emitting device according to an example embodiment is applied.
Figure 42:
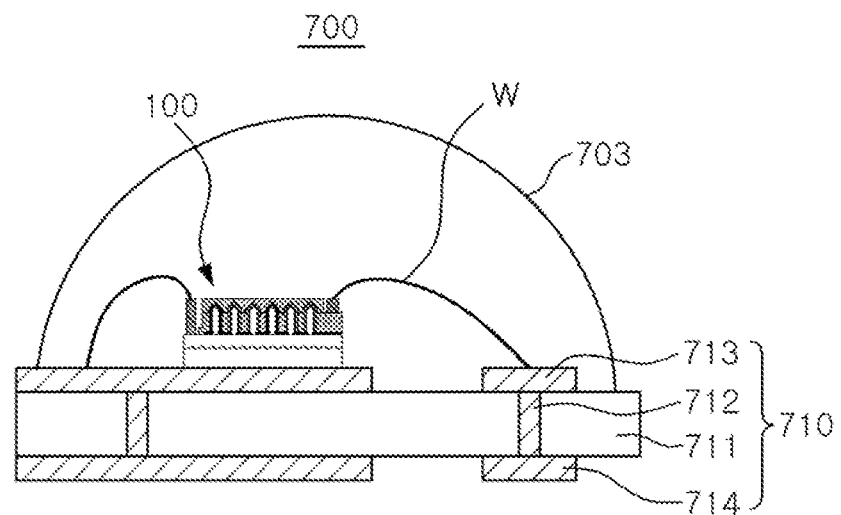

FIGS. 41 and 42 illustrate examples of a semiconductor light emitting device package to which a nanostructure semiconductor light emitting device according to an example embodiment is applied.

A semiconductor light emitting device package 500 illustrated in FIG. 41 may include the nanostructure semiconductor light emitting device 10 of FIG. 1, a package body 502, and a pair of lead frames 503.

The nanostructure semiconductor light emitting device 10 may be mounted on the pair of lead frames 503 and electrodes thereof may be electrically connected to the pair of lead frames 503. As necessary, the nanostructure semiconductor light emitting device 10 may be mounted on a different region, for example, on the package body 502, rather than on the pair of lead frames 503. Also, the package body 502 may have a cup shape to improve reflectivity efficiency of light. An encapsulation body 505 formed of or including a light-transmissive material may be formed in the reflective cup to encapsulate the nanostructure semiconductor light emitting device 10, a wire, and the like.

A semiconductor light emitting device package 600 illustrated in FIG. 42 may include the nanostructure semiconductor light emitting device 10 of FIG. 1, a mounting board 610, and an encapsulation body 603.

The nanostructure semiconductor light emitting device 10 may be mounted on the mounting board 610 and electrically connected to the mounting board 610 through a wire W.

The mounting board 610 may include a body 611, an upper electrode 613, a lower electrode 614, and a through electrode 612 connecting the upper electrode 613 and the lower electrode 614. The mounting board 610 may be provided as a board such as a printed circuit board (PCB), a metal core printed circuit board (MCPCB), a metal printed circuit board (MPCB), a flexible printed circuit board (FPCB), or the like, and the structure of the mounting board 610 may be modified to have various forms.

The encapsulation body 603 may be formed to have a lens structure of which an upper surface has a convex dome shape. However, according to example embodiments, the encapsulation body 603 may have a lens structure having a convex or concave surface to adjust an angle of light emitted through the upper surface of the encapsulation body 603. As necessary, a wavelength conversion material such as a phosphor, a quantum dot, or the like, may be disposed on a surface of the encapsulation body 603 or the nanostructure semiconductor light emitting device 10.

Figure 43:
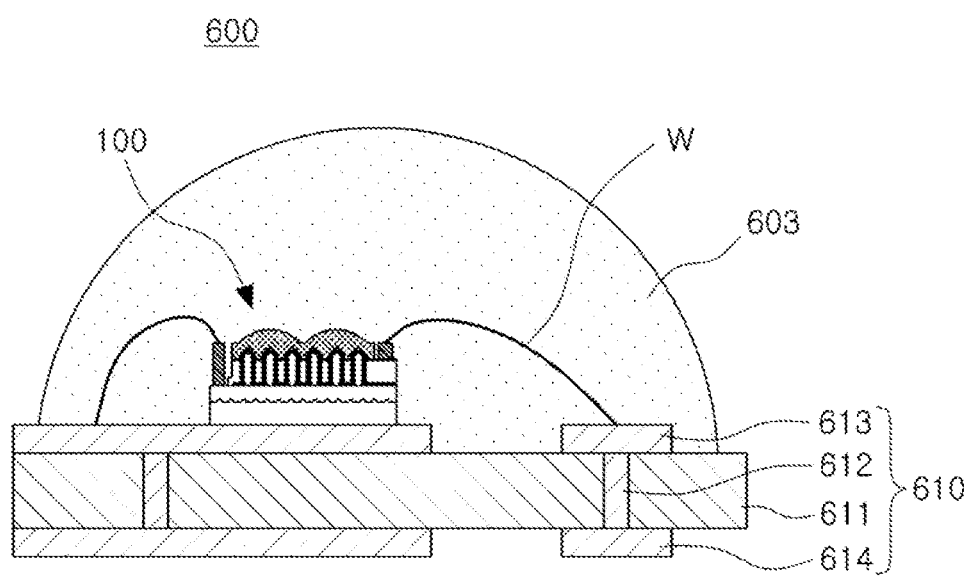

FIG. 43 illustrates an example of a semiconductor light emitting device package to which a nanostructure semiconductor light emitting device according to an example embodiment is applied.

A semiconductor light emitting device package 700 illustrated in FIG. 43 may include the nanostructure semiconductor light emitting device 100 of FIG. 19, a mounting board 710, and an encapsulation body 703.

The nanostructure semiconductor light emitting device 100 may be mounted on the mounting board 710 and electrically connected to the mounting board 710 through a wire W.

The mounting board 710 may include a body 711, an upper electrode 713, a lower electrode 714, and a through electrode 712 connecting the upper electrode 713 and the lower electrode 714.

The encapsulation body 703 may be formed to have a lens structure of which an upper surface has a convex dome shape.

As necessary, a wavelength conversion material such as a phosphor, a quantum dot, or the like, may be disposed on a surface of the encapsulation body 703 or the nanostructure semiconductor light emitting device 100.

The nanostructure semiconductor light emitting devices and the packages including the same according to the above-described example embodiments may be advantageously applied to various products.

The nanostructure semiconductor light emitting devices according to the above-described example embodiments may be used as or constitute light sources of various products. FIGS. 44 through 47 illustrate various products to which the nanostructure semiconductor light emitting devices are applicable.

Figure 44:
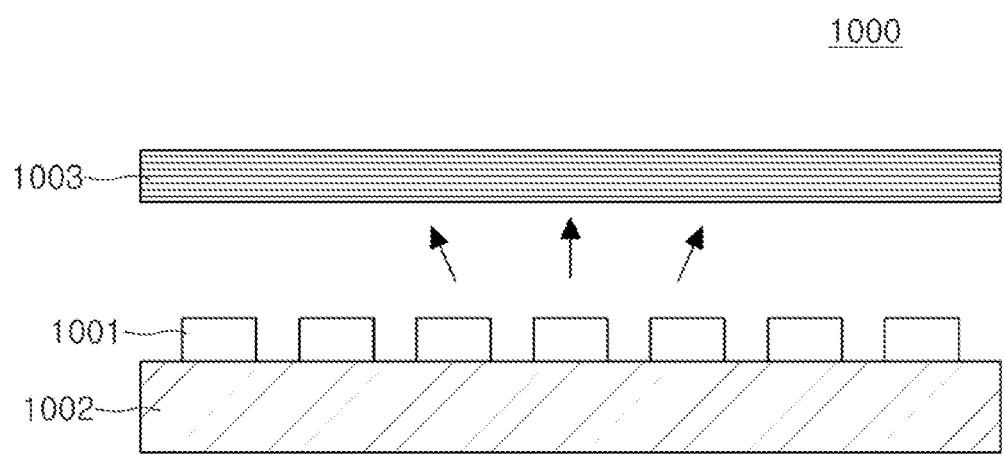
FIGS. 44 and 45 illustrate examples of a backlight unit to which a nanostructure semiconductor light emitting device according to an example embodiment is applied.
Figure 45:
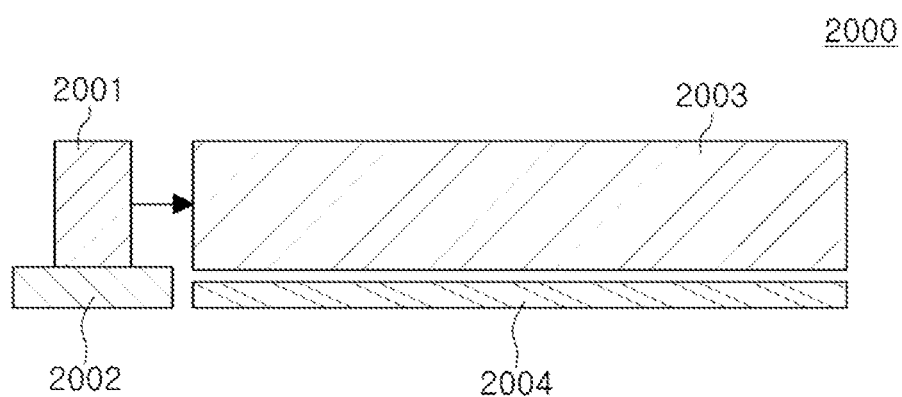

FIGS. 44 and 45 illustrate examples of a backlight unit to which a nanostructure semiconductor light emitting device according to an example embodiment is applied.

Referring to FIG. 21, a backlight unit 1000 includes at least one light source 1001 mounted on a substrate 1002 and at least one optical sheet 1003 disposed above the light source 1001. The aforementioned nanostructure semiconductor light emitting device or the aforementioned package having the nanostructure semiconductor light emitting device may be used as or constitute the light source 1001.

The light source 1001 in the backlight unit 1000 of FIG. 44 emits light toward a liquid crystal display (LCD) device disposed thereabove, whereas a light source 2001 mounted on a substrate 2002 in a backlight unit 2000 as another example illustrated in FIG. 45 emits light laterally, and the light is incident to a light guide plate 2003 such that the backlight unit 2000 may serve as a surface light source. The light travelling to the light guide plate 2003 may be emitted upwardly and a reflective layer 2004 may be formed below a lower surface of the light guide plate 2003 in order to improve light extraction efficiency.

Figure 46:
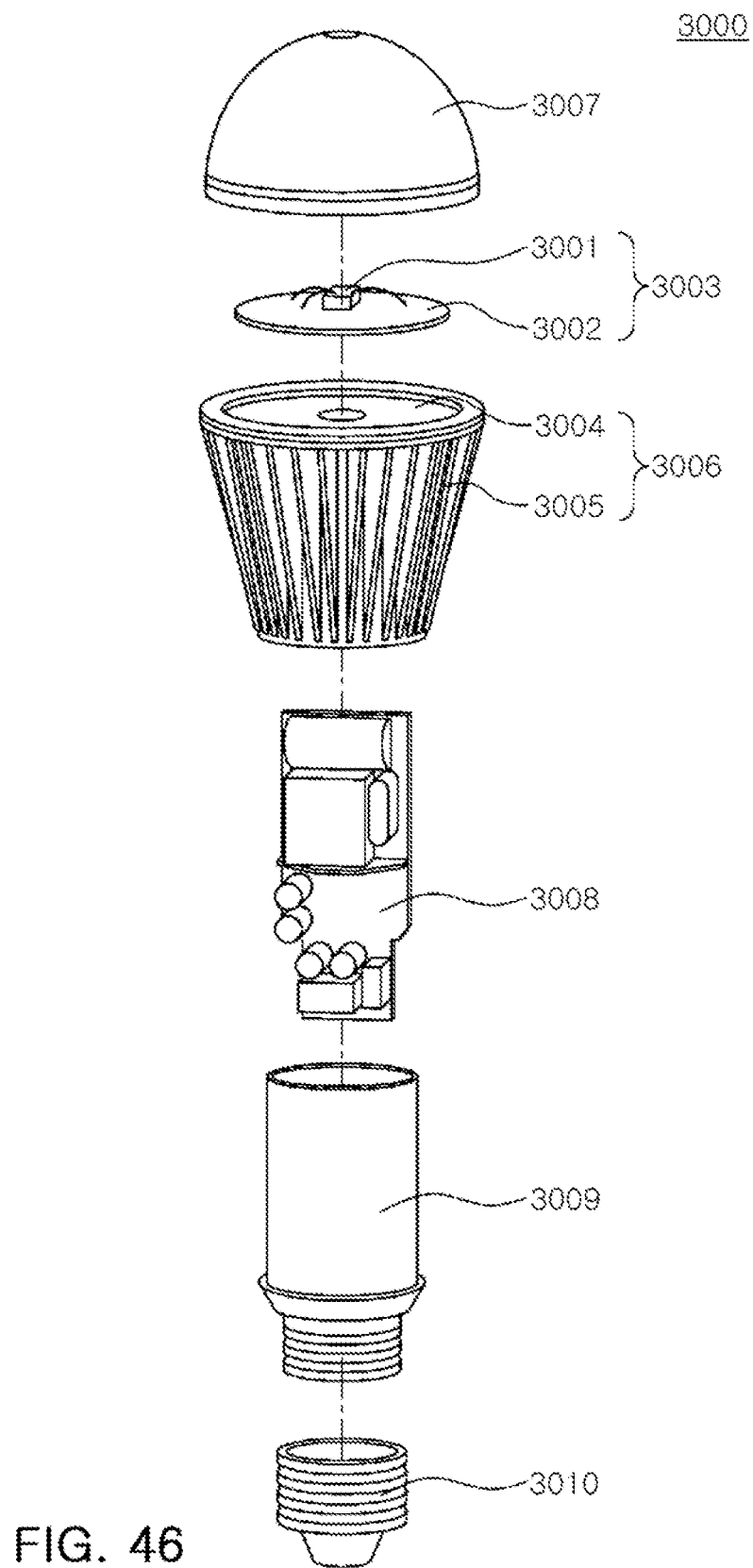
FIG. 46 illustrates an example of a lighting device to which a nanostructure semiconductor light emitting device according to an example embodiment is applied.

FIG. 46 is an exploded perspective view illustrating an example of a lighting device to which a nanostructure semiconductor light emitting device according to an example embodiment is applied.

A lighting device 3000 is illustrated, for example, as a bulb-type lamp in FIG. 46, and includes a light emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 that may be the aforementioned nanostructure semiconductor light emitting device or the aforementioned package having the same, and a circuit board 3002 having the light source 3001 mounted thereon. For example, first and second electrodes of the nanostructure semiconductor light emitting device may be electrically connected to an electrode pattern of the circuit board 3002. In the present example embodiment, a single light source 3001 is mounted on the circuit board 3002 by way of example; however, a plurality of light sources may be mounted thereon as necessary.

The external housing 3006 may include a heat radiator and may include a heat sink plate 3004 directly contacting the light emitting module 3003 to thereby improve heat dissipation and heat radiating fins 3005 surrounding a lateral surface of the lighting device 3000. The cover 3007 may be disposed above the light emitting module 3003 and have a convex lens shape. The driver 3008 may be inside the internal housing 3009 and be connected to the external connector 3010 such as a socket structure to receive power from an external power source.

In addition, the driver 3008 may convert the received power into power appropriate for driving the light source 3001 of the light emitting module 3003 and supply the converted power thereto. For example, the driver 3008 maybe configured as an AC-DC converter, a rectifying circuit part, or the like.

Figure 47:
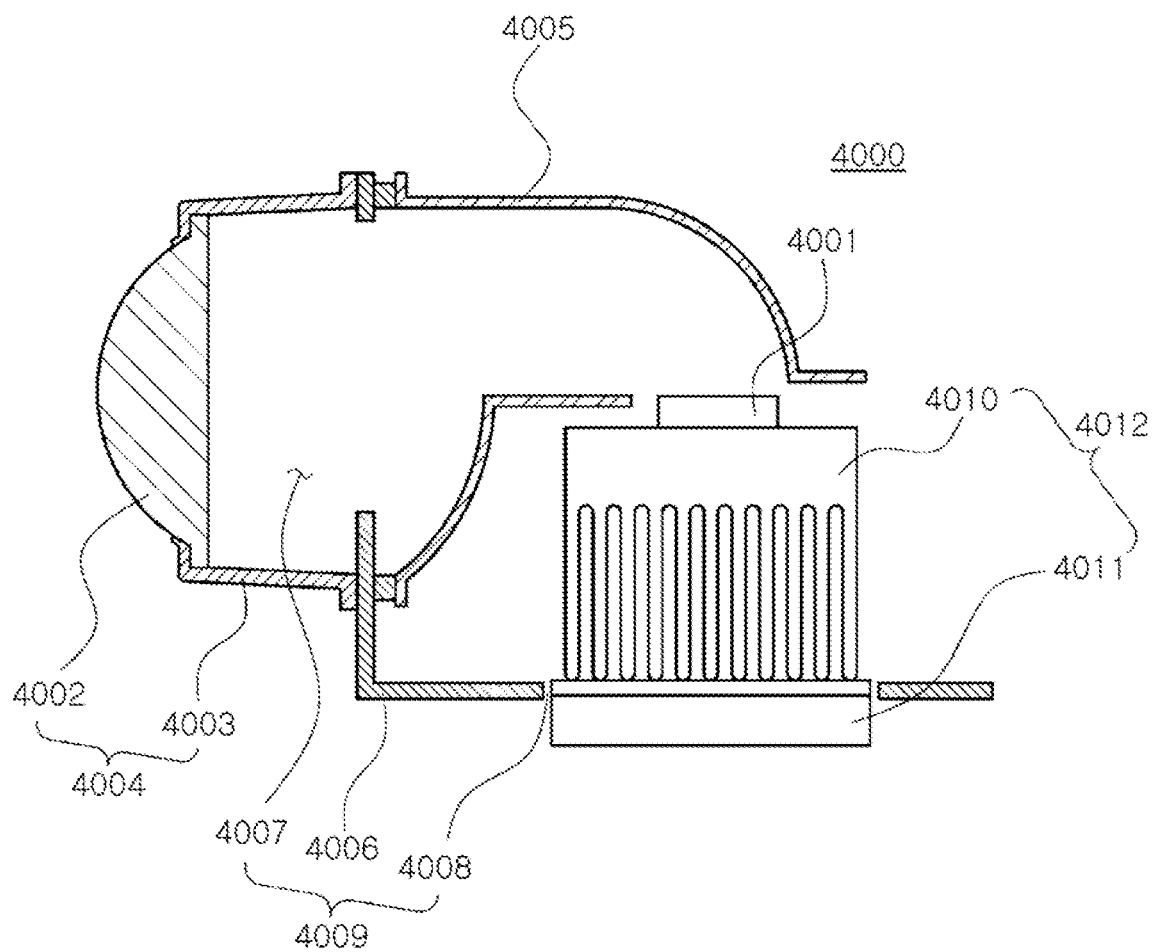
FIG. 47 illustrates an example of a headlamp to which a nanostructure semiconductor light emitting device according to an example embodiment is applied.

FIG. 47 illustrates an example of a headlamp to which a nanostructure semiconductor light emitting device according to an example embodiment is applied.

With reference to FIG. 47, a headlamp 4000 used in a vehicle or the like may include a light source 4001, a reflector 4005 and a lens cover 4004, and the lens cover 4004 may include a hollow guide part 4003 and a lens 4002. The light source 4001 may include the aforementioned nanostructure semiconductor light emitting device or the aforementioned package having the same.

The headlamp 4000 may further include a heat radiator 4012 externally dissipating heat generated in the light source 4001. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated in the light source 4001 maybe reflected by the reflector 4005, pass through the forwardly open hole 4007, and be emitted outwards.

As set forth above, in a nanostructure semiconductor light emitting device according to example embodiments, layers having different refractive indices may be disposed in different regions of the device, whereby light extraction efficiency may be improved in a desired direction. For example, a phenomenon in which light travels in a direction toward side surfaces of the device may be reduced or suppressed by filling a material having a relatively low refractive index or air in space between light emitting nanostructures, and light travelling in a desired direction, i.e., an upward direction may be increased by applying a material having a relatively high refractive index to an upper portion of the device, whereby light extraction efficiency may be enhanced.

In addition, by disposing the layers having different refractive indices in different regions of the device and arranging a plurality of lenses on a light extraction surface, light extraction efficiency may be further enhanced in a desired direction.

While example embodiments have been shown and described above, it will be apparent to those skilled in the art that modifications and variations could be made without departing from the scope of the present invention as defined by the appended claims.

What claimed is:

1. A nanostructure semiconductor light emitting device, comprising:
   a plurality of light emitting nanostructures, each of which including a nanocore having a first conductivity-type semiconductor material, and a shell including an active layer and a second conductivity-type semiconductor layer on a surface of the nanocore;
   a contact electrode on a surface of the second conductivity-type semiconductor layer and including a transparent conductive material;
   a first light transmissive portion between the plurality of light emitting nanostructures and including a material having a first refractive index; and
   a second light transmissive portion on an upper surface of the first light transmissive portion and covering the plurality of light emitting nanostructures and including a material having a second refractive index higher than the first refractive index.

2. The nanostructure semiconductor light emitting device of claim 1, wherein the upper surface of the first light transmissive portion is lower than a height of the plurality of light emitting nanostructures.

3. The nanostructure semiconductor light emitting device of claim 2, wherein a portion of the second light transmissive portion is between the plurality of light emitting nanostructures and has an interface substantially in contact with the first light transmissive portion.

4. The nanostructure semiconductor light emitting device of claim 2, wherein the contact electrode is on the upper surface of the first light transmissive portion and on surfaces of portions of the light emitting nanostructures that are higher than the upper surface of the first light transmissive portion.

5. The nanostructure semiconductor light emitting device of claim 1, wherein one or more of the plurality of light emitting nanostructures includes:
   a main portion having side surfaces, each side surface being in a first crystal plane; and
   a tip portion having surfaces, each surface being in a second crystal plane different from the first crystal plane.

6. The nanostructure semiconductor light emitting device of claim 5, wherein the upper surface of the first light transmissive portion is higher than substantially 50% of a height of the main portion.

7. The nanostructure semiconductor light emitting device of claim 5, wherein a portion of the second light transmissive portion is between the plurality of light emitting nanostructures and has an interface in substantial contact with the first light transmissive portion, and
   the interface is on the side surfaces of the light emitting nanostructures.

8. The nanostructure semiconductor light emitting device of claim 7, wherein the contact electrode is on the side surfaces of the light emitting nanostructures and exposes upper portions of the light emitting nanostructures.

9. The nanostructure semiconductor light emitting device of claim 8, wherein the contact electrode and the first light transmissive portion have a substantially same height.

10. A nanostructure semiconductor light emitting device, comprising:
    a plurality of light emitting nanostructures, each of which including a nanocore including a first conductivity-type semiconductor material, and a shell including an active layer and a second conductivity-type semiconductor layer on a surface of the nanocore;
    a contact electrode on a surface of the second conductivity-type semiconductor layer and including a transparent conductive material;
    a first light transmissive portion between the plurality of light emitting nanostructures and including a material having a first refractive index; and
    a second light transmissive portion on an upper surface of the first light transmissive portion and covering the plurality of light emitting nanostructures, including a plurality of lenses, and including a material having a second refractive index higher than the first refractive index.

11. The nanostructure semiconductor light emitting device of claim 10, wherein the second light transmissive portion further comprises a plate on the first light transmissive portion and covering the plurality of light emitting nanostructures, and
    the plurality of lenses are on the plate.

12. The nanostructure semiconductor light emitting device of claim 10, wherein the plurality of lenses are on the first light transmissive portion and covering at least one of the light emitting nanostructures.

13. The nanostructure semiconductor light emitting device of claim 10, wherein each of the plurality of lenses covers at least two of the light emitting nanostructures.

14. The nanostructure semiconductor light emitting device of claim 10, wherein each of the plurality of lenses covers a corresponding one of the plurality of light emitting nanostructures.

15. The nanostructure semiconductor light emitting device of claim 10, wherein each of the plurality of light emitting nanostructures comprises:
    a main portion having side surfaces, each side surface being in a first crystal plane; and
    a tip portion on the main portion and having surfaces, each surface being in a second crystal plane different from the first crystal plane, and
    an interface between the first light transmissive portion and the second light transmissive portion is equal to or lower than a height of the main portion.

16. The nanostructure semiconductor light emitting device of claim 15, wherein the contact electrode is on the side surfaces of the light emitting nanostructures and exposes one or more upper portions of the light emitting nanostructures.

17. The nanostructure semiconductor light emitting device of claim 16, wherein the second light transmissive portion has an interface in direct contact with the surfaces of the light emitting nanostructures.

18. A light emitting module, comprising:
    a circuit board having a first electrode structure and a second electrode structure; and
    the nanostructure semiconductor light emitting device of claim 1,
    wherein first and second electrodes of the nanostructure semiconductor light emitting device are connected to the first and second electrode structures of the circuit board, respectively.

19. A lighting device, comprising:
    a light emitting module including the nanostructure semiconductor light emitting device of claim 1;
    a driver configured to drive the light emitting module, and
    an external connector configured to supply voltage to the driver.

20. A nanostructure semiconductor light emitting device, comprising:
- a plurality of light emitting nanostructures; and
- a light transmissive protective layer including a first light transmissive portion having a first refractive index and a second light transmissive portion having a second refractive index different from the first refractive index;
- the first light transmissive portion being between the plurality of light emitting nanostructures; and
- the second light transmissive portion being on upper portions of the plurality of light emitting nanostructures.

* * * * *